(12) United States Patent
Kadota

(10) Patent No.: US 8,384,268 B2
(45) Date of Patent: Feb. 26, 2013

(54) SURFACE ACOUSTIC WAVE DEVICE HAVING AN INCREASED SURFACE ACOUSTIC WAVE VELOCITY AND AN INCREASED ELECTROMECHANICAL COUPLING COEFFICIENT

(75) Inventor: Michio Kadota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/442,899

(22) Filed: Apr. 10, 2012

(65) Prior Publication Data

US 2012/0194032 A1    Aug. 2, 2012

Related U.S. Application Data

(63) Continuation of application No. PCT/JP2010/067887, filed on Oct. 12, 2010.

(30) Foreign Application Priority Data

Oct. 13, 2009   (JP) ................................ 2009-236276

(51) Int. Cl.
*H01L 41/08* (2006.01)
*H01L 41/187* (2006.01)
*H03H 9/145* (2006.01)
(52) U.S. Cl. .................................................. 310/313 A
(58) Field of Classification Search ............... 310/313 A
See application file for complete search history.

(56) References Cited

U.S. PATENT DOCUMENTS

| | | | | |
|---|---|---|---|---|
| 5,838,090 A | * | 11/1998 | Nakahata et al. | 310/313 A |
| 6,025,636 A | * | 2/2000 | Nakahata et al. | 257/416 |
| 6,710,509 B1 | * | 3/2004 | Kadota | 310/313 A |
| 7,474,033 B2 | * | 1/2009 | Oshio | 310/313 A |
| 8,143,762 B2 | * | 3/2012 | Nakahashi | 310/313 B |
| 2004/0036381 A1 | | 2/2004 | Abbott et al. | |
| 2004/0145431 A1 | | 7/2004 | Nakao et al. | |
| 2004/0164645 A1 | * | 8/2004 | Oshio | 310/313 B |
| 2004/0222717 A1 | | 11/2004 | Matsuda et al. | |
| 2004/0226162 A1 | | 11/2004 | Miura et al. | |
| 2010/0187947 A1 | * | 7/2010 | Mimura | 310/313 A |

FOREIGN PATENT DOCUMENTS

| | | |
|---|---|---|
| EP | 0 789 453 A1 | 8/1997 |
| JP | 09-219632 A | 8/1997 |
| JP | 10-322158 A | 12/1998 |
| JP | 11-031942 A | 2/1999 |
| JP | 2004-254291 A | 9/2004 |
| JP | 2004-336503 A | 11/2004 |
| JP | 2004336503 A * | 11/2004 |
| JP | 2004-343359 A | 12/2004 |
| JP | 2005-184758 A | 7/2005 |
| JP | 2006-298694 A | 11/2006 |
| JP | 2006-319679 A | 11/2006 |
| JP | 2006319679 A * | 11/2006 |
| WO | 2004/006431 A1 | 1/2004 |

OTHER PUBLICATIONS

Official Communication issued in International Patent Application No. PCT/JP2010/067887, mailed on Dec. 7, 2010.

* cited by examiner

*Primary Examiner* — Jaydi San Martin
(74) *Attorney, Agent, or Firm* — Keating & Bennett, LLP

(57) ABSTRACT

An inexpensive surface acoustic wave device that increases an acoustic velocity of a surface acoustic wave and an electromechanical coupling coefficient includes a piezoelectric substrate in which a $LiNbO_3$ single-crystal plate having Euler angles (0°, 67° to 160°, −5° to +5°) or (90°, 51° to 133°, −5° to +5°) is provided on a high acoustic-velocity substrate in which an acoustic velocity of a transverse wave is in a range of about 5400 m/sec to about 8660 m/sec or lower, and an electrode provided on the piezoelectric substrate and made of metal.

16 Claims, 32 Drawing Sheets

LN(0°, 110°, 0°)/SiO₂/SAPPHIRE (0°, 122°23', 0°)

LN(0°, 110°, 0°)/SiO₂/SAPPHIRE (0°, 122°23', 0°)

LN(0°,110°,0°)/SiO₂/Si(90°,90°,45°)

LN(0°,110°,0°)/SiO₂/Si(90°,90°,45°)

LN(0°, 110°, 0°)/SiO₂/Si(90°, 90°, 45°)

LN(0°, 110°, 0°)/SiO₂/Si(135°, 90°, 90°)

SURFACE ACOUSTIC WAVE DEVICE HAVING AN INCREASED SURFACE ACOUSTIC WAVE VELOCITY AND AN INCREASED ELECTROMECHANICAL COUPLING COEFFICIENT

BACKGROUND OF THE INVENTION

1. Field of the Invention

The present invention relates to a surface acoustic wave device for use in, e.g., a resonator and a band filter, and more particularly, to a surface acoustic wave device in which a piezoelectric substrate includes a $LiNbO_3$ film.

2. Description of the Related Art

Recently, a surface acoustic wave device adapted for higher frequencies has been demanded with a trend toward communication equipment operating in a higher frequency range. Also, a wider frequency band has been demanded in a surface acoustic wave filter.

The acoustic velocity of the surface acoustic wave and the electromechanical coupling coefficient $k^2$ are required to be higher or larger in order to achieve a higher frequency and a wider frequency band during operation.

Japanese Unexamined Patent Application Publication No. 10-322158 discloses a surface acoustic wave device using a piezoelectric substrate in which a (100) $LiNbO_3$ thin film is formed on a (012) sapphire substrate. Japanese Unexamined Patent Application Publication No. 10-322158 states that the electromechanical coupling coefficient can be increased by forming the (100) $LiNbO_3$ thin film on the (012) sapphire substrate.

Japanese Unexamined Patent Application Publication No. 9-219632 discloses a surface acoustic wave device illustrated in FIG. 62. In this surface acoustic wave device 1001, a $LiNbO_3$ single-crystal layer 1003 is formed, instead of being a thin film, on a diamond substrate 1002. An IDT electrode 1004 is formed on the $LiNbO_3$ single-crystal layer 1003. In such a structure, given that the thickness of the $LiNbO_3$ single-crystal layer 1003 is $t_1$ (μm) and the wavelength of a surface acoustic wave in the n-th order mode is λn (μm), $kh_1 = 2\pi(t_1/\lambda n)$ and the Euler angles of the $LiNbO_3$ single-crystal layer 1003 are set to fall within respective specific ranges. Japanese Unexamined Patent Application Publication No. 9-219632 states that, when those conditions are satisfied, the propagation velocity of the surface acoustic wave can be increased and the electromechanical coupling coefficient $k^2$ can also be increased.

In the surface acoustic wave device disclosed in Japanese Unexamined Patent Application Publication No. 10-322158, the piezoelectric substrate including a (100) $LiNbO_3$ thin film stacked on the (012) sapphire substrate is used, but the range of Euler angles of the $LiNbO_3$ thin film at which the electromechanical coupling coefficient can be increased is limited to a narrow range.

On the other hand, the surface acoustic wave device disclosed in Japanese Unexamined Patent Application Publication No. 9-219632 has the structure in which the $LiNbO_3$ single-crystal layer 1003 is stacked, instead of being a thin film, on the diamond substrate 1002, so as to increase the acoustic velocity of the surface acoustic wave and the electromechanical coupling coefficient. However, the diamond substrate 1002 made of single-crystal diamond is expensive and cost reduction is demanded.

SUMMARY OF THE INVENTION

To overcome the problems described above, preferred embodiments of the present invention provide a surface acoustic wave device, which can increase the acoustic velocity of the surface acoustic wave and the electromechanical coupling coefficient by using $LiNbO_3$ having a wider range of Euler angles, and which is inexpensive.

A preferred embodiment of the present invention provides a surface acoustic wave device that preferably includes a piezoelectric substrate including a high acoustic-velocity substrate in which an acoustic velocity of a transverse wave is in a range of about 5400 m/sec to about 8660 m/sec, for example, and a $LiNbO_3$ single-crystal plate provided on the high acoustic-velocity substrate and preferably having Euler angles in a range of about (0°, 67° to 160°, −5° to +5°) or about (90°, 51° to 133°, −5° to +5°), for example, and an electrode provided on the piezoelectric substrate and made of metal.

Thus, the acoustic velocity of a surface acoustic wave can be increased and the electromechanical coupling coefficient $k^2$ can be increased by using the piezoelectric substrate in which the $LiNbO_3$ single-crystal plate having the above-described specific crystal orientation is stacked on the above-described specific high acoustic-velocity substrate.

A thickness of the $LiNbO_3$ single-crystal plate is preferably in a range of about 0.05λ to about 1.6λ, for example, and more preferably in a range of about 0.15λ to about 1.6λ, for example, when a wavelength of a surface acoustic wave is defined as λ. In this case, an increased electromechanical coupling coefficient $k^2$ can be obtained.

The high acoustic-velocity substrate is not limited to any particular one. For example, the high acoustic-velocity substrate may preferably be made of a material selected from a group consisting of silicon carbide, alumina, aluminum nitride, sapphire, silicon nitride, silicon, and magnesium oxide.

In a preferred embodiment of the present invention, the Euler angles of the $LiNbO_3$ single-crystal plate are preferably in a range of about (0°, 92° to 132°, −5° to +5°), for example. In this case, an even larger electromechanical coupling coefficient $k^2$ can be obtained.

In a preferred embodiment of the present invention, preferably, a primary order mode of a surface acoustic wave is used as the surface acoustic wave. In this case, the acoustic velocity can be increased and a large electromechanical coupling coefficient $k^2$ can be obtained.

According to another preferred embodiment of the present invention, the high acoustic-velocity substrate is preferably made of SiC, and the Euler angles of the $LiNbO_3$ single-crystal plate are preferably in a range of about (0°, 70° to 160°, −5° to +5°) or about (90°, 54° to 133°, −5° to +5°), for example. In this case, the acoustic velocity can be further increased and a larger electromechanical coupling coefficient $k^2$ can be obtained.

According to another preferred embodiment of the present invention, the high acoustic-velocity substrate is preferably made of alumina, and the Euler angles of the $LiNbO_3$ single-crystal plate are preferably in a range of about (0°, 70° to 160°, −5° to +5°) or about (90°, 54° to 117°, −5° to +5°), for example.

According to another preferred embodiment of the present invention, the high acoustic-velocity substrate is preferably made of aluminum nitride, and the Euler angles of the $LiNbO_3$ single-crystal plate are preferably in a range of about (0°, 70° to 153°, −5° to +5°) or about (90°, 52° to 122°, −5° to +5°), for example.

According to another preferred embodiment of the present invention, the high acoustic-velocity substrate is preferably made of sapphire, and the Euler angles of the $LiNbO_3$ single-crystal plate are preferably in a range of about (0°, 67° to 147°, −5° to +5°) or about (90°, 53° to 123°, −5° to +5°), for example.

According to another preferred embodiment of the present invention, the high acoustic-velocity substrate is preferably made of silicon nitride, and the Euler angles of the LiNbO$_3$ single-crystal plate are preferably in a range of about (0°, 70° to 153°, −5° to +5°) or about (90°, 54° to 120°, −5° to +5°), for example.

In the surface acoustic wave device according to a preferred embodiment of the present invention, the high acoustic-velocity substrate is preferably made of silicon. In this case, the silicon may be made of a silicon single-crystal or a silicon polycrystal, for example. When the silicon is made of a silicon single-crystal, the Euler angles of the LiNbO$_3$ single-crystal plate are preferably in a range of about (0°, 75° to 152°, −5° to +5°) or about (90°, 51° to 118°, −5° to +5°), for example. With this arrangement, the acoustic velocity can be further increased and a large electromechanical coupling coefficient $k^2$ can be obtained.

Further, when the silicon is made of a silicon polycrystal, the Euler angles of the LiNbO$_3$ single-crystal plate are preferably in a range of about (0°, 75° to 148°, −5° to +5°) or about (90°, 52° to 118°, −5° to +5°), for example. With this arrangement, the acoustic velocity can be further increased and an even larger electromechanical coupling coefficient $k^2$ can be obtained.

According to another preferred embodiment of the present invention, a surface acoustic wave device preferably includes a high acoustic-velocity substrate in which an acoustic velocity of a transverse wave is preferably in a range of about 5400 m/sec to about 8660 m/sec, for example, and the LiNbO$_3$ single-crystal plate provided on the high acoustic-velocity substrate, preferably having Euler angles in a range of about (0°, 50° to 120°, −5° to +5°), and preferably having a thickness in a range of about 0.4λ to about 1.6λ, for example, when a wavelength of a surface acoustic wave is defined as λ, the surface acoustic wave being provided as a secondary order mode of the surface acoustic wave. In this case, the acoustic velocity of the surface acoustic wave can also be effectively increased.

According to another preferred embodiment of the present invention, a surface acoustic wave device includes a high acoustic-velocity substrate in which an acoustic velocity of a transverse wave is preferably in a range of about 5400 m/sec to about 8660 m/sec, for example, and the LiNbO$_3$ single-crystal plate provided on the high acoustic-velocity substrate, having Euler angles preferably in a range of about (0°, 50° to 53°, −5° to +5°) or about (0°, 83° to 140°, −5° to +5°), and having a thickness preferably in a range of about 0.4λ to about 1.6λ, for example, when a wavelength of a surface acoustic wave is defined as λ, the surface acoustic wave being provided as a tertiary order mode of the surface acoustic wave. In this case, the acoustic velocity of the surface acoustic wave can also be further increased.

According to another preferred embodiment of the present invention, the surface acoustic wave device preferably further includes a silicon oxide film provided on the LiNbO$_3$ single-crystal plate, the silicon oxide film having a thickness preferably in a range of about 0.1λ to about 0.4λ, for example. In this case, an absolute value of the temperature coefficient of resonance frequency TCF can be reduced, and a temperature characteristic can be stabilized.

According to another preferred embodiment of the present invention, the surface acoustic wave device preferably further includes a silicon oxide film stacked between the high acoustic-velocity substrate and the LiNbO$_3$ single-crystal plate, the silicon oxide film preferably having a thickness in a range of about 0.05λ to about 1.4λ, for example. With this arrangement, an absolute value of the temperature coefficient of resonance frequency TCF can be reduced, and a temperature characteristic can be stabilized. In this case, preferably, when the high acoustic-velocity substrate is made of silicon, an absolute value of the temperature coefficient of resonance frequency TCF can be further reduced.

Moreover, when the high acoustic-velocity substrate is made of silicon in the structure in which the silicon oxide film is stacked between the high acoustic-velocity substrate and the LiNbO$_3$ single-crystal plate, the high acoustic-velocity substrate may preferably be made of a silicon single-crystal or a silicon polycrystal, for example.

With the surface acoustic wave device according to various preferred embodiments of the present invention, since the high acoustic-velocity substrate is used in which an acoustic velocity of a transverse wave is preferably in a range of about 5400 m/sec to about 8660 m/sec, the acoustic velocity of the surface acoustic wave can be increased. Further, the high acoustic-velocity substrate is inexpensive unlike the case of using diamond. In addition, since the LiNbO$_3$ single-crystal plate is provided on the high acoustic-velocity substrate and has the Euler angles preferably in the range of about (0°, 67° to 160°, −5° to +5°) or about (90°, 51° to 133°, −5° to +5°), for example, it is possible to not only increase the acoustic velocity of the surface acoustic wave by using the high acoustic-velocity substrate, but also to obtain a large electromechanical coupling coefficient $k^2$.

In the surface acoustic wave device using the secondary order mode of the surface acoustic wave, as described above, the acoustic velocity of the surface acoustic wave can also be increased. Moreover, since the LiNbO$_3$ single-crystal plate is provided on the high acoustic-velocity substrate and has the Euler angles in the above-described specific range, the electromechanical coupling coefficient $k^2$ can be increased.

Similarly, in the surface acoustic wave device using the tertiary order mode of the surface acoustic wave as described above, the acoustic velocity of the surface acoustic wave can be increased. In addition, since the LiNbO$_3$ single-crystal plate is provided on the high acoustic-velocity substrate and has the Euler angles in the above-described specific range, the electromechanical coupling coefficient $k^2$ can be increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings. It is to be noted that, in this description, the crystal orientation of each of a high acoustic-velocity substrate and a LiNbO$_3$ single-crystal plate is represented by the Euler angles (φ, θ, ψ). The crystal orientation can also be represented by the Miller indices, for example, instead of the Euler angles. The relationship between the Euler angles and the Miller indices is as follow.

Euler angles (90°, 90°, 0°)=Miller indices (100), and Euler angles (0°, 90°, 0°)=Miller indices (010) or (0-10).

Figure 1A:
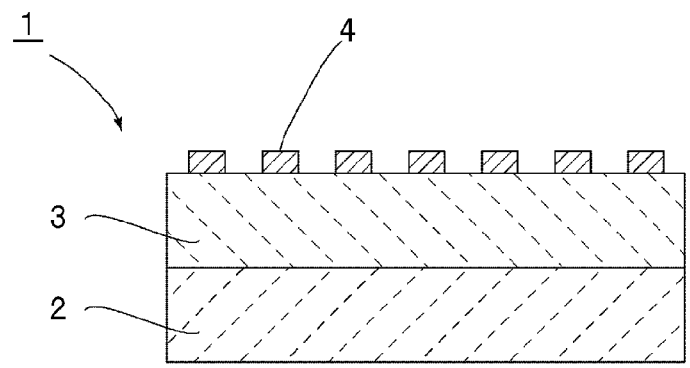
FIG. 1A is a sectional view illustrating a surface acoustic wave device according to a first preferred embodiment of the present invention.

FIG. 1A is a front sectional view of a surface acoustic wave device according to a first preferred embodiment of the present invention. A surface acoustic wave device 1 includes a high acoustic-velocity substrate 2. The high acoustic-velocity substrate 2 denotes a substrate in which the acoustic velocity of a surface acoustic wave is relatively high. In more detail, the high acoustic-velocity substrate 2 denotes a substrate in which the acoustic velocity of a transverse wave is preferably in a range of about 5400 m/sec to about 8660 m/sec, for example. The acoustic velocity of the surface acoustic wave can be increased by using the high acoustic-velocity substrate 2 in which the acoustic velocity of the transverse wave is about 5400 m/sec or higher. While the acoustic velocity of the surface acoustic wave can also be increased by using a high acoustic-velocity substrate in which the acoustic velocity of the transverse wave exceeds about 8660 m/sec, a substrate material having an acoustic velocity greater than 8660 about m/sec is very expensive, such as diamond, and the cost of the surface acoustic wave device is greatly increased.

Materials of the high acoustic-velocity substrate and the acoustic velocities of the transverse wave, which fall within the above-mentioned range of the acoustic velocity of the transverse wave, are listed in Table 1 below.

TABLE 1

| | Acoustic Velocity of Transverse Wave |
|---|---|
| Sapphire | 6070 m/sec |
| Silicon Carbide | 7360-8660 m/sec |
| Alumina | 5800-6400 m/sec |
| Aluminum Nitride | 5960-6560 m/sec |
| Silicon Nitride | 5650-6000 m/sec |
| Silicon | 5844 m/sec |
| Magnesium Oxide (MgO) | 6600 m/sec |
| Polycrystalline Silicon | 5400 m/sec |
| Quartz | 4670 m/sec |

In preferred embodiments of the present invention, the materials of the high acoustic-velocity substrate 2 are not limited to ones listed in Table 1. However, materials that are comparatively inexpensive and having a high acoustic velocity, which are selected from a group consisting of sapphire, silicon carbide, alumina, aluminum nitride, silicon, silicon nitride, and MgO listed in Table 1, for example, are preferably used as the materials of the high acoustic-velocity substrate 2.

While R-plane, m-plane, and a-plane sapphire single crystals are used as examples of the sapphire in preferred embodiments of the present invention, other types of sapphires having azimuth angles, which exhibit an acoustic velocity preferably in the range of about 5400 m/sec to about 8660 m/sec, for example, may also be used.

A LiNbO$_3$ single-crystal plate 3 is stacked on the high acoustic-velocity substrate 2. The LiNbO$_3$ single-crystal plate 3 differs from a LiNbO$_3$ single-crystal thin film. In more detail, the LiNbO$_3$ single-crystal plate 3 is obtained, for example, by cutting a bulk LiNbO$_3$ single crystal. The LiNbO$_3$ single-crystal plate 3 is preferably obtained and is bonded to the high acoustic-velocity substrate 2. Thus, the LiNbO$_3$ single-crystal plate 3 differs from the LiNbO$_3$ single-crystal thin film that is formed on the high acoustic-velocity substrate by crystal growth. In other words, the LiNbO$_3$ single-crystal plate 3 obtained from the bulk LiNbO$_3$ single crystal differs in crystallinity from the LiNbO$_3$ single-crystal thin film formed by crystal growth.

While the thickness of the LiNbO$_3$ single-crystal plate 3 is not limited to a particular value, the LiNbO$_3$ single-crystal plate 3 preferably has a thickness of about 0.05λ or more, for example, and the thickness is more preferably in the range of about 0.15λ to about 1.6λ, for example. If the thickness is less than about 0.05λ, it would be difficult to form a thin plate. If the thickness is more than about 1.6λ, the thickness of the surface acoustic wave device 1 would be increased and it would be difficult to obtain a high acoustic velocity because the characteristics would be closer to those specific to the LiNbO$_3$ single crystal alone.

Figure 61:
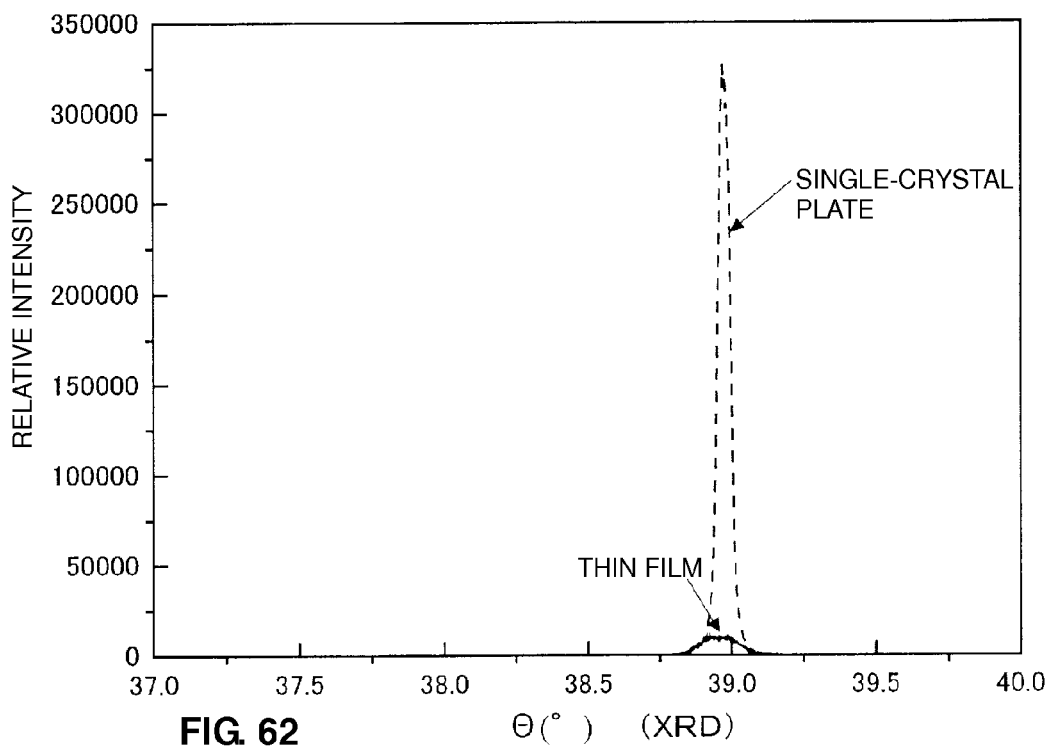
FIG. 61 depicts an X-ray diffraction (XRD) spectrum of a LiNbO$_3$ single-crystal thin film and the LiNbO$_3$ single-crystal plate.
Figure 62:
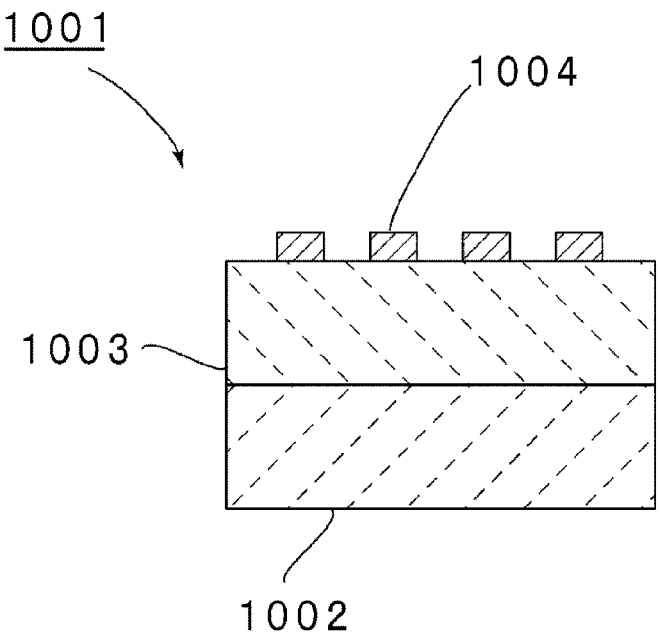
FIG. 62 is a sectional view illustrating a surface acoustic wave device of the related art.

Further, the LiNbO$_3$ single-crystal thin film has a difficulty in obtaining a good orientation property and, thus, has a difficulty in obtaining a good piezoelectric characteristic. FIG. 61 depicts the results of measuring a crystallinity characteristic (2θ/ω) scan) of the LiNbO$_3$ single-crystal thin film and the LiNbO$_3$ single-crystal plate, each having a thickness of about 0.5 μm, with an X-ray diffraction (XRD). As shown in FIG. 61, an XRD spectrum of the LiNbO$_3$ single crystal plate has intensity of about 321000 and a half-value width of about 0.05°. On the other hand, an XRD spectrum of the LiNbO$_3$ single-crystal thin film has intensity of about 10000, i.e., about 1/30 of 321000, and a half-value width of about 0.85°, i.e., about 17 times 0.05°. Thus, it is understood that the orientation property and the crystallinity of the single-crystal thin film is much poorer than those of the single-crystal plate. This implies that a piezoelectric characteristic (electromechanical coupling coefficient) and the mechanical Q of the single-crystal thin film are far inferior to those of the single-crystal plate. In other words, in the LiNbO$_3$ single-crystal thin film, a good piezoelectric characteristic is not obtained because it is difficult to obtain the orientation property and the crystallinity comparable to those of the single-crystal plate. In contrast, the LiNbO$_3$ single-crystal plate can easily provide a surface acoustic wave device that has a superior orientation property, crystallinity, and piezoelectric characteristic.

The crystal orientation of the LiNbO$_3$ single-crystal plate is preferably within the range of the Euler angles (0°, 67° to 160°, −5° to +5°) or (90°, 51° to 133°, −5° to +5°). With the crystal orientation maintained within that range, the electromechanical coupling coefficient k$^2$ can be increased as described later.

A method of stacking and joining the LiNbO$_3$ single-crystal plate 3 to the high acoustic-velocity substrate 2 is not particularly limited. For example, a method of affixing the LiNbO$_3$ single-crystal plate 3 onto the high acoustic-velocity substrate 2 and diffusion-bonding the former to the latter by heating, or a method of utilizing eutectic bonding with gold, for example, can be used as required.

An electrode 4 is formed on the LiNbO$_3$ single-crystal plate 3. The electrode 4 can preferably be formed using a suitable metal, such as Al, Pt, Cu, Au or Ni, or a suitable alloy, for example.

In the surface acoustic wave device 1 of this preferred embodiment, the acoustic velocity of the surface acoustic wave can be increased by using the high acoustic-velocity substrate 2, and an increased acoustic velocity and an increased electromechanical coupling coefficient k$^2$ can be achieved by using the LiNbO$_3$ single-crystal plate 3 having the above-described specific Euler angles.

As described above, the related-art surface acoustic wave device including the LiNbO$_3$ thin film has a problem in that the range of the Euler angles within which the electromechanical coupling coefficient k$^2$ can be increased is very narrow. In a structure in which an epitaxial LiNbO$_3$ thin film is stacked on (012) sapphire, for example, a LiNbO$_3$ film of (100), i.e., having the Euler angles (90°, 90°, 0°), must be used.

In contrast, according to preferred embodiments of the present invention, the LiNbO$_3$ single-crystal plate having the above-described wide range of the Euler angles can be used, and thus, an increase in both the acoustic velocity of the surface acoustic wave and the electromechanical coupling coefficient k$^2$ are easily achieved.

Figure 1B:
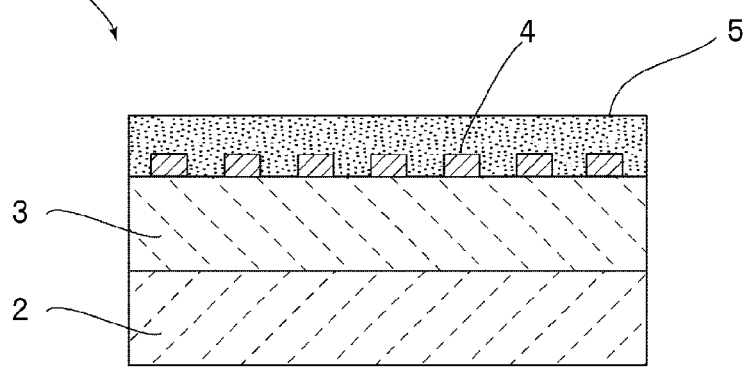
FIGS. 1B and 1C are front sectional views illustrating surface acoustic wave devices according to second and third preferred embodiments of the present invention, respectively.
Figure 1C:
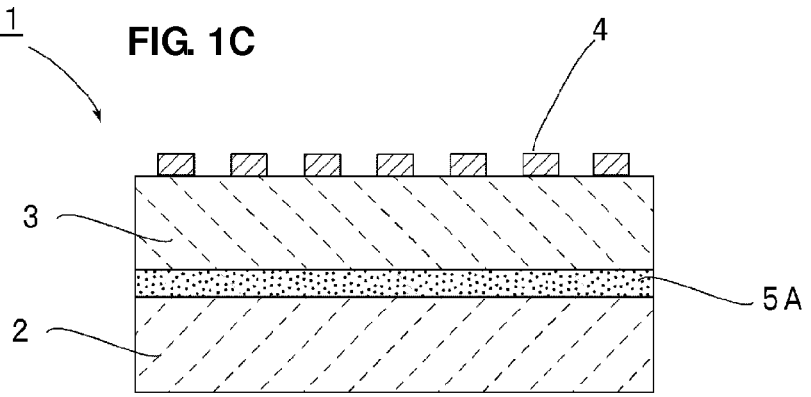

The present invention is not limited to the first preferred embodiment described above, and the present invention may also be practiced as surface acoustic wave devices 11 and 21 according to second and third preferred embodiments illustrated in FIGS. 1B and 1C, respectively, for example. In the surface acoustic wave device 11 illustrated in FIG. 1B, a SiO$_2$ film 5 is preferably provided on the LiNbO$_3$ single-crystal plate 3 so as to cover the electrode 4. Further, in the surface acoustic wave device 21 illustrated in FIG. 1C, a SiO$_2$ film 5A is provided between the high acoustic-velocity substrate 2 and the LiNbO$_3$ single-crystal plate 3. By including the SiO$_2$ film 5 or 5A in the surface acoustic wave device 11 or 21, it is possible to reduce an absolute value of the temperature coefficient of resonance frequency TCF, and to increase stability in characteristics depending on temperature change.

An increase in the acoustic velocity of the surface acoustic wave and the electromechanical coupling coefficient k$^2$ in the structure in which the LiNbO$_3$ single-crystal plate 3 having the Euler angles in the above-described specific range is stacked on the high acoustic-velocity substrate will be described below in connection with concrete experimental examples.

The surface acoustic wave used in various preferred embodiments of the present invention preferably is a leaky surface acoustic wave rather than a 0-th order wave, i.e., a Rayleigh wave. The leaky surface acoustic wave is not limited to a surface acoustic wave in the primary order mode, and it may be a surface acoustic wave in the secondary or tertiary order mode. The acoustic velocity can be further increased by using a surface acoustic wave in the higher mode.

It is to be noted that, in the following description, LiNbO$_3$ is abbreviated to LN in some cases.

Figure 2:
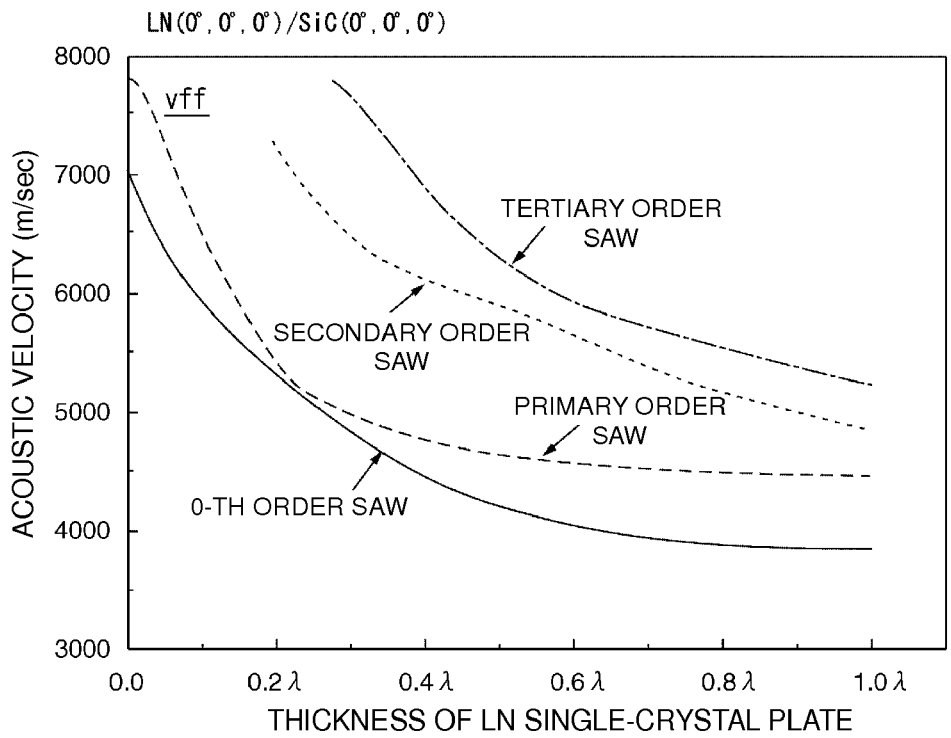
FIG. 2 is a graph depicting, in a structure in which a LiNbO$_3$ single-crystal plate having the Euler angles (0°, 0°, 0°) is stacked on a SiC substrate having the Euler angles (0°, 0°, 0°), the relationship between the thickness of the LiNbO$_3$ single-crystal plate and the acoustic velocity of a surface acoustic wave.
Figure 3:
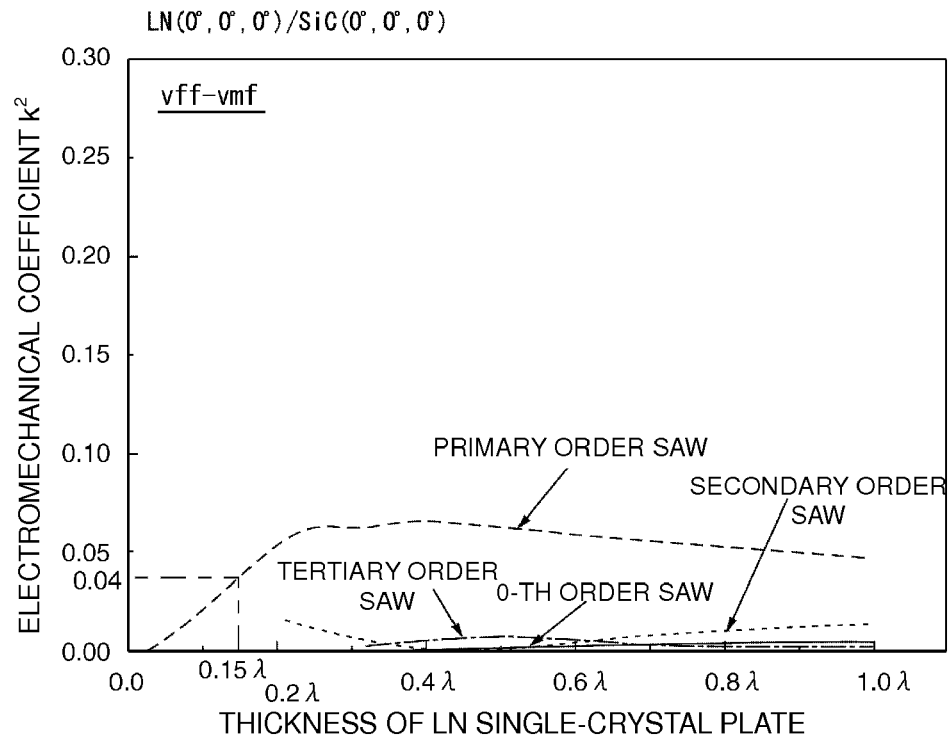
FIG. 3 is a graph depicting, in the structure in which the LiNbO$_3$ single-crystal plate having the Euler angles (0°, 0°, 0° is stacked on the SiC substrate having the Euler angles (0°, 0°, 0°), the relationship between the thickness of the LiNbO₃ single-crystal plate and the electromechanical coupling coefficient $k^2$.

Examples of Structure Using High Acoustic-Velocity Substrate Made of Silicon Carbide SiC FIG. 2 is a graph depicting, in a structure in which an LN single-crystal plate having the Euler angles (0°, 0°, 0°) is stacked on a SiC substrate having the Euler angles (0°, 0°, 0°), the relationship between the thickness of the LN single-crystal plate and the acoustic velocity of a surface acoustic wave, and FIG. 3 depicts the relationship between the thickness of the LN single-crystal plate and the electromechanical coupling coefficient k$^2$.

In an ordinary surface acoustic wave device, the acoustic velocity of a surface acoustic wave is about 4000 m/sec. As shown in FIG. 2, in any of the surface acoustic wave in the 0-th order, the surface acoustic wave in the primary order mode, the surface acoustic wave in the secondary order mode, and the surface acoustic wave in the tertiary order mode, the acoustic velocity decreases as the thickness of the LiNbO$_3$ single-crystal plate 3 increases in the range of about 0λ to about 1.0λ.

However, it is understood that, when the surface acoustic waves in the primary order mode, in the secondary order mode, and in the tertiary order mode are used, the acoustic velocity is equal to or greater than about 4500 m/sec at thicknesses of the LN single-crystal plate 3 over the entire range of about 0λ to about 1.0λ. For example, the acoustic velocity of the surface acoustic wave in the primary order mode is in the range of about 4500 m/sec to about 4750 m/sec when the thickness of the LN single-crystal plate 3 is in the range of about 0λ to about 1.0λ. Thus, the acoustic velocity of the surface acoustic wave can be sufficiently increased.

Also, it is understood that, when the surface acoustic wave in the secondary order mode or the surface acoustic wave in the tertiary order mode is used, the acoustic velocity of the surface acoustic wave can be further increased as compared to the case of using the surface acoustic wave in the primary order mode.

On the other hand, as shown in FIG. 3, when the surface acoustic wave in the primary order mode is used, the electromechanical coupling coefficient $k^2$ is relatively high, i.e., about 0.04 or more, when the thickness of the LN single-crystal plate is in the range of about 0.15λ to about 1.0λ, but it is smaller than those of LN single-crystal plates (described later) having other Euler angles.

Similarly, when the secondary order mode or the tertiary order mode is used, the electromechanical coupling coefficient is relatively small, i.e., about 0.02 or less.

Thus, it is understood from the results of FIGS. 2 and 3 that, when the thickness of the LN single-crystal plate having the Euler angles (0°, 0°, 0°) is set in the range of about 0.15λ to about 1.0λ, the acoustic velocity of the surface acoustic wave in the primary order mode can be increased, but the electromechanical coupling coefficient $k^2$ cannot be significantly increased.

Figure 4:
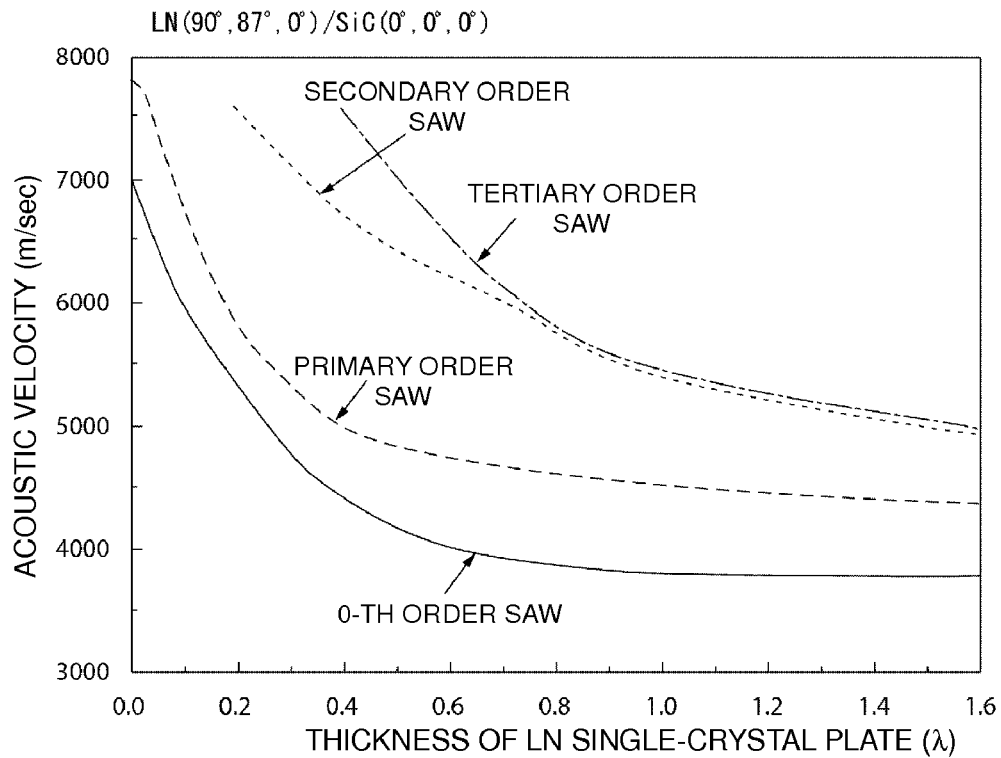
FIG. 4 is a graph depicting, in a structure in which a LiNbO₃ single-crystal plate having the Euler angles (90°, 87°, 0°) is stacked on the SiC substrate having the Euler angles (0°, 0°, 0°, the relationship between the thickness of the LiNbO₃ single-crystal plate and the acoustic velocity of a surface acoustic wave.
Figure 5:
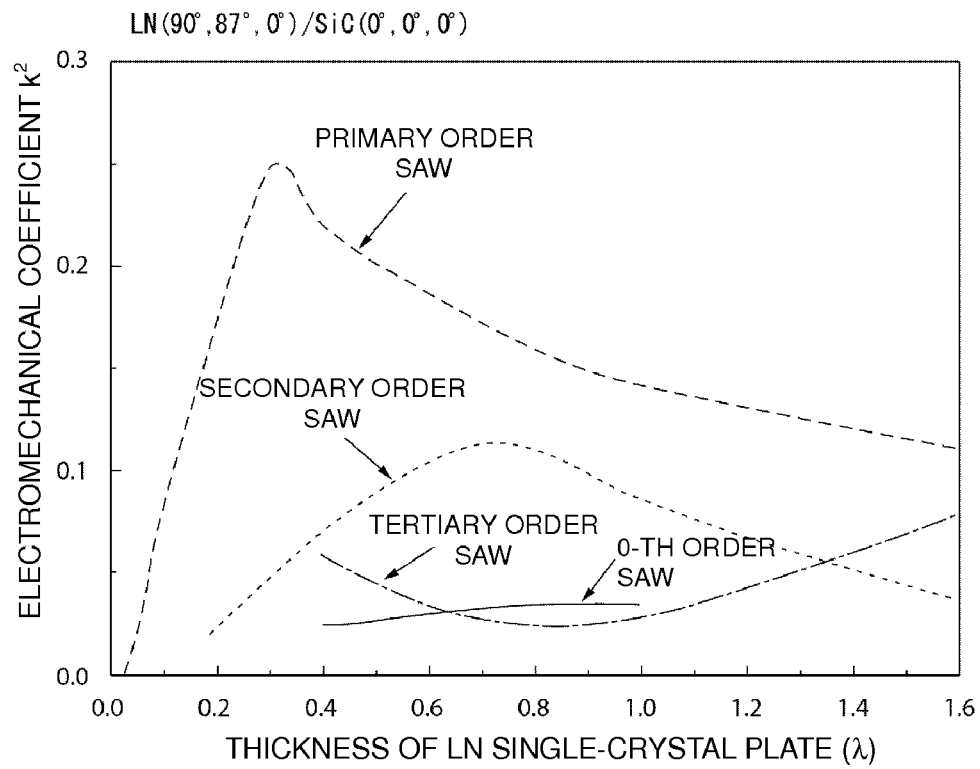
FIG. 5 is a graph depicting, in the structure in which the LiNbO₃ single-crystal plate having the Euler angles (90°, 87°, 0° is stacked on the SiC substrate having the Euler angles (0°, 0°, 0°), the relationship between the thickness of the LiNbO₃ single-crystal plate and the electromechanical coupling coefficient $k^2$.

FIGS. 4 and 5 are graphs depicting, when a structure of LN (90°, 87°, 0°)/SiC (0°, 0°, 0°) is used, the relationship between the thickness of the LN single-crystal plate and the acoustic velocity of a surface acoustic wave and the electromechanical coupling coefficient, respectively.

As shown in FIG. 4, when the crystal orientation of LN is (90°, 87°, 0°), the acoustic velocity of the surface acoustic wave in the primary order mode is equal to or greater than about 4400 m/sec when the thickness of the LN single-crystal plate is in the range of about 0.05λ to about 1.6λ. The acoustic velocity of the surface acoustic wave can be further increased by using the secondary order mode or the tertiary order mode.

On the other hand, as shown in FIG. 5, when using the surface acoustic wave in the primary order mode, the electromechanical coupling coefficient $k^2$ can be effectively increased to about 0.115 or more when the thickness of the LN single-crystal plate is preferably set in the range of about 0.15λ to about 1.6λ, for example. Moreover, by setting the LN thickness in the range of about 0.07λ to about 0.12λ, the electromechanical coupling coefficient $k^2$ can be increased to about 0.05 or more and a high acoustic velocity of about 6500 m/sec or greater can be obtained, for example. When the surface acoustic wave in the secondary order mode is used, the electromechanical coupling coefficient $k^2$ can be increased to about 0.04 or more by setting the thickness in the range of about 0.27λ to about 1.6λ, for example.

Accordingly, when the LN single-crystal plate 3 having the Euler angles (90°, 87°, 0°) is used, the thickness of the LN single-crystal plate 3 is preferably set in the range of about 0.15λ to about 1.6λ, for example, when using the primary order mode. On those conditions, it is possible to not only increase the acoustic velocity of the surface acoustic wave, but also to effectively increase the electromechanical coupling coefficient $k^2$. In order to increase the acoustic velocity to about 4560 m/sec or higher and the electromechanical coupling coefficient $k^2$ to about 0.15 or more, the thickness of the LN single-crystal plate is more preferably set in the range of about 0.18λ to about 0.9λ, for example.

Further, when the surface acoustic wave in the secondary order mode is used, as described above, the thickness of the LN single-crystal plate is preferably set in the range of about 0.27λ to about 1.6λ, for example. On that condition, the acoustic velocity of the surface acoustic wave can be increased to about 5050 m/sec or greater, and the electromechanical coupling coefficient $k^2$ can be increased to about 0.04 or more. By setting the thickness in the range of about 0.38λ to about 1.23λ, more preferably, a high acoustic velocity of about 5250 m/sec or higher and a large electromechanical coupling coefficient $k^2$ of 0.07 or more can be obtained.

When the surface acoustic wave in the tertiary order mode is used, the acoustic velocity of about 5100 m/sec or higher and the electromechanical coupling coefficient $k^2$ of about 0.025 or more can be obtained when the thickness of the LN single-crystal plate is between about 0.4λ and about 1.6λ, for example. Further, the electromechanical coupling coefficient $k^2$ of about 0.04 or more can be obtained when the thickness of the LN single-crystal plate is between about 0.4λ and about 0.53λ and between about 1.18λ and about 1.6λ, for example.

Figure 6:
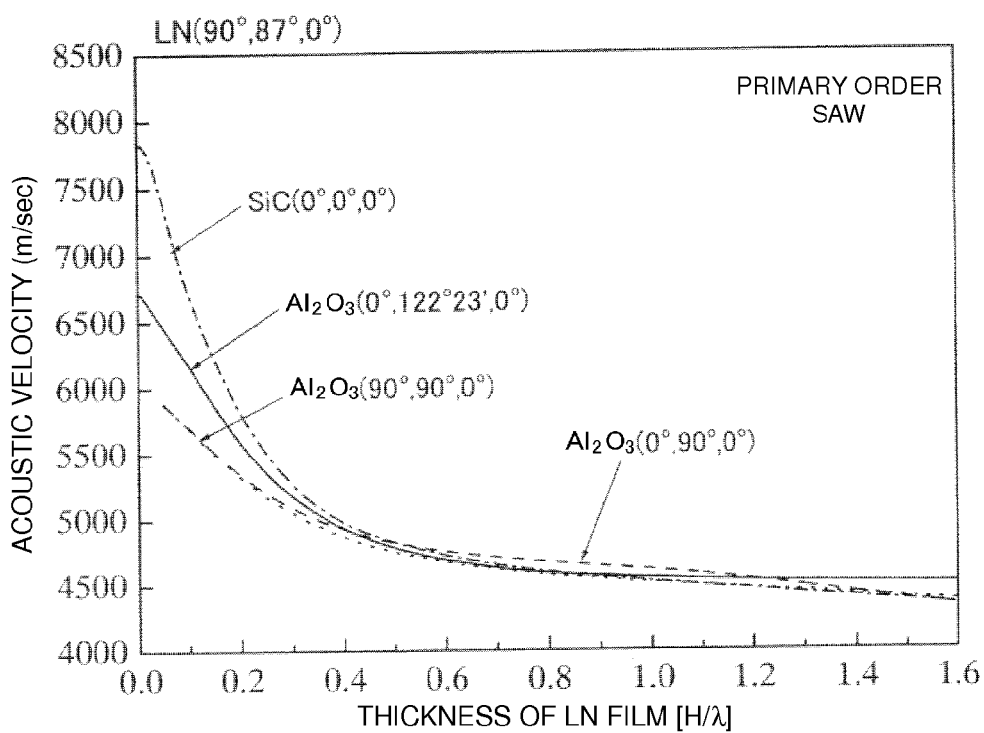
FIG. 6 is a graph depicting, in the cases in which the LiNbO₃ single-crystal plate having the Euler angles (90°, 87°, 0°) is stacked on each of substrates made of Al₂O₃, i.e., R-plane sapphire, having the Euler angles (0°, 122°23', 0°), made of Al₂O₃, i.e., sapphire, having the Euler angles (0°, 90°, 0°), and made of Al₂O₃, i.e., sapphire, having the Euler angles (90°, 90°, 0°), the relationship between the thickness of the LiNbO₃ single-crystal plate and the acoustic velocity of a surface acoustic wave.
Figure 7:
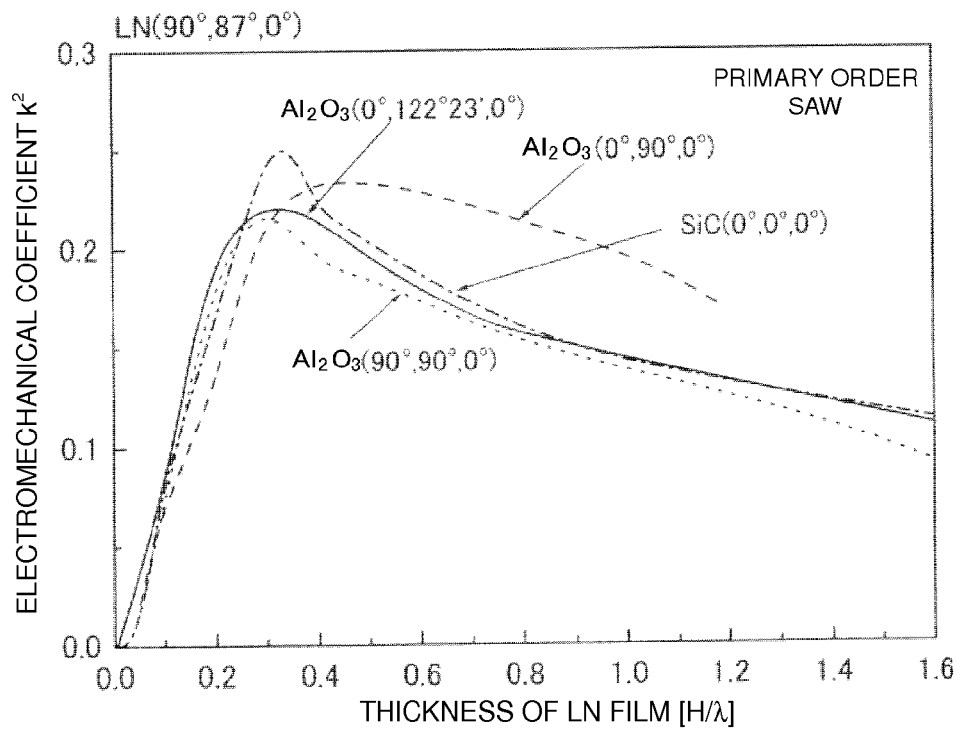
FIG. 7 is a graph depicting, in the cases in which the LiNbO₃ single-crystal plate having the Euler angles (90°, 87°, 0°) is stacked on each of the substrates made of Al₂O₃, i.e., R-plane sapphire, having the Euler angles (0°, 122°23', 0°), made of Al₂O₃, i.e., sapphire, having the Euler angles (0°, 90°, 0°), and made of Al₂O₃, i.e., sapphire, having the Euler angles (90°, 90°, 0°), the relationship between the thickness of the LiNbO₃ single-crystal plate and the electromechanical coupling coefficient $k^2$ for a surface acoustic wave.

FIGS. 6 and 7 are graphs depicting, when structures of LN (90°, 87°, 0°)/R-plane sapphire (0°, 122°23', 0°), sapphire (0°, 90°, 0°), and sapphire (90°, 90°, 0°) are used, the relationship between the thickness of the LN single-crystal plate and the acoustic velocity of a surface acoustic wave and the electromechanical coupling coefficient $k^2$, respectively.

As shown in FIG. 6, when the crystal orientation of LN is (90°, 87°, 0°), the acoustic velocity of the surface acoustic wave in the primary order mode is equal to or higher than about 4450 m/sec when the thickness of the LN single-crystal plate is in the range of about 0λ to about 1.6λ, for example, and thus, the acoustic velocity of the surface acoustic wave can be increased in that range.

On the other hand, as shown in FIG. 7, when the surface acoustic wave in the primary order mode is used, the electromechanical coupling coefficient $k^2$ can be increased to about 0.1 or more by setting the thickness of the LN single-crystal plate in the range of about 0.15λ to about 1.6λ, for example.

Accordingly, when the LN single-crystal plate 3 having the Euler angles (90°, 87°, 0°) is used, the thickness of the LN single-crystal plate 3 is preferably set in the range of about 0.15λ to about 1.6λ, for example, when using the primary order mode. On those conditions, it is possible to not only increase the acoustic velocity of the surface acoustic wave, but also to effectively increase the electromechanical coupling coefficient $k^2$. In order to increase the acoustic velocity to about 4560 m/sec or higher and the electromechanical coupling coefficient $k^2$ to about 0.15 or more, the thickness of the LN single-crystal plate is more preferably set in the range of about 0.2λ to about 0.8λ, for example.

Figure 8:
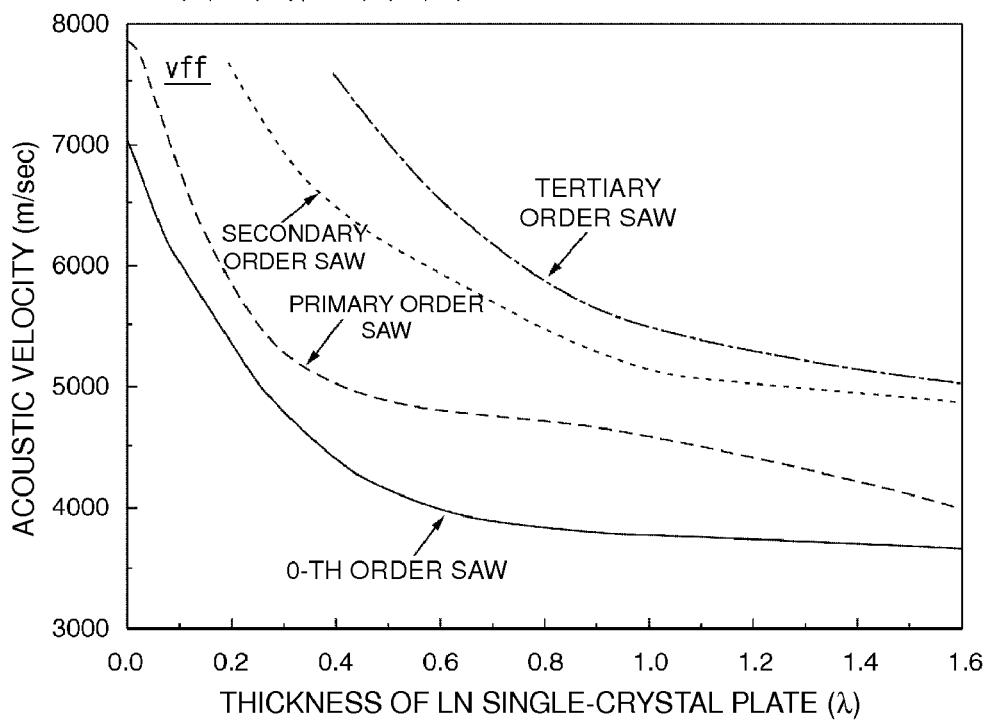
FIG. 8 is a graph depicting, in a structure in which a LiNbO₃ single-crystal plate having the Euler angles (0°, 90°, 0°) is stacked on the SiC substrate having the Euler angles (0°, 0°, 0°, the relationship between the thickness of the LiNbO₃ single-crystal plate and the acoustic velocity of a surface acoustic wave.
Figure 9:
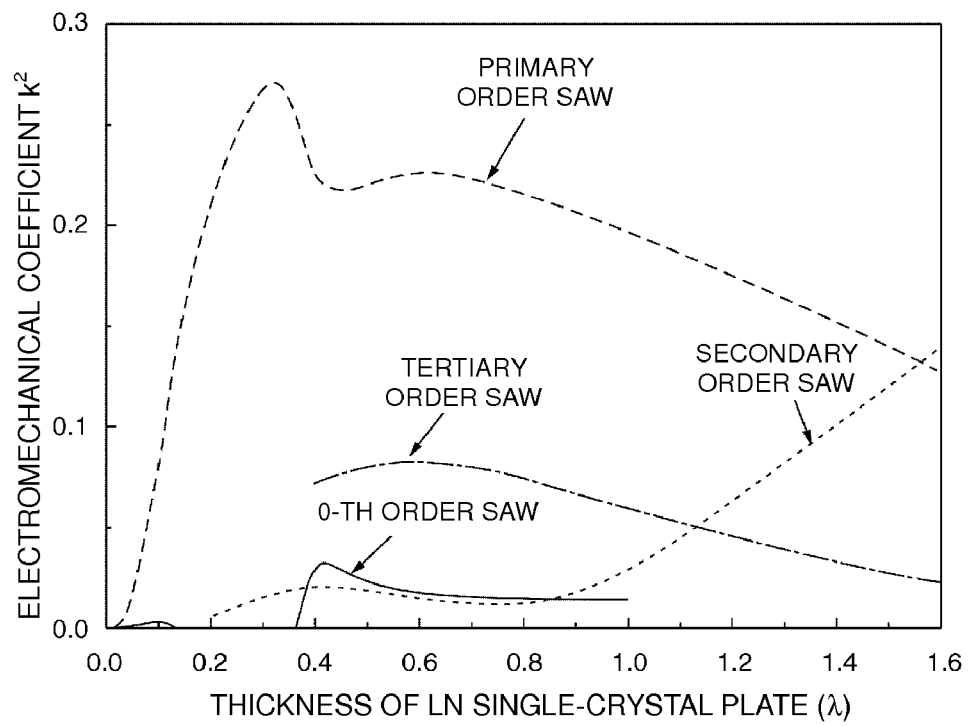
FIG. 9 is a graph depicting, in the structure in which the LiNbO₃ single-crystal plate having the Euler angles (0°, 90°, 0° is stacked on the SiC substrate having the Euler angles (0°, 0°, 0°), the relationship between the thickness of the LiNbO₃ single-crystal plate and the electromechanical coupling coefficient $k^2$.

FIGS. 8 and 9 are graphs depicting, when a structure of LN (0°, 90°, 0°)/SiC (0°, 0°, 0°) is used, the relationship between the thickness of the LN single-crystal plate and the acoustic velocity of a surface acoustic wave and the electromechanical coupling coefficient, respectively.

As shown in FIG. 8, when the crystal orientation of LN is (0°, 90°, 0°), the acoustic velocity of the surface acoustic wave in the primary order mode is equal to or higher than about 4350 m/sec when the thickness of the LN single-crystal plate is in the range of about 0λ to about 1.4λ, for example. The acoustic velocity of the surface acoustic wave can be further increased by using the secondary order mode or the tertiary order mode.

On the other hand, as shown in FIG. 9, when the surface acoustic wave in the primary order mode is used, the electromechanical coupling coefficient $k^2$ can be increased to about 0.15 or more by setting the thickness of the LN single-crystal plate in the range of about 0.15λ to about 1.4λ, for example. Moreover, when the surface acoustic wave in the secondary order mode is used, the electromechanical coupling coefficient $k^2$ can be increased to about 0.02 or more by setting the thickness in the range of about 0.3λ to about 1.6λ, for example.

Accordingly, when the LN single-crystal plate 3 having the Euler angles (0°, 90°, 0°) is used, the thickness of the LN single-crystal plate 3 is preferably set in the range of about 0.15λ to about 1.6λ, for example, when using the primary order mode. On those conditions, it is possible to not only increase the acoustic velocity of the surface acoustic wave, but also to effectively increase the electromechanical coupling coefficient $k^2$. When a larger electromechanical coupling coefficient $k^2$ is demanded, the electromechanical coupling coefficient $k^2$ of about 0.2 or more can be obtained by more preferably setting the thickness of the LN single-crystal plate in the range of about 0.2λ to about 1.0λ, for example.

Further, when the surface acoustic wave in the secondary order mode is used, as described above, the acoustic velocity of the surface acoustic wave and the electromechanical coupling coefficient $k^2$ can both be increased by setting the thickness of the LN single-crystal plate in the range of about 0.2λ to about 1.6λ, for example. Moreover, the electromechanical coupling coefficient $k^2$ of about 0.025 or more can be obtained by setting the thickness of the LN single-crystal plate in the range of about 0.37λ to about 0.43λ or about 0.93λ to about 1.6λ, for example.

When using the tertiary order mode, the acoustic velocity of about 5100 m/sec or higher and the electromechanical coupling coefficient $k^2$ of about 0.025 or more can be obtained by setting the thickness of the LN single-crystal plate in the range of about 0.4λ to about 1.6λ, for example. Further, the acoustic velocity of about 5400 m/sec or higher and the electromechanical coupling coefficient $k^2$ of about 0.05 or more can be obtained by setting the thickness of the LN single-crystal is in the range of about 0.4λ to about 1.15λ, for example.

Figure 10:
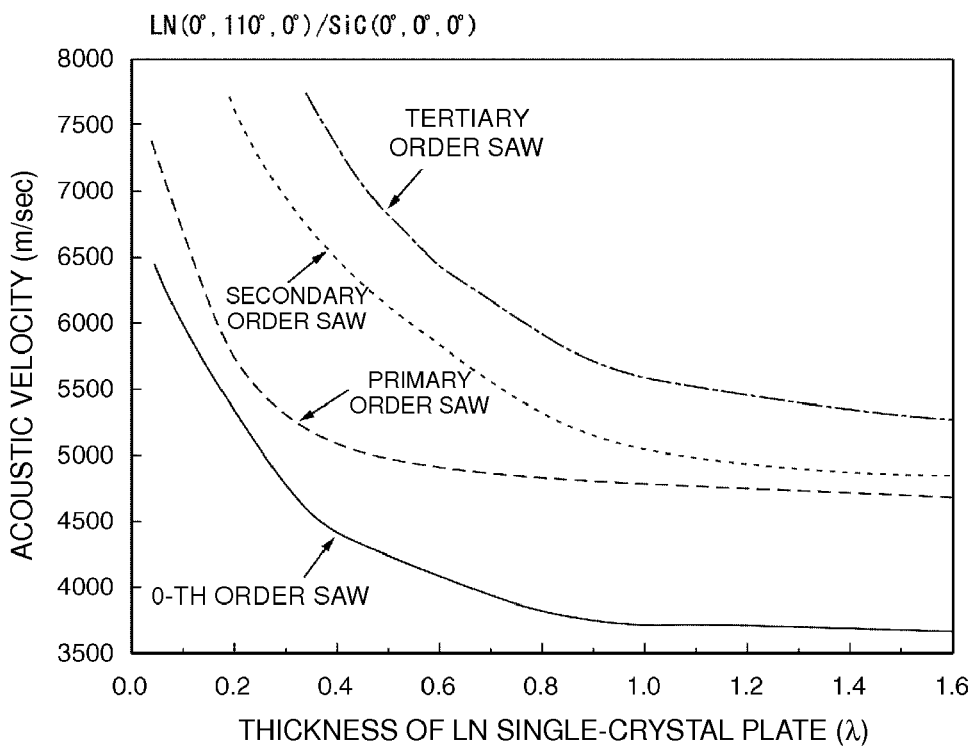
FIG. 10 is a graph depicting, in a structure in which a LiNbO₃ single-crystal plate having the Euler angles (0°, 110°, 0° is stacked on the SiC substrate having the Euler angles (0°, 0°, 0°), the relationship between the thickness of the LiNbO₃ single-crystal plate and the acoustic velocity of a surface acoustic wave.
Figure 11:
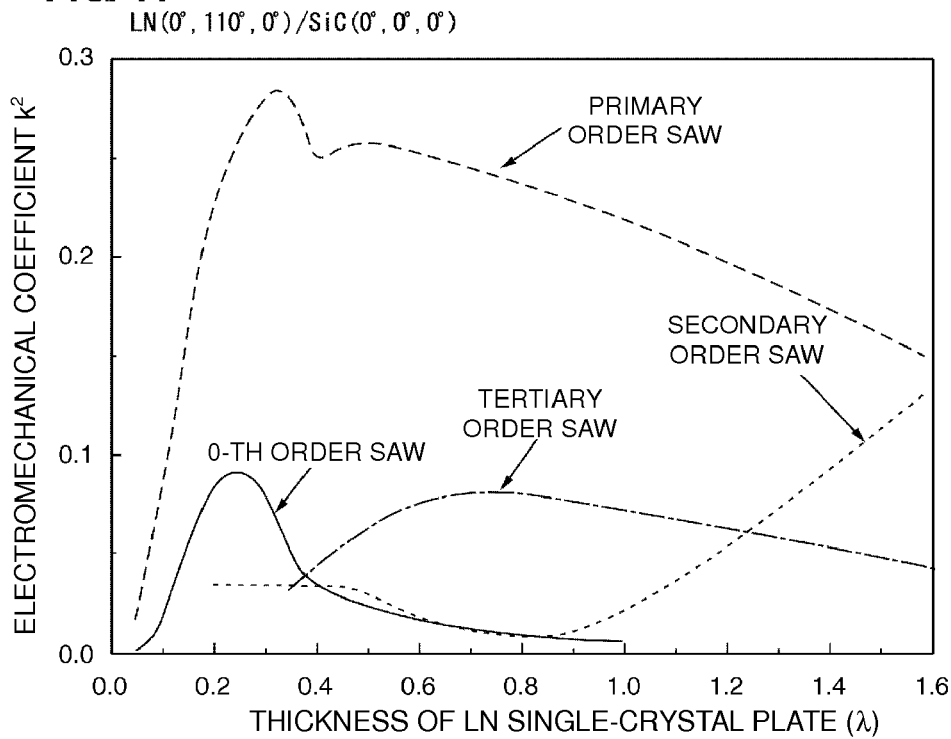
FIG. 11 is a graph depicting, in the structure in which the LiNbO₃ single-crystal plate having the Euler angles (0°, 110°, 0°) is stacked on the SiC substrate having the Euler angles (0°, 0°, 0°), the relationship between the thickness of the LiNbO₃ single-crystal plate and the electromechanical coupling coefficient $k^2$.

FIGS. 10 and 11 are graphs depicting, when a structure of LN (0°, 110°, 0°)/SiC (0°, 0°, 0°) is used, the relationship between the thickness of the LN single-crystal plate and the acoustic velocity of a surface acoustic wave and the electromechanical coupling coefficient, respectively.

As shown in FIG. 10, when the crystal orientation of LN is (0°, 110°, 0°), the acoustic velocity of the surface acoustic wave in the primary order mode is equal to or higher than about 4750 m/sec when the thickness of the LN single-crystal plate is in the range of about 0λ to about 1.6λ, for example. The acoustic velocity of the surface acoustic wave can be further increased by using the secondary order mode or the tertiary order mode.

On the other hand, as shown in FIG. 11, when the surface acoustic wave in the primary order mode is used, the electromechanical coupling coefficient $k^2$ can be increased to about 0.15 or more by setting the thickness of the LN single-crystal plate in the range of about 0.14λ to about 1.6λ, for example. When the surface acoustic wave in the secondary order mode is used, the electromechanical coupling coefficient $k^2$ can be increased to about 0.02 or more by setting the thickness in the range of about 0.2λ to about 0.62λ or about 0.97λ to about 1.6λ, for example. Moreover, the electromechanical coupling coefficient $k^2$ of about 0.025 or more can be obtained by setting the thickness of the LN single-crystal plate in the range of about 0.2λ to about 0.55λ or about 1.05λ to about 1.6λ, for example.

Accordingly, when the LN single-crystal plate 3 having the Euler angles (0°, 110°, 0°) preferably is used, the thickness of the LN single-crystal plate 3 is preferably set in the range of about 0.14λ to about 1.6λ, for example, when using the primary order mode. On those conditions, it is possible to not only increase the acoustic velocity of the surface acoustic wave, but also to effectively increase the electromechanical coupling coefficient $k^2$. When a larger electromechanical coupling coefficient $k^2$ is demanded, the electromechanical coupling coefficient of about 0.2 or more can be obtained by more preferably setting the thickness of the LN single-crystal plate in the range of about 0.18λ to about 1.17λ, for example.

Further, when the surface acoustic wave in the secondary order mode is used, as described above, the acoustic velocity of the surface acoustic wave and the electromechanical coupling coefficient $k^2$ can be both increased by setting the thickness of the LN single-crystal plate in the range of about 0.2λ to about 0.62λ or about 0.97λ to about 1.6λ, for example.

When the surface acoustic wave in the tertiary order mode is used, the acoustic velocity of about 5300 m/sec or higher and the electromechanical coupling coefficient $k^2$ of about 0.03 or more can be obtained by setting the thickness of the LN single-crystal plate in the range of about 0.35λ to about 1.6λ, for example. Further, the electromechanical coupling coefficient $k^2$ of about 0.05 or more can be obtained by setting the thickness of the LN single-crystal plate in the range of about 0.42λ to about 1.42λ, for example.

LN Single-Crystal Plate/R-Plane Sapphire (0°, 122°23', 0°)

Figure 12:
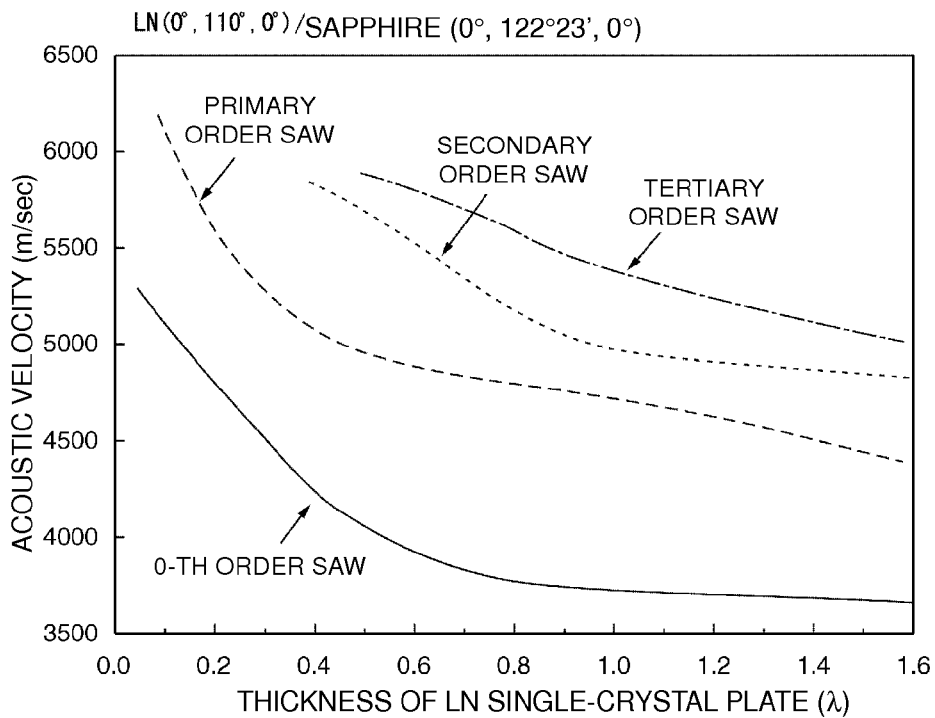
FIG. 12 is a graph depicting, in a structure in which the LiNbO₃ single-crystal plate having the Euler angles (0°, 110°, 0° is stacked on the R-plane sapphire having the Euler angles (0°, 122°23', 0°), the relationship between the thickness of the LiNbO₃ single-crystal plate and the acoustic velocity of a surface acoustic wave.
Figure 13:
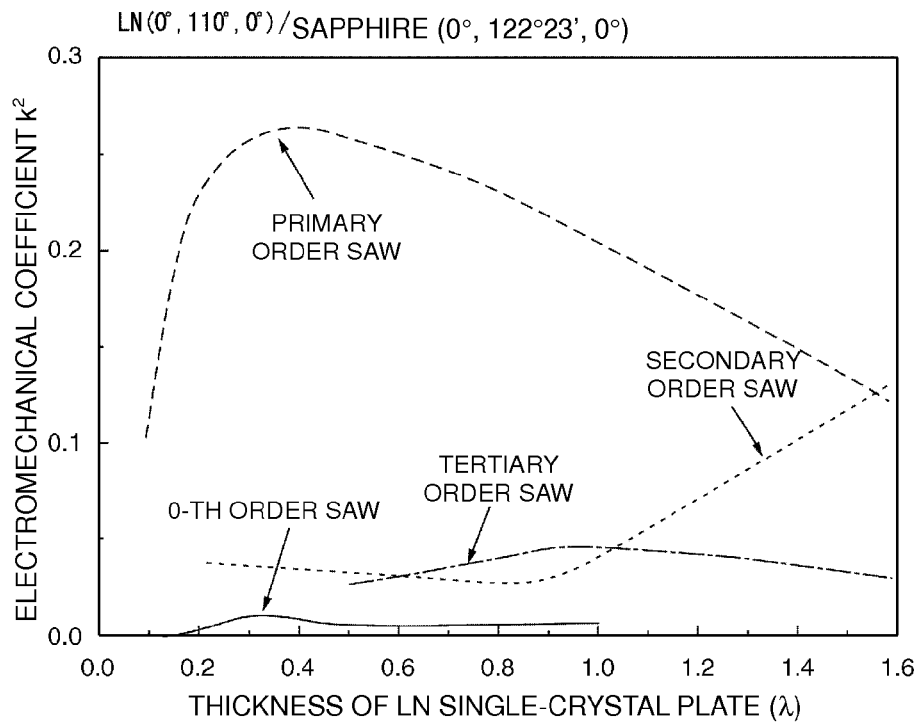
FIG. 13 is a graph depicting, in the structure in which the LiNbO₃ single-crystal plate having the Euler angles (0°, 110°, 0°) is stacked on the R-plane sapphire having the Euler angles (0°, 122°23', 0°), the relationship between the thickness of the LiNbO₃ single-crystal plate and the electromechanical coupling coefficient $k^2$.

FIGS. 12 and 13 are graphs depicting, when a structure of LN (0°, 110°, 0°)/R-plane sapphire (0°, 122°23', 0°) is used, the relationship between the thickness of the LN single-crystal plate and the acoustic velocity of a surface acoustic wave and the electromechanical coupling coefficient, respectively.

As shown in FIG. 12, when the crystal orientation of LN is (0°, 110°, 0°), the acoustic velocity of the surface acoustic wave in the primary order mode is equal to or higher than about 4400 m/sec when the thickness of the LN single-crystal plate is in the range of about 0.05λ to about 1.0λ, for example. The acoustic velocity of the surface acoustic wave can be further increased by using the secondary order mode or the tertiary order mode.

On the other hand, as shown in FIG. 13, when the surface acoustic wave in the primary order mode is used, the electromechanical coupling coefficient $k^2$ can be increased to about 0.125 or more by setting the thickness of the LN single-crystal plate in the range of about 0.11λ to about 1.6λ, for example. When the surface acoustic wave in the secondary order mode is used, the electromechanical coupling coefficient $k^2$ can be increased to about 0.025 or more by setting the thickness in the range of about 0.12λ to about 1.6λ, for example.

Accordingly, when the LN single-crystal plate 3 having the Euler angles (0°, 110°, 0°) is used, the thickness of the LN single-crystal plate 3 is preferably set in the range of about 0.11λ to about 1.6λ, for example, when using the primary order mode. On those conditions, it is possible to not only increase the acoustic velocity of the surface acoustic wave, but also to effectively increase the electromechanical coupling coefficient $k^2$. In order to increase the electromechanical coupling coefficient $k^2$ to about 0.2 or more, the thickness of the LN single-crystal plate is more preferably set in the range of about 0.17λ to about 1.02λ, for example.

Further, when the surface acoustic wave in the secondary order mode is used, as described above, the acoustic velocity of the surface acoustic wave and the electromechanical coupling coefficient $k^2$ can be both increased by setting the thickness of the LN single-crystal plate in the range of about 0.2λ to about 1.6λ, for example. Moreover, the electromechanical coupling coefficient $k^2$ of about 0.03 or more can be obtained by setting the thickness of the LN single-crystal plate in the range of about 0.2λ to about 0.42λ or about 0.95λ to about 1.6λ, for example.

When the surface acoustic wave in the tertiary order mode is used, the acoustic velocity of about 5100 m/sec or higher and the electromechanical coupling coefficient $k^2$ of about 0.025 or more can be obtained by setting the thickness of the LN single-crystal plate in the range of about 0.4λ to about 1.6λ, for example. Further, the electromechanical coupling coefficient $k^2$ of about 0.03 or more can be obtained by setting the thickness of the LN single-crystal plate in the range of about 0.6λ to about 1.55λ, for example.

In any of the cases of FIGS. 5, 7, 9, 11 and 13, the electromechanical coupling coefficient $k^2$ can be increased to about 0.02 or more by setting the thickness of the LiNbO$_3$ single-crystal plate 3 in the range of about 0.14λ to about 1.6λ, for example. In FIGS. 5, 7, 9, 11 and 13, particularly, the electromechanical coupling coefficient $k^2$ in the primary order mode can be further increased to about 0.115 or more.

LN (0°, 110°, 0°)/Sapphire (0°, 90°, 0°)

Figure 50:
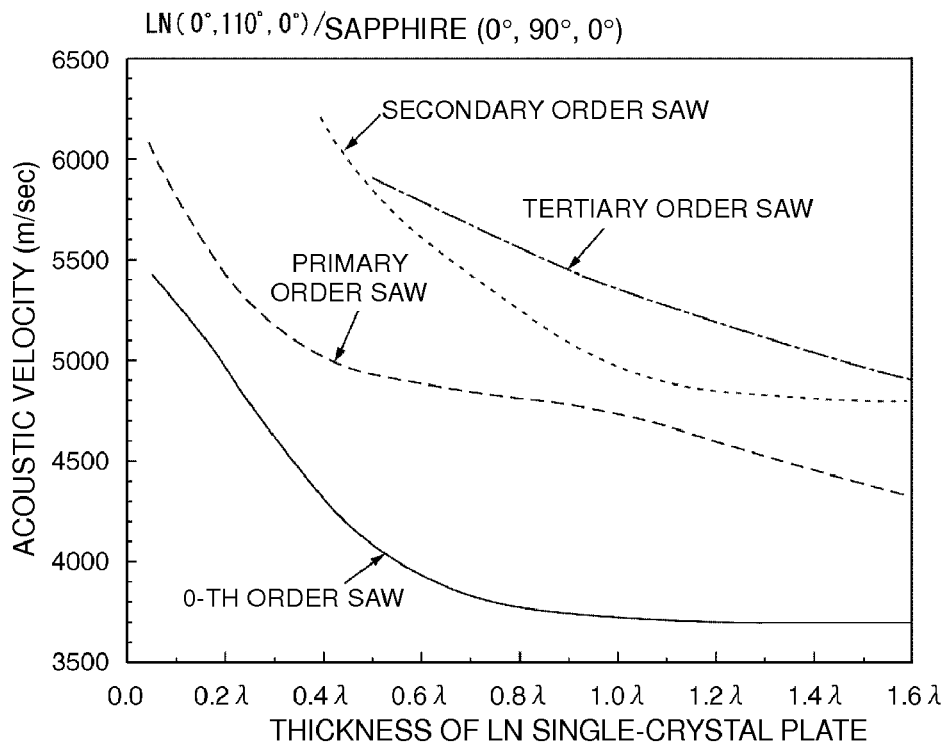
FIG. 50 is a graph depicting, in the surface acoustic wave device according to the first preferred embodiment of the present invention in which the $LiNbO_3$ single-crystal plate having the Euler angles (0°, 110°, 0°) is stacked on the sapphire substrate having the Euler angles (0°, 90°, 0°), the relationship between the acoustic velocity of a surface acoustic wave in each of the 0-th order mode, the primary order mode, the secondary order mode and the tertiary order mode and the thickness of the $LiNbO_3$ single-crystal plate.
Figure 51:
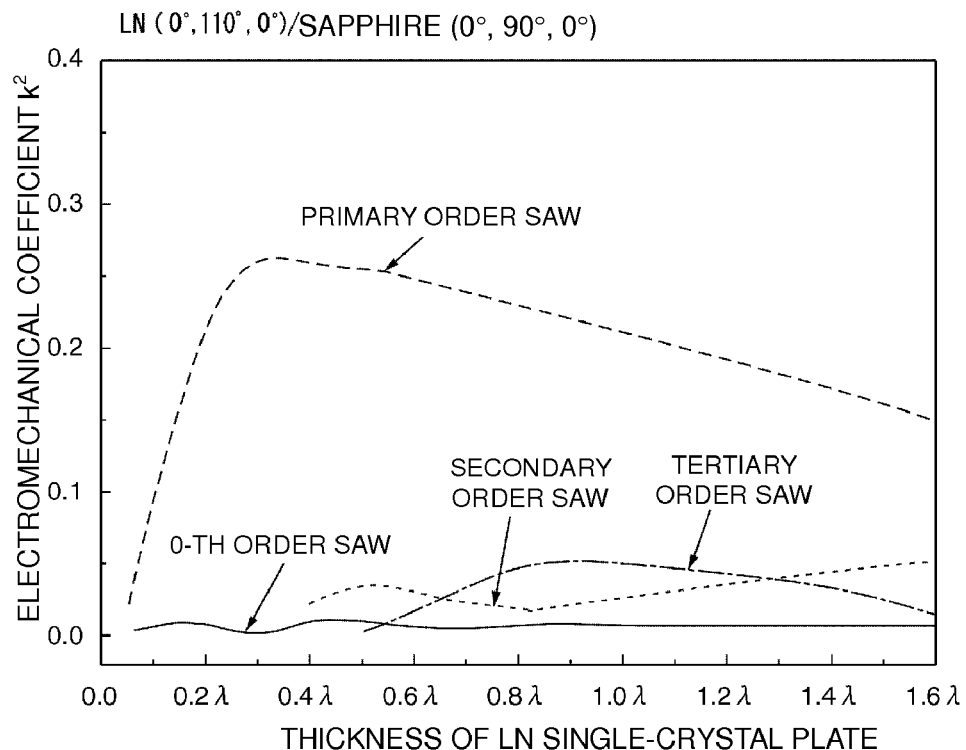
FIG. 51 is a graph depicting, in the surface acoustic wave device according to the first preferred embodiment of the present invention in which the $LiNbO_3$ single-crystal plates having the Euler angles (0°, 110°, 0°) is stacked on the sapphire substrate having the Euler angles (0°, 90°, 0°), the relationship between the electromechanical coupling coefficient $k^2$ in each of the 0-th order mode, the primary order mode, the secondary order mode and the tertiary order mode and the thickness of the $LiNbO_3$ single-crystal plate.

FIG. 50 is a graph depicting, in a structure of the surface acoustic wave device according to the first preferred embodiment, illustrated in FIG. 1A, in which the high acoustic-velocity substrate 2 is made of sapphire having the Euler angles (0°, 90°, 0°) and the LN single-crystal plate 3 has the Euler angles (0°, 110°, 0°), the relationship between the acoustic velocity of a surface acoustic wave in each of the 0-th order mode, the primary order mode, the secondary order mode and the tertiary order mode and the thickness of the LN single-crystal plate. FIG. 51 depicts the relationship between the thickness of the LN single-crystal plate and the electromechanical coupling coefficient $k^2$.

As shown in FIG. 50, the acoustic velocity of the surface acoustic wave in the primary order mode is equal to or higher than about 4400 m/sec when the thickness of the LN single-crystal plate is in the range of about 1.6λ or less. By using the surface acoustic wave in the secondary order mode or the tertiary order mode, the acoustic velocity of the surface acoustic wave can be further increased when the thickness of the LN plate is the range of about 0.4λ to about 1.6λ or about 0.5λ to about 1.6λ, respectively.

As shown in FIG. 51, when the surface acoustic wave in the primary order mode is used, the thickness of the LN single-crystal plate is preferably in the range of about 0.27λ to about 0.6λ, for example. On that condition, the electromechanical coupling coefficient $k^2$ can be increased to about 0.25 or more.

Further, when the surface acoustic wave in the secondary order mode is used, the electromechanical coupling coefficient $k^2$ can be increased to about 0.02 or more by setting the thickness of the LN single-crystal plate in the range of about 0.4λ to about 1.6λ. When the surface acoustic wave in the tertiary order mode is used, the electromechanical coupling coefficient $k^2$ can be increased to about 0.02 or more by setting the thickness of the LN single-crystal plate in the range of about 0.6λ to about 1.6λ, for example.

LN (0°, 110°, 0°)/Sapphire (90°, 90°, 0°)

Figure 54:
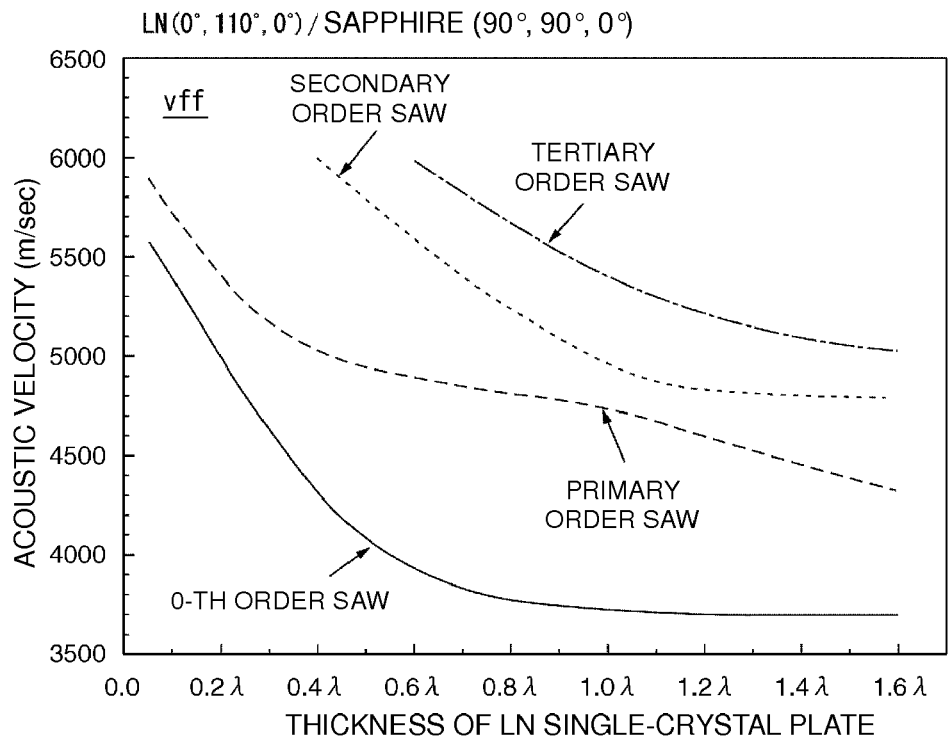
FIG. 54 is a graph depicting, in the surface acoustic wave device according to the first preferred embodiment of the present invention in which the $LiNbO_3$ having the Euler angles (0°, 110°, 0°) is stacked on an alumina substrate having the Euler angles (90°, 90°, 0°), the relationship between the thickness of the $LiNbO_3$ single-crystal plate and the acoustic velocity of a surface acoustic wave.
Figure 55:
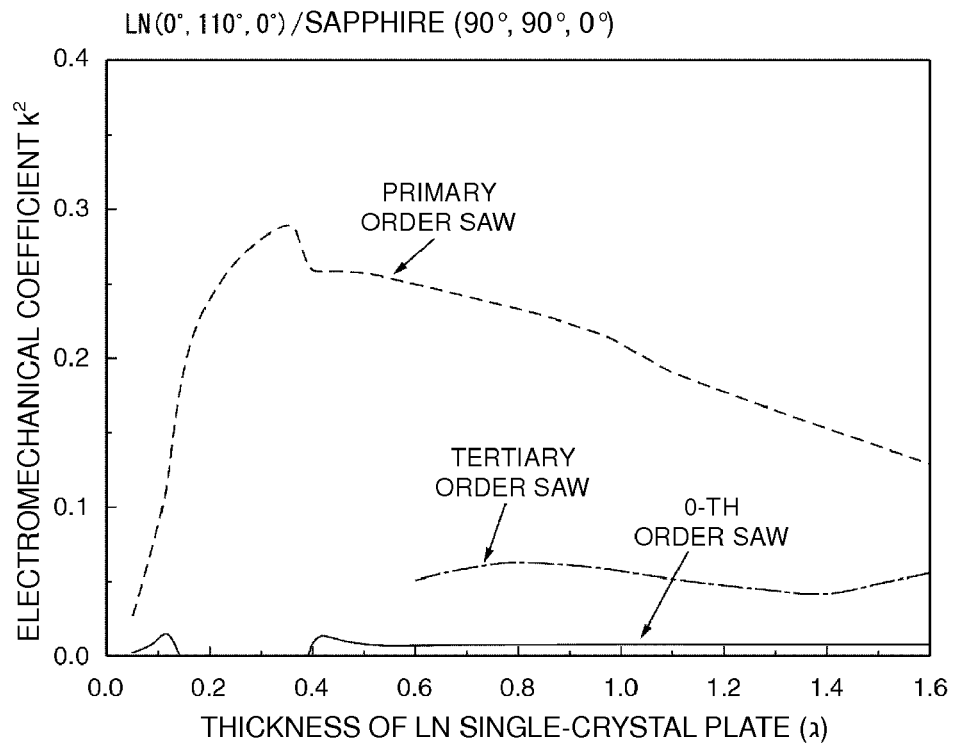
FIG. 55 is a graph depicting, in the surface acoustic wave device according to the first preferred embodiment of the present invention in which the LiNbO$_3$ having the Euler angles (0°, 110°, 0°) is stacked on the alumina substrate having the Euler angles (90°, 90°, 0°), the relationship between the thickness of the LiNbO$_3$ single-crystal plate and the electromechanical coupling coefficient k$^2$.

FIG. 54 is a graph depicting, in a structure of the surface acoustic wave device according to the first preferred embodiment, illustrated in FIG. 1A, in which the high acoustic-velocity substrate 2 is made of sapphire having the Euler angles (90°, 90°, 0°) and the LN single-crystal plate 3 has the Euler angles (0°, 110°, 0°), the relationship between the thickness of the LN single-crystal plate and the acoustic velocity of a surface acoustic wave in each of the 0-th order mode, the primary order mode, the secondary order mode and the tertiary order mode. FIG. 55 depicts the relationship between the thickness of the LN single-crystal plate 3 and the electromechanical coupling coefficient $k^2$.

As shown in FIG. 54, when the surface acoustic wave in the primary order mode is used in the relevant structure, the acoustic velocity is equal to or higher than about 4350 m/sec when the thickness of the LN single-crystal plate is in the range of about 1.6λ or less. When the surface acoustic wave in the secondary order mode or the surface acoustic wave in the tertiary order mode is used, the acoustic velocity of the surface acoustic wave can be further increased respectively to about 5000 m/sec or higher or about 5250 m/sec or higher when the thickness of the LN single-crystal plate is in the range of about 0.4λ to about 1.6λ or about 0.6λ to about 1.6λ, for example.

On the other hand, as shown in FIG. 55, when the surface acoustic wave in the primary order mode is used, the electromechanical coupling coefficient $k^2$ is in the range of about 0.05 to about 0.1 when the thickness of the LN single-crystal plate is in the range of about 0.05λ to about 0.1λ, while the acoustic velocity is as high as about 5700 m/sec. Further, the electromechanical coupling coefficient $k^2$ is equal to or larger than about 0.1 when the thickness of the LN single-crystal plate is in the range of about 0.1λ to about 1.6λ, for example. When the surface acoustic wave in the secondary order mode is used, the electromechanical coupling coefficient $k^2$ is about 0.015 or more when the thickness of the LN single-crystal plate is in the range of about 0.4λ to about 1.6λ, for example. When the surface acoustic wave in the tertiary order mode is used, the electromechanical coupling coefficient $k^2$ can be increased to about 0.05 or more when the thickness of the LN single-crystal plate is in the range of about 0.6λ to about 1.6λ, for example.

Figure 14:
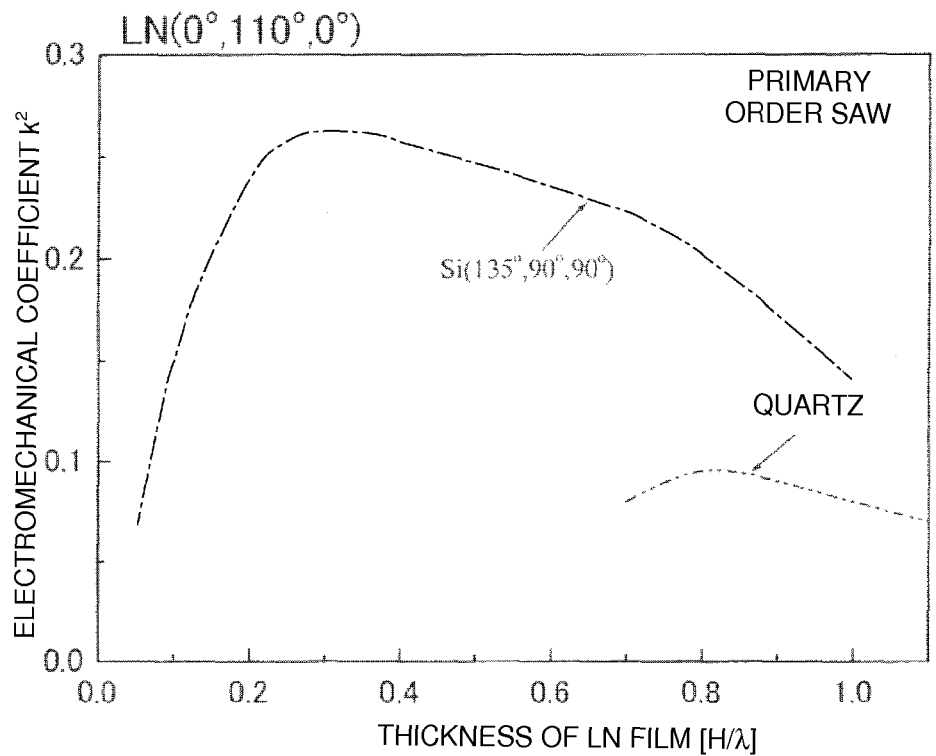
FIG. 14 is a graph depicting, when the LiNbO₃ single-crystal plate having the Euler angles (0°, 110°, 0°) is stacked on each of substrates made of a silicon single-crystal having the Euler angles (135°, 90°, 90°) and quartz, the relationship between the thickness of the LN single-crystal plate and the electromechanical coupling coefficient $k^2$.
Figure 15:
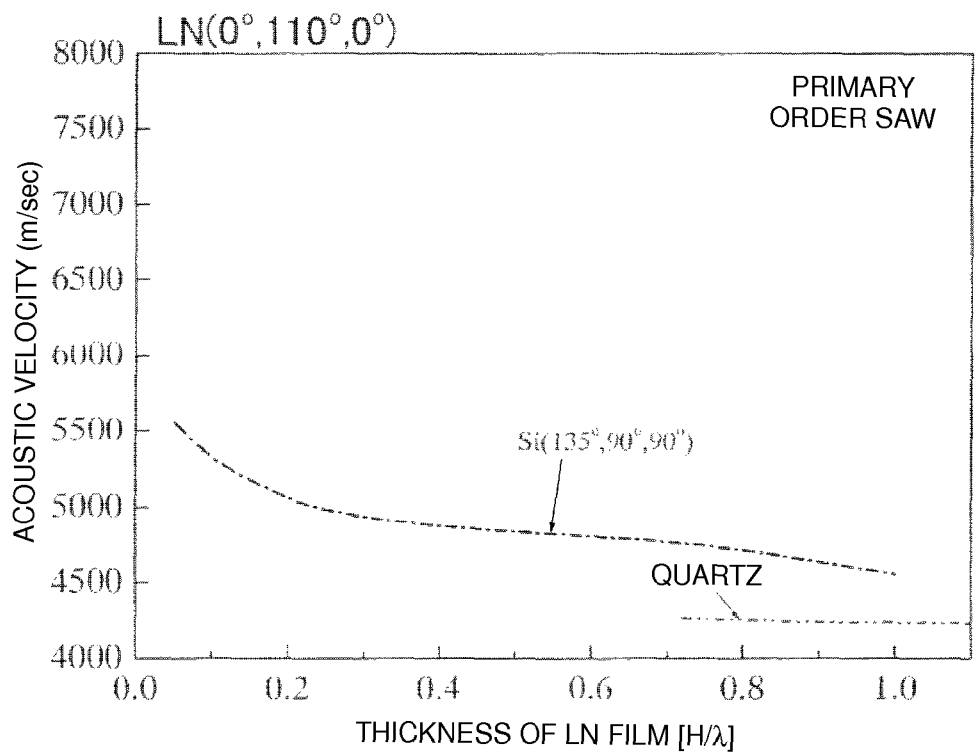
FIG. 15 is a graph depicting, when the LiNbO₃ single-crystal plate having the Euler angles (0°, 110°, 0°) is stacked on each of substrates made of the silicon single-crystal having the Euler angles (135°, 90°, 90°) and quartz, the relationship between the thickness of the LN single-crystal plate and the acoustic velocity of a surface acoustic wave.

FIGS. 14 and 15 are graphs depicting, when a structure of LN (0°, 110°, 0°)/Si (135°, 90°, 90°) is used, the relationship between the thickness of the LN single-crystal plate and the acoustic velocity of a surface acoustic wave and the electromechanical coupling coefficient, respectively. For comparison, FIGS. 14 and 15 further depict the results obtained by using quartz instead of Si (135°, 90°, 90°).

As shown in FIG. 15, when the crystal orientation of LN is (0°, 110°, 0°), the acoustic velocity of the surface acoustic wave in the primary order mode is equal to or higher than about 4500 m/sec when the thickness of the LN single-crystal plate is in the range of about 0.05λ to about 1.0λ. Thus, the acoustic velocity of the surface acoustic wave can be increased in that range.

On the other hand, as shown in FIG. 14, when the surface acoustic wave in the primary order mode is used, the electromechanical coupling coefficient $k^2$ can be increased to about 0.14 or more by setting the thickness of the LN single-crystal plate in the range of about 0.08λ to about 1.0λ, for example, in the structure where the LN single-crystal plate is disposed on Si (135°, 90°, 90°).

Dependency on Euler Angle θ

Figure 16:
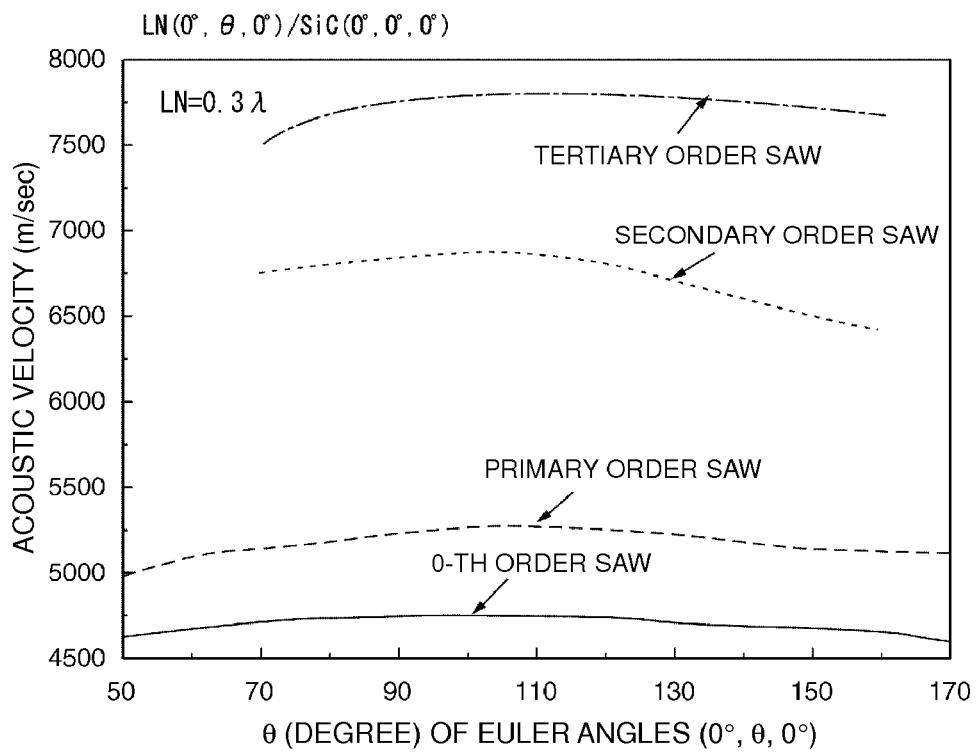
FIG. 16 is a graph depicting, in a structure in which a LiNbO₃ single-crystal plate having the Euler angles (0°, θ, 0°) and a thickness of about 0.3λ is stacked on the SiC substrate having the Euler angles (0°, 0°, 0°), the relationship between the Euler angle θ and the acoustic velocity of a surface acoustic wave.
Figure 17:
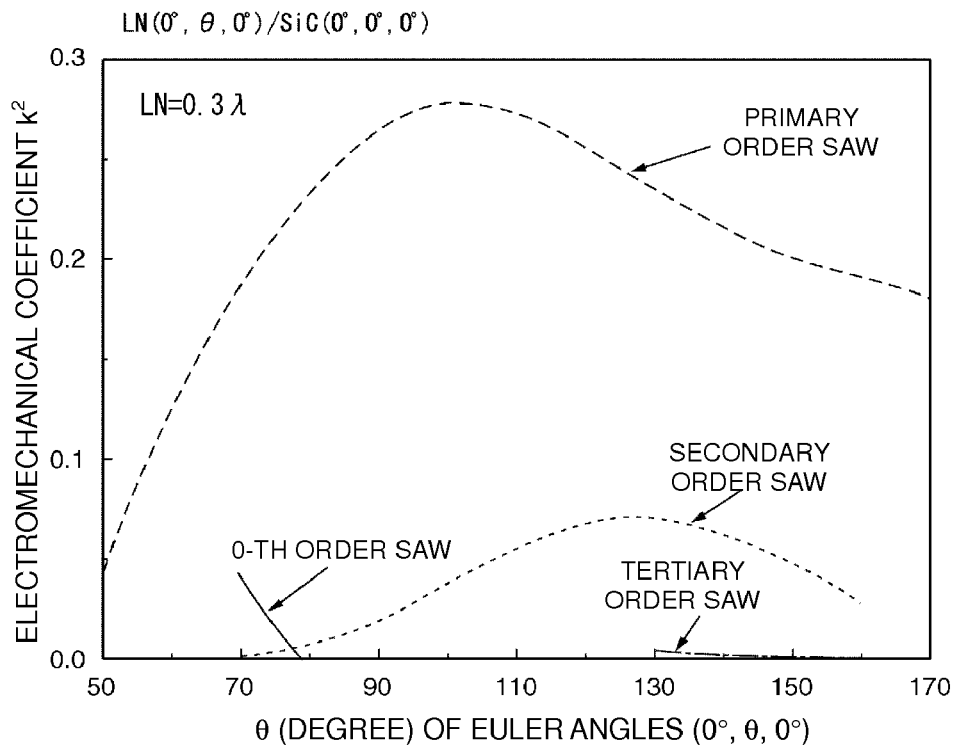
FIG. 17 is a graph depicting, in the structure in which the LiNbO₃ single-crystal plate having the Euler angles (0°, θ, 0°) and the thickness of about 0.3λ is stacked on the SiC substrate having the Euler angles (0°, 0°, 0°), the relationship between the Euler angle θ and the electromechanical coupling coefficient $k^2$.

FIGS. 16 and 17 are graphs depicting, in a structure of LN (0°, θ, 0°)/SiC (0°, 0°, 0°), the relationship between θ of the Euler angles (0°, θ, 0°) and the acoustic velocity of a surface acoustic wave and the electromechanical coupling coefficient $k^2$, respectively. It is to be noted that, in FIGS. 16 and 17, the thickness of the LN single-crystal plate 3 is preferably set to about 0.3λ, for example. Also, in FIGS. 18 to 27 described later, the thickness of the LN single-crystal plate is preferably set to about 0.3λ, for example.

As shown in FIG. 16, the acoustic velocity of the surface acoustic wave in the primary order mode is equal to or higher than about 5100 m/sec when the Euler angle θ of the LN single-crystal plate 3 is in the range of about 70° to about 160°, for example.

On the other hand, as shown in FIG. 17, the electromechanical coupling coefficient $k^2$ for the surface acoustic wave in the primary order mode is equal to or larger than about 0.18 when the Euler angle θ of the LN single-crystal plate 3 is in the range of about 70° to about 160°, for example. More preferably, the electromechanical coupling coefficient $k^2$ is increased to about 0.225 or more in the range of about 80° to about 135°, for example. Even more preferably, the electromechanical coupling coefficient $k^2$ is increased to about 0.27 or more in the range of about 92° to about 115°, for example.

Further, when the surface acoustic wave in the secondary order mode is used, the electromechanical coupling coefficient $k^2$ can be increased to about 0.025 or more at the Euler angle θ in the range of about 94° to about 170°, for example.

Figure 18:
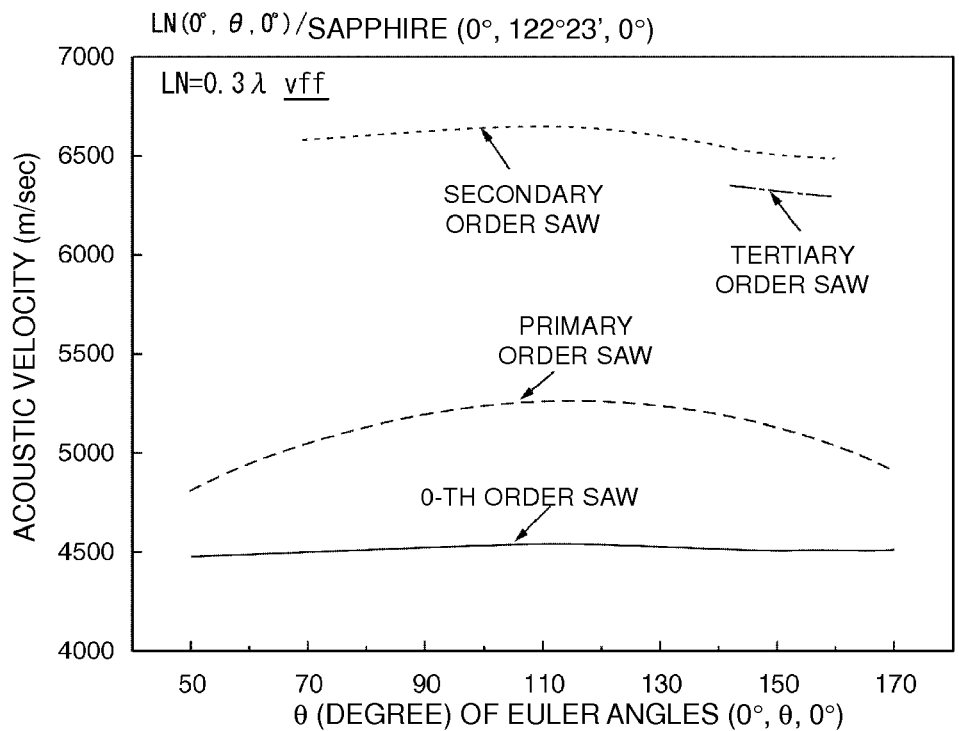
FIG. 18 is a graph depicting, in a structure in which the LiNbO₃ single-crystal plate having the Euler angles (0°, θ, 0° and the thickness of about 0.3λ is stacked on a substrate made of the R-plane sapphire having the Euler angles (0°, 122°23', 0°), the relationship between the Euler angle θ and the acoustic velocity of a surface acoustic wave.
Figure 19:
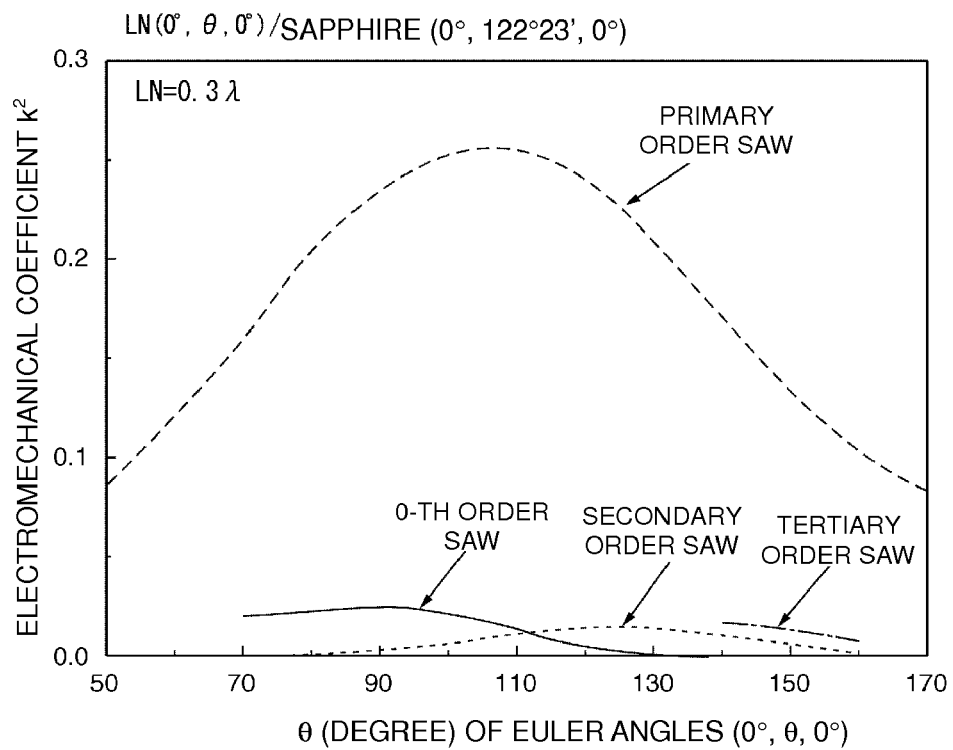
FIG. 19 is a graph depicting, in the structure in which the LiNbO₃ single-crystal plate having the Euler angles (0°, θ, 0° and the thickness of about 0.3λ is stacked on the substrate made of the R-plane sapphire having the Euler angles (0°, 122°23', 0°), the relationship between the Euler angle θ and the electromechanical coupling coefficient $k^2$.

FIGS. 18 and 19 are graphs depicting, in a structure of LN (0°, θ, 0°)/R-plane sapphire (0°, 122°23', 0°), the relationship between θ of the Euler angles (0°, θ, 0°) and the acoustic velocity of a surface acoustic wave and the electromechanical coupling coefficient $k^2$, respectively.

As shown in FIG. 18, the acoustic velocity of the surface acoustic wave in the primary order mode is equal to or higher than about 5050 m/sec when the Euler angle θ of the LN single-crystal plate 3 is in the range of about 70° to about 160°, for example.

On the other hand, as shown in FIG. 19, the Euler angle θ of the LN single-crystal plate 3 is preferably in the range of about 67° to about 147°, for example. On that condition, the electromechanical coupling coefficient $k^2$ for the surface acoustic wave in the primary order mode is equal to or larger than about 0.15. More preferably, the electromechanical coupling coefficient $k^2$ is increased to about 0.2 or more at θ in the range of about 80° to about 133°, for example. Even more preferably, the electromechanical coupling coefficient $k^2$ of about 0.24 or more can be obtained in the range of about 93° to about 122°, for example.

Figure 20:
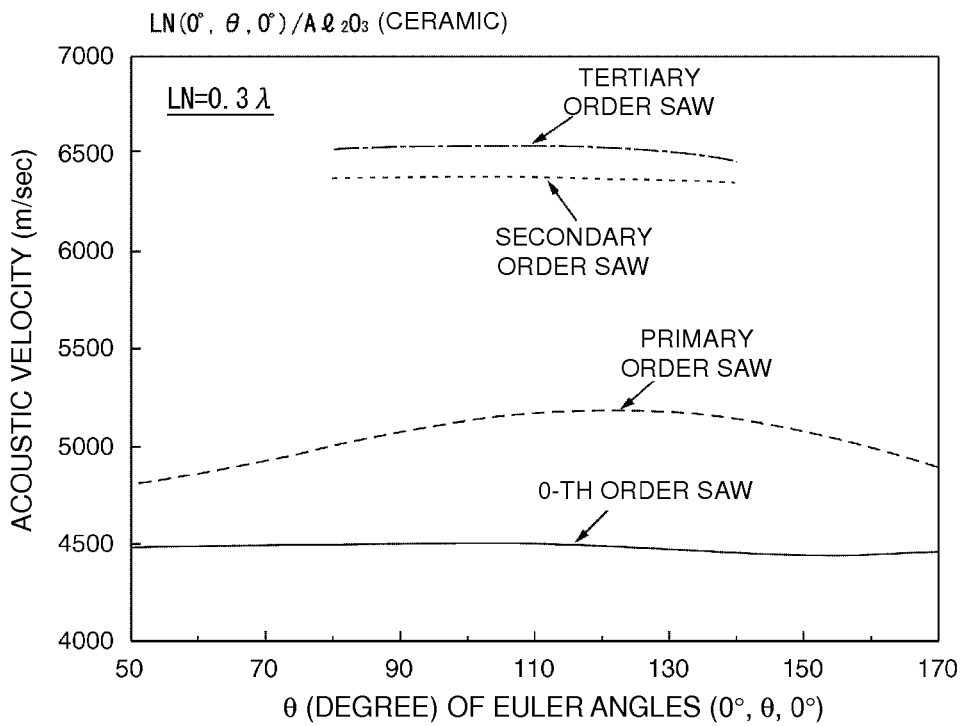
FIG. 20 is a graph depicting, in a structure in which the LiNbO₃ single-crystal plate having the Euler angles (0°, θ, 0° and the thickness of about 0.3λ is stacked on a substrate made of alumina Al₂O₃, the relationship between the Euler angle θ and the acoustic velocity of a surface acoustic wave.
Figure 21:
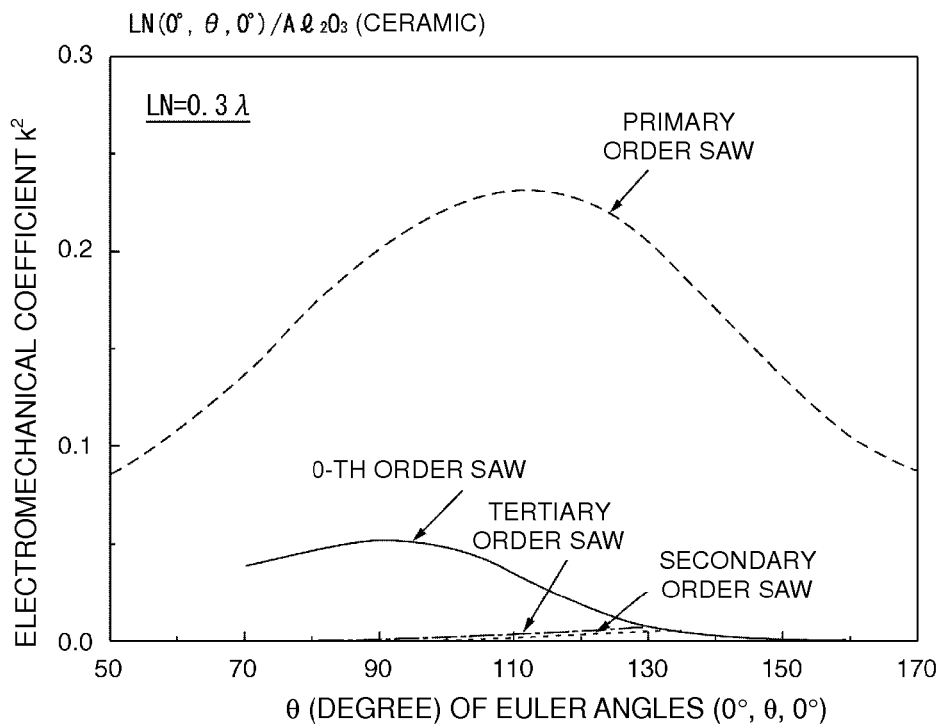
FIG. 21 is a graph depicting, in the structure in which the LiNbO₃ single-crystal plate having the Euler angles (0°, θ, 0° and the thickness of about 0.3λ is stacked on the substrate made of alumina Al₂O₃, the relationship between the Euler angle θ and the electromechanical coupling coefficient $k^2$.

FIGS. 20 and 21 are graphs depicting, in a structure of LN (0°, θ, 0°)/alumina $Al_2O_3$, the relationship between θ of the Euler angles (0°, θ, 0°) and the acoustic velocity of a surface acoustic wave and the electromechanical coupling coefficient $k^2$, respectively.

As shown in FIG. 20, the acoustic velocity of the surface acoustic wave in the primary order mode is equal to or higher than about 4900 m/sec when the Euler angle θ of the LN single-crystal plate 3 is in the range of about 70° to about 160°, for example.

On the other hand, as shown in FIG. 21, the Euler angle θ of the LN single-crystal plate 3 is preferably in the range of about 70° to about 160°, for example. On that condition, the electromechanical coupling coefficient $k^2$ for the surface acoustic wave in the primary order mode is preferably equal to or larger than about 0.11, for example. More preferably, the electromechanical coupling coefficient $k^2$ is preferably increased to about 0.18 or more at θ in the range of about 80° to about 138°, for example. Even more preferably, the electromechanical coupling coefficient $k^2$ of about 0.2 or more can be obtained at θ in the range of about 92° to about 132°, for example.

Figure 22:
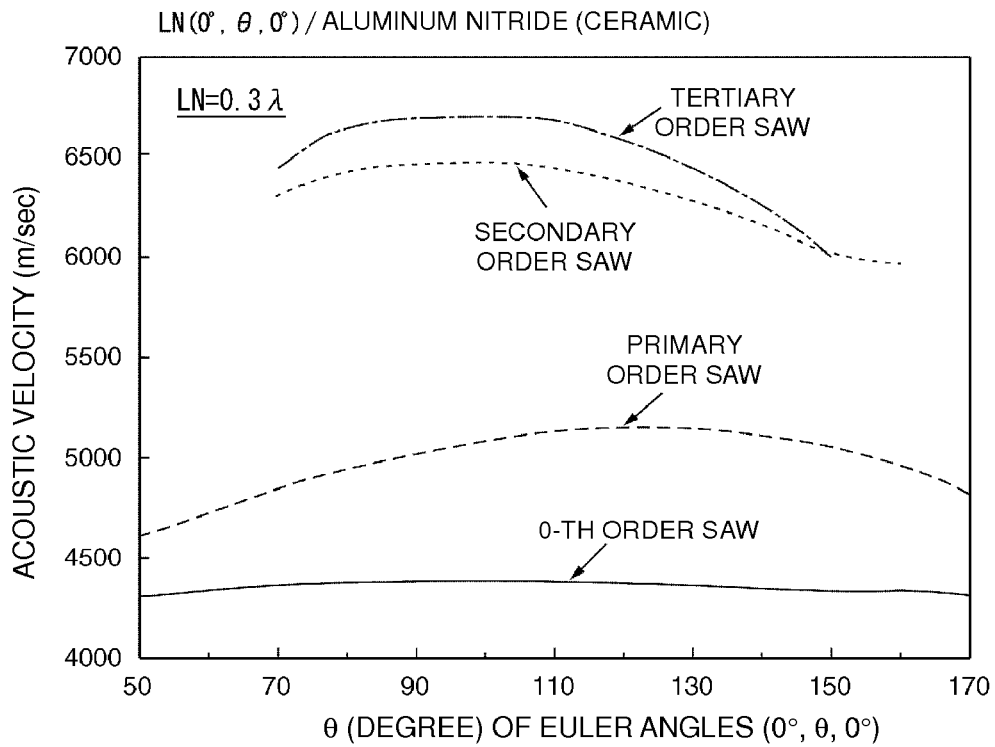
FIG. 22 is a graph depicting, in a structure in which the LiNbO₃ single-crystal plate having the Euler angles (0°, θ, 0° and the thickness of about 0.3λ is stacked on a substrate made of aluminum nitride, the relationship between the Euler angle θ and the acoustic velocity of a surface acoustic wave.
Figure 23:
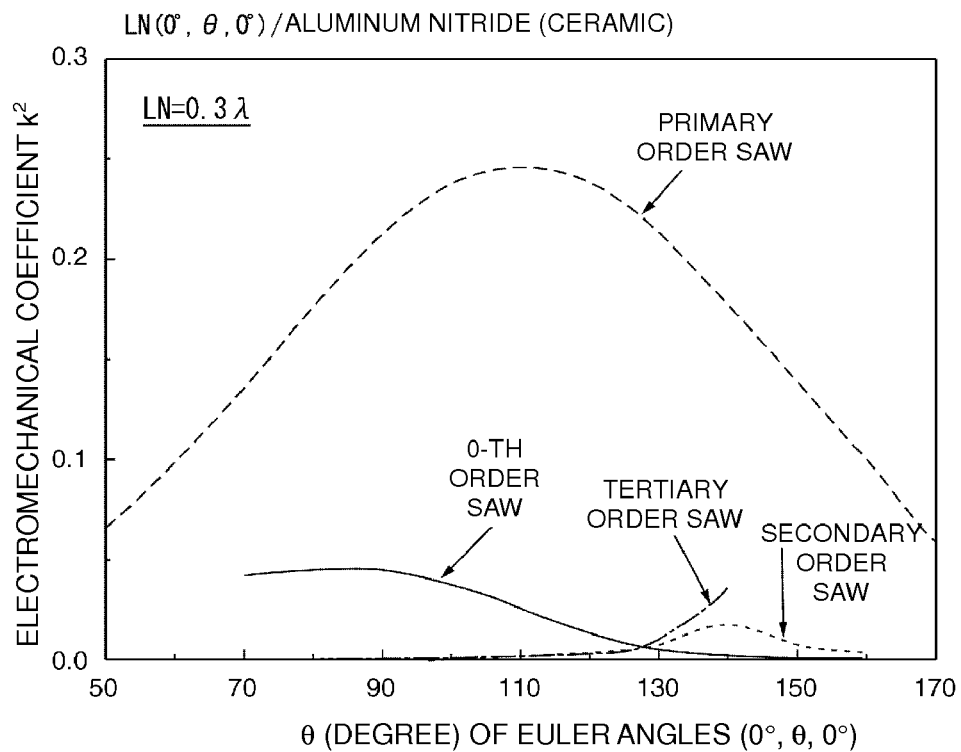
FIG. 23 is a graph depicting, in the structure in which the LiNbO₃ single-crystal plate having the Euler angles (0°, θ, 0° and the thickness of about 0.3λ is stacked on the substrate made of aluminum nitride, the relationship between the Euler angle θ and the electromechanical coupling coefficient $k^2$.

FIGS. 22 and 23 are graphs depicting, in a structure of LN (0°, θ, 0°)/aluminum nitride, the relationship between θ of the Euler angles (0°, θ, 0°) and the acoustic velocity of a surface acoustic wave and the electromechanical coupling coefficient $k^2$, respectively.

As shown in FIG. 22, the acoustic velocity of the surface acoustic wave in the primary order mode is satisfactorily equal to or higher than about 4800 m/sec when the Euler angle θ of the LN single-crystal plate 3 is in the range of about 70° to about 160°, for example.

On the other hand, as shown in FIG. 23, the Euler angle θ of the LN single-crystal plate 3 is preferably in the range of about 70° to about 150°, for example. On that condition, the electromechanical coupling coefficient $k^2$ for the surface acoustic wave in the primary order mode is equal to or larger than about 0.13. More preferably, the electromechanical coupling coefficient $k^2$ of about 0.175 or more is obtained in the range of about 80° to about 140°, for example. Even more preferably, the electromechanical coupling coefficient $k^2$ of about 0.22 or more can be obtained in the range of about 93° to about 130°, for example.

Figure 24:
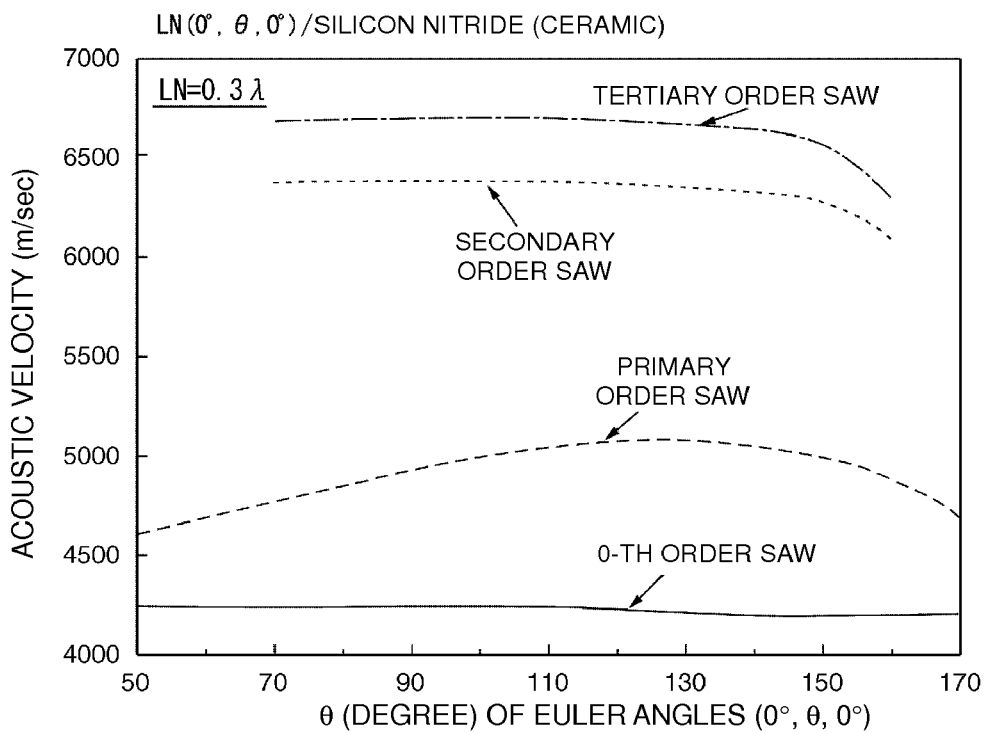
FIG. 24 is a graph depicting, in a structure in which the LiNbO₃ single-crystal plate having the Euler angles (0°, θ, 0° and the thickness of about 0.3λ is stacked on a substrate made of silicon nitride, the relationship between the Euler angle θ and the acoustic velocity of a surface acoustic wave.
Figure 25:
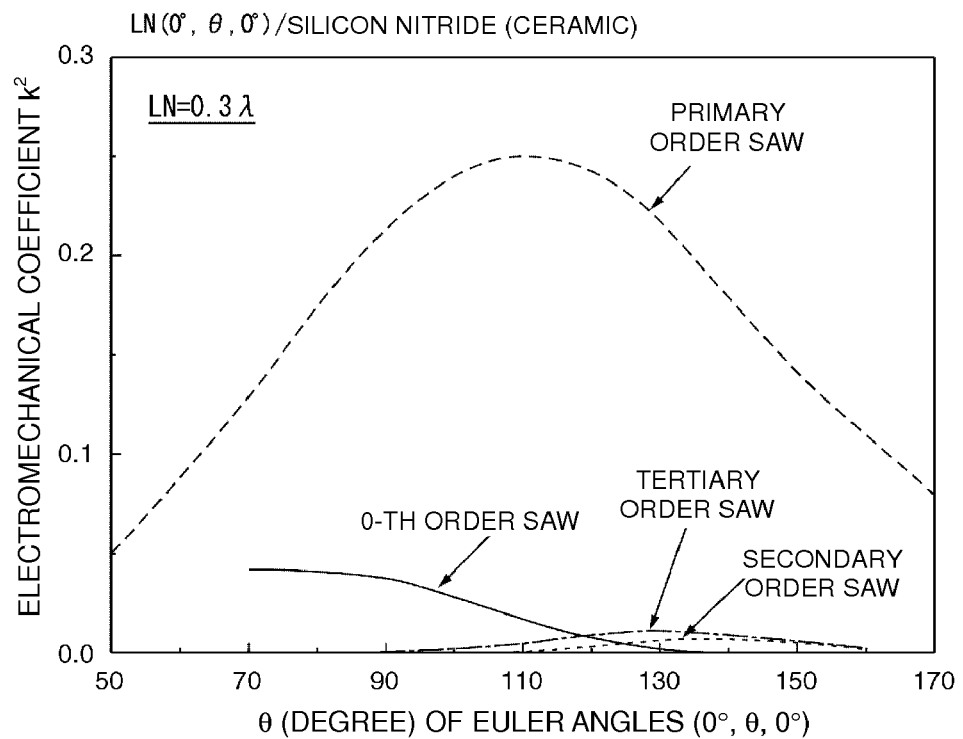
FIG. 25 is a graph depicting, in the structure in which the LiNbO₃ single-crystal plate having the Euler angles (0°, θ, 0° and the thickness of about 0.3λ is stacked on the substrate made of silicon nitride, the relationship between the Euler angle θ and the electromechanical coupling coefficient $k^2$.

FIGS. 24 and 25 are graphs depicting, in a structure of LN (0°, θ, 0°)/silicon nitride, the relationship between θ of the Euler angles (0°, θ, 0°) and the acoustic velocity of a surface acoustic wave and the electromechanical coupling coefficient $k^2$, respectively.

As shown in FIG. 24, the acoustic velocity of the surface acoustic wave in the primary order mode is equal to or higher than about 4700 m/sec when the Euler angle θ of the LN single-crystal plate 3 is in the range of about 70° to about 160°, for example.

On the other hand, as shown in FIG. 25, when the surface acoustic wave in the primary order mode is used, the Euler angle θ of the LN single-crystal plate 3 is preferably in the range of about 70° to about 153°, for example. On that condition, the electromechanical coupling coefficient $k^2$ is about 0.12 or more. More preferably, the electromechanical coupling coefficient $k^2$ is increased to about 0.17 or more at θ in the range of about 80° to about 140°, for example. Even more preferably, the electromechanical coupling coefficient $k^2$ of about 0.22 or more can be obtained in the range of about 93° to about 126° m, for example.

Figure 26:
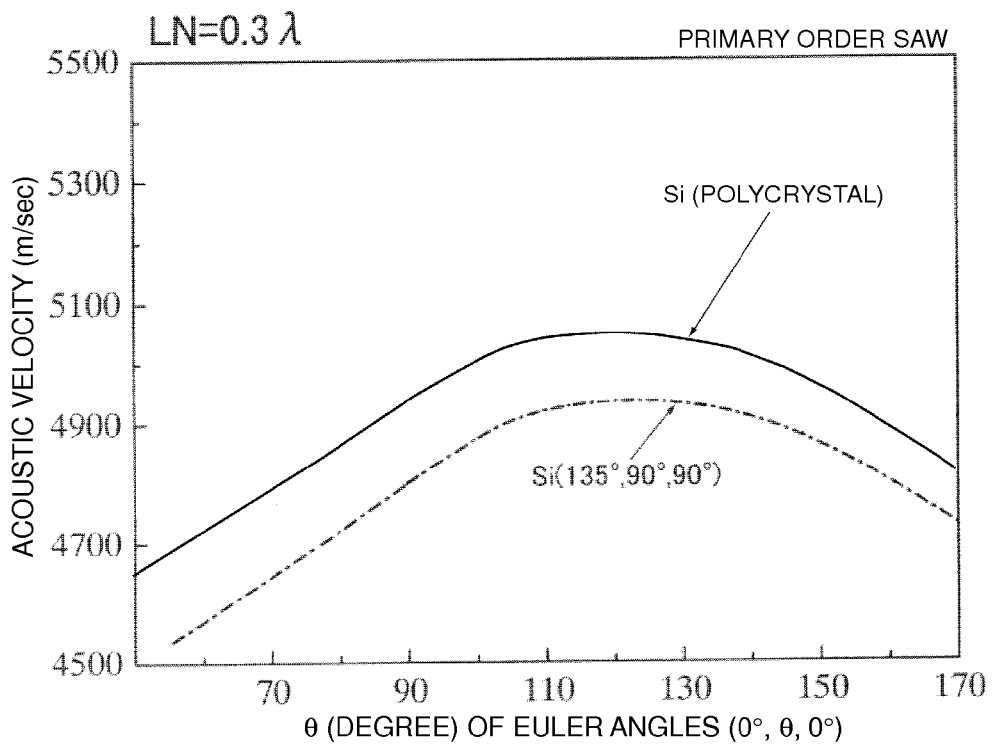
FIG. 26 is a graph depicting, when the LiNbO$_3$ single-crystal plate having the Euler angles (0°, θ°, 0°) is stacked on each of substrates made of the silicon single-crystal having the Euler angles (135°, 90°, 90°) and Si (polycrystal), the relationship between θ of the Euler angles (0°, θ°, 0°) and the acoustic velocity of a surface acoustic wave.
Figure 27:
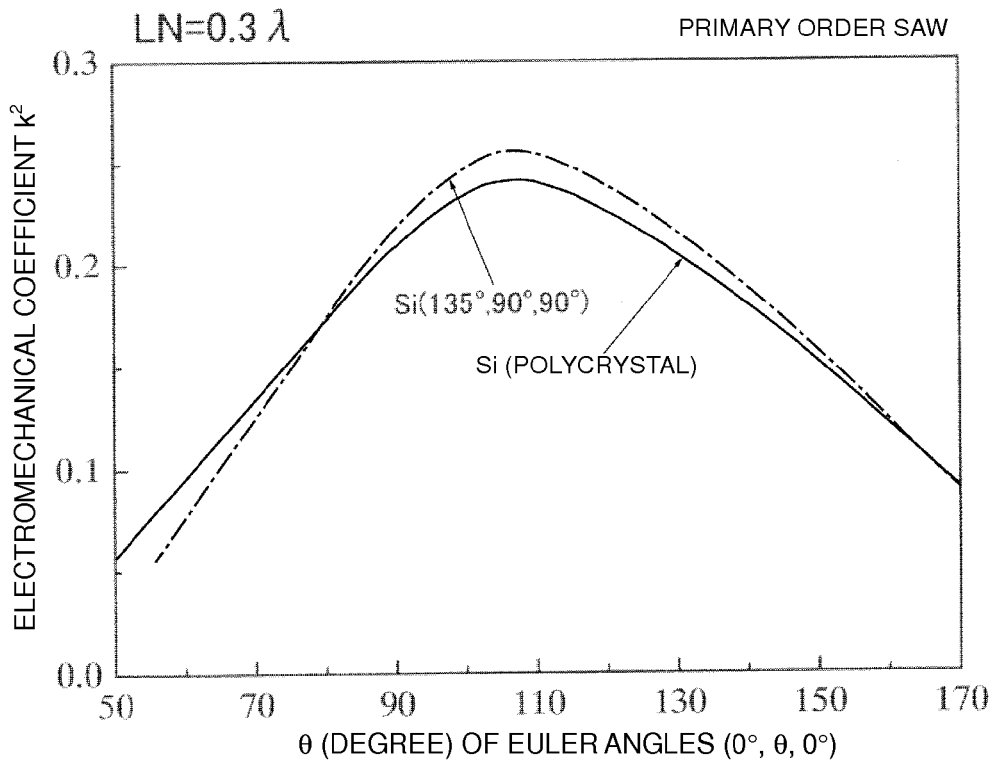
FIG. 27 is a graph depicting, when the LiNbO$_3$ single-crystal plate having the Euler angles (0°, θ°, 0°) is stacked on each of the substrates made of the silicon single-crystal having the Euler angles (135°, 90°, 90°) and Si (polycrystal), the relationship between θ of the Euler angles (0°, θ°, 0°) and the electromechanical coupling coefficient.

FIGS. 26 and 27 are graphs depicting, in structures of LN (0°, θ, 0°)/Si (135°, 90°, 90°) and LN (0°, θ, 0°)/Si (polycrystal), the relationship between θ of the Euler angles (0°, θ, 0°) and the acoustic velocity of a surface acoustic wave and the electromechanical coupling coefficient $k^2$, respectively.

In the structure of LN (0°, θ, 0°)/Si (135°, 90°, 90°), as shown in FIG. 26, the acoustic velocity of the surface acoustic wave in the primary order mode is equal to or higher than about 4650 m/sec when the Euler angle θ of the LN single-crystal plate 3 is in the range of about 70° to about 160°, for example.

Also, in the structure of LN (0°, θ, 0°)/Si (135°, 90°, 90°, as shown in FIG. 27, the Euler angle θ of the LN single-crystal plate 3 is preferably in the range of about 75° to about 152°, for example, when the surface acoustic wave in the primary order mode is used. On those conditions, the electromechanical coupling coefficient $k^2$ is preferably equal to or larger than about 0.15, for example. More preferably, the electromechanical coupling coefficient $k^2$ of about 0.22 or more can be obtained in the range of about 92° to about 127°, for example.

In the structure of LN (0°, θ, 0°)/Si (polycrystal), as shown in FIG. 26, the acoustic velocity of the surface acoustic wave in the primary order mode is equal to or higher than about 4800 m/sec when the Euler angle θ of the LN single-crystal plate 3 is in the range of about 70° to about 160°, for example.

Also, in the structure of LN (0°, θ, 0°)/Si (polycrystal), as shown in FIG. 27, the Euler angle θ of the LN single-crystal plate 3 is preferably in the range of about 75° to about 148°, for example, when the surface acoustic wave in the primary order mode is used. On those conditions, the electromechanical coupling coefficient $k^2$ preferably is equal to or larger than about 0.15, for example. More preferably, the electromechanical coupling coefficient $k^2$ of about 0.22 or more is obtained in the range of about 95° to about 122°, for example.

Figure 56:
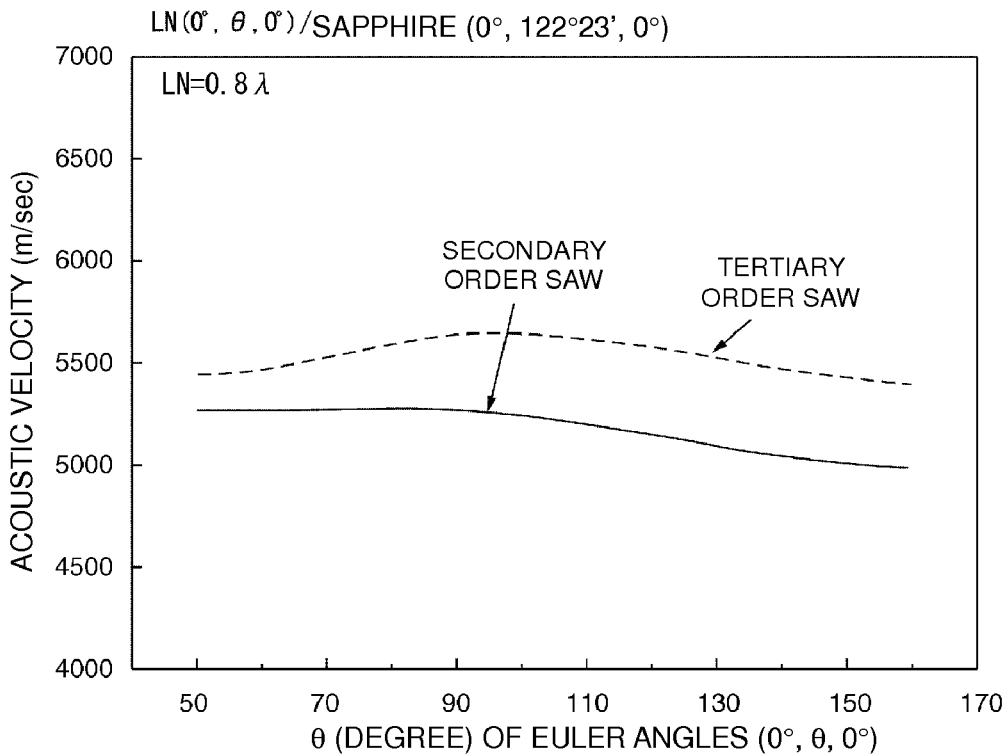
FIG. 56 is a graph depicting, in a structure in which a LiNbO$_3$ single-crystal plate having the Euler angles (0°, θ°, 0°) and a thickness of about 0.8λ is stacked on the substrate made of the R-plane sapphire having the Euler angles (0°, 122°23', 0°), the relationship between the Euler angle θ and the acoustic velocity of a surface acoustic wave.
Figure 57:
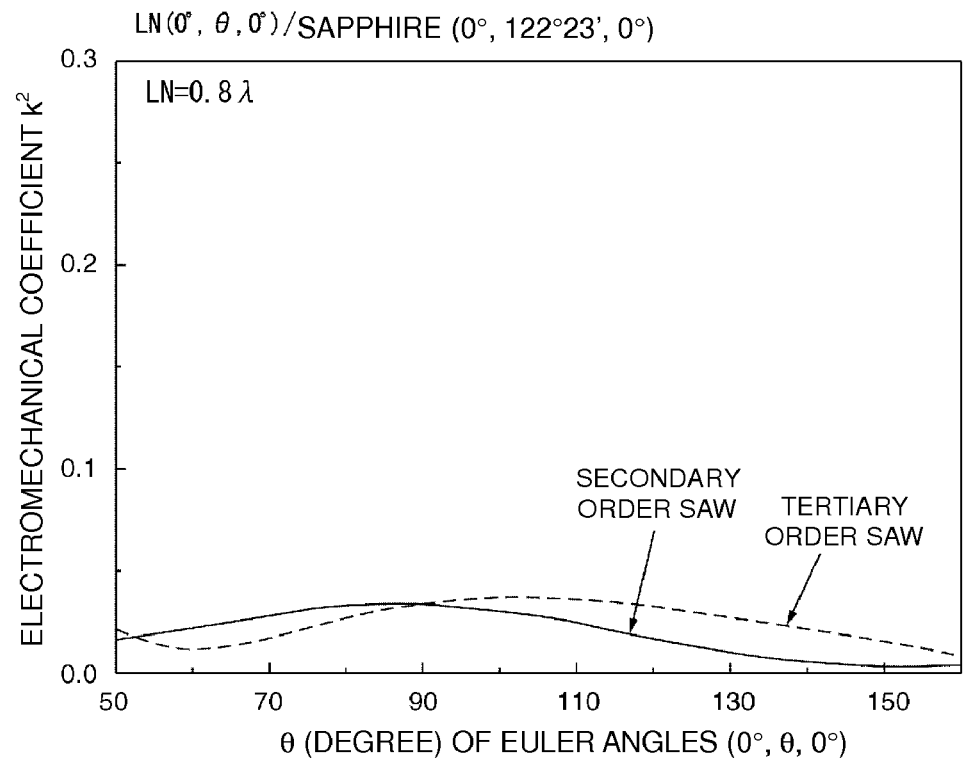
FIG. 57 is a graph depicting, in the structure in which the LiNbO$_3$ single-crystal plate having the Euler angles (0°, θ°, 0°) and the thickness of about 0.8λ is stacked on the substrate made of the R-plane sapphire having the Euler angles (0°, 122°23', 0°), the relationship between the Euler angle θ and the electromechanical coupling coefficient k$^2$.

As understood from FIGS. 16 to 27, the optimum Euler angle of the LN single-crystal plate is substantially the same regardless of the type of the high acoustic-velocity substrate. For the secondary and tertiary order modes, FIGS. 56 and 57 depict the dependency of the acoustic velocity and the electromechanical coupling coefficient $k^2$ on the Euler angle in connection with the case using an R-plane sapphire substrate as a representative example when the LN thickness is about 0.8λ. As shown in FIG. 56, in both the secondary and tertiary order modes, the acoustic velocity of about 4950 m/sec or higher is obtained when the Euler angle θ is preferably in the range of about 70° to about 160°, for example. As shown in FIG. 57, in the secondary order mode, the electromechanical coupling coefficient $k^2$ of about 0.02 or more is obtained when θ is in the range of about 50° to about 120°, the electromechanical coupling coefficient $k^2$ of about 0.025 or more is obtained in the range of about 65° to about 113°, and the electromechanical coupling coefficient $k^2$ of about 0.03 or more is obtained in the range of about 82° to about 88°, for example. On the other hand, for the surface acoustic wave in the tertiary order mode, the electromechanical coupling coefficient $k^2$ of about 0.02 or more is obtained when θ is in the range of about 50° to about 53° and of about 83° to about 140°, the electromechanical coupling coefficient $k^2$ of about 0.025 or more is obtained in the range of about 87° to about 123°, and the electromechanical coupling coefficient $k^2$ of about 0.03 or more is obtained in the range of about 93° to about 113°, for example.

Structure of SiO$_2$/LN (0°, 110°, 0°)/R-Plane Sapphire (0°, 122°23', 0°)

Figure 28:
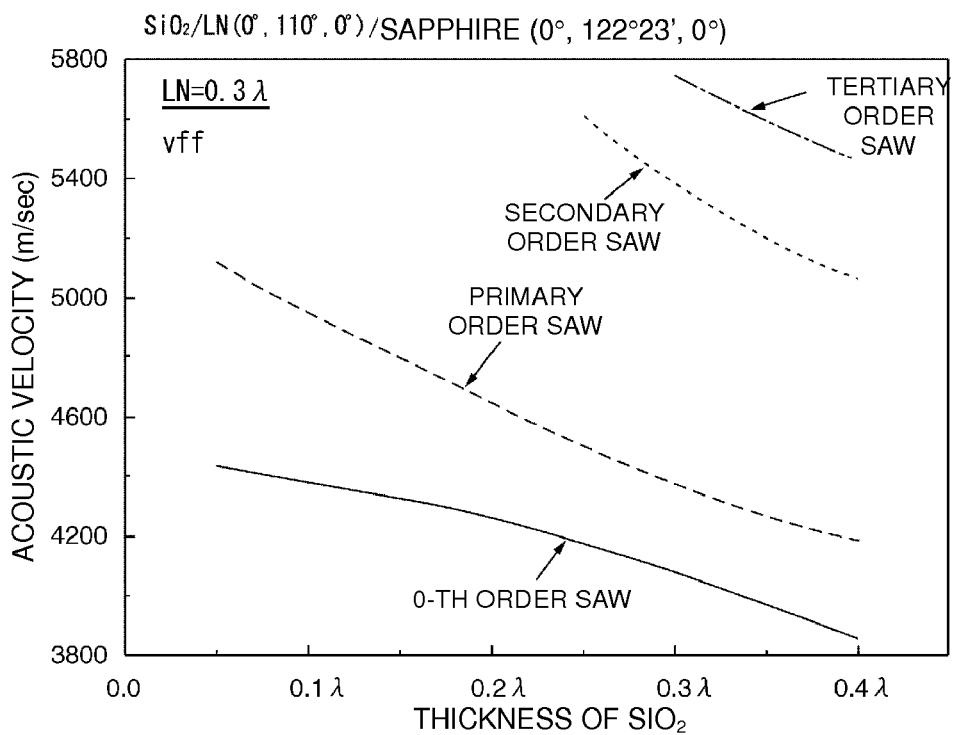
FIG. 28 is a graph depicting, in a structure of the surface acoustic wave device according to the second preferred embodiment of the present invention, illustrated in FIG. 1B, in which the LiNbO$_3$ single-crystal plate having the Euler angles (0°, 110°, 0°) and the thickness of about 0.3λ and a SiO$_2$ film are stacked on the substrate made of the R-plane sapphire having the Euler angles (0°, 122°23', 0°), the relationship between the thickness of the SiO$_2$ film and the acoustic velocity of a surface acoustic wave.
Figure 29:
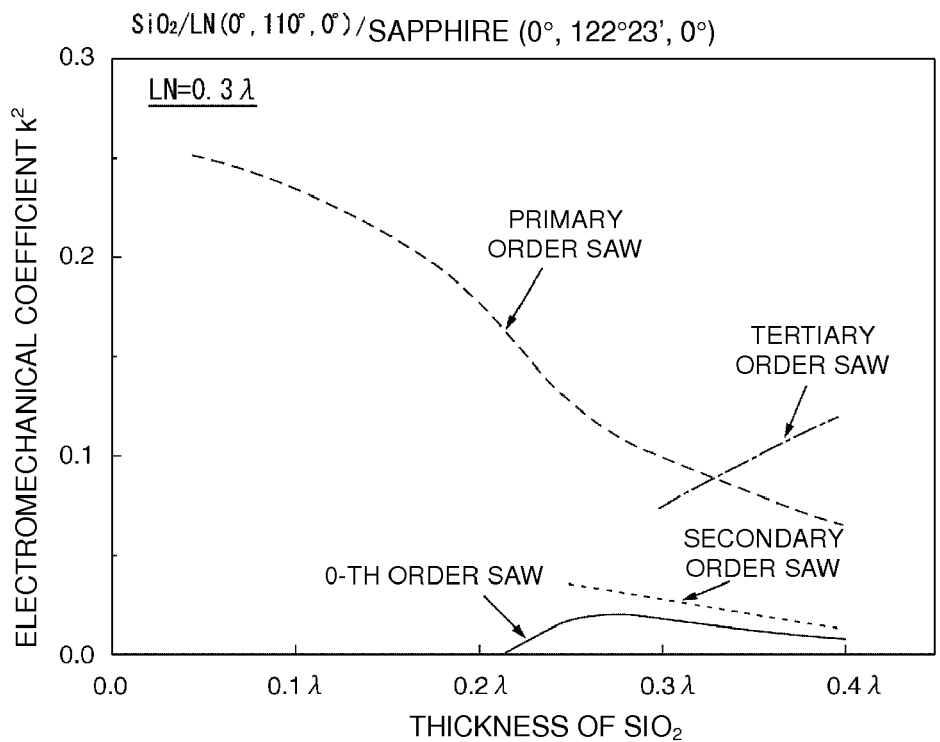
FIG. 29 is a graph depicting, in the structure of the surface acoustic wave device according to the second preferred embodiment of the present invention, illustrated in FIG. 1B, in which the LiNbO$_3$ single-crystal plate having the Euler angles (0°, 110°, 0°) and the thickness of about 0.3λ and the SiO$_2$ film are stacked on the substrate made of the R-plane sapphire having the Euler angles (0°, 122°23', 0°), the relationship between the thickness of the SiO$_2$ film and the electromechanical coupling coefficient $k^2$.

FIGS. 28 and 29 are graphs depicting, when the high acoustic-velocity substrate 2 is made of the R-plane sapphire (0°, 122°23', 0°) and the Euler angles of the LN single-crystal plate are (0°, 110°, 0°) in the surface acoustic wave device 11 according to the second preferred embodiment, which includes the SiO$_2$ film 5 as illustrated in FIG. 1B, the relationship between the thickness of the SiO$_2$ film and the acoustic velocity of a surface acoustic wave and the electromechanical coupling coefficient $k^2$, respectively. The thickness of the LN single-crystal plate 3 preferably is about 0.3λ, for example.

In the structure including the stacked SiO$_2$ film, as shown in FIGS. 28 and 29, the acoustic velocity of the surface acoustic wave in any of the primary order mode, the secondary order mode and the tertiary order mode preferably is equal to or higher than about 4250 m/sec when the thickness of the SiO$_2$ film is in the range of about 0.03λ to about 0.4λ, for example. Additionally, as is apparent from FIG. 28, the acoustic velocity of the surface acoustic wave increases as the thickness of the SiO$_2$ film decreases. Thus, the acoustic velocity of the surface acoustic wave can be increased when the thickness of the SiO$_2$ film is in the range of about 0.4λ or less, for example.

As shown in FIG. 29, the electromechanical coupling coefficient $k^2$ for the surface acoustic wave in the primary order mode is equal to or larger than about 0.1 when the thickness of the SiO$_2$ film preferably is in the range of about 0.03, to about 0.3λ, for example.

On the other hand, when the surface acoustic wave in the secondary order mode is used, it is seen that because the thickness of about 0.3λ of the LN single-crystal plate implies a film thickness at which excitation of the secondary order mode is started, the excitation occurs only when the thickness of the SiO$_2$ film is in the range of about 0.25λ to about 0.4λ and the electromechanical coupling coefficient $k^2$ is about 0.05 or more, for example.

Further, when the surface acoustic wave in the tertiary order mode is used, the tertiary order mode is excited only when the thickness of the SiO$_2$ film is in the range of about 0.3λ to about 0.4λ and a larger electromechanical coupling coefficient $k^2$ can be obtained, i.e., about 0.075 or more, than when the surface acoustic wave in the secondary order mode is used.

Temperature Coefficient of Resonance Frequency TCF and Thickness of SiO$_2$ Film in Structure of SiO$_2$/LN (0°, 110°, 0°)/Sapphire (0°, 122°23', 0°)

Figure 30:
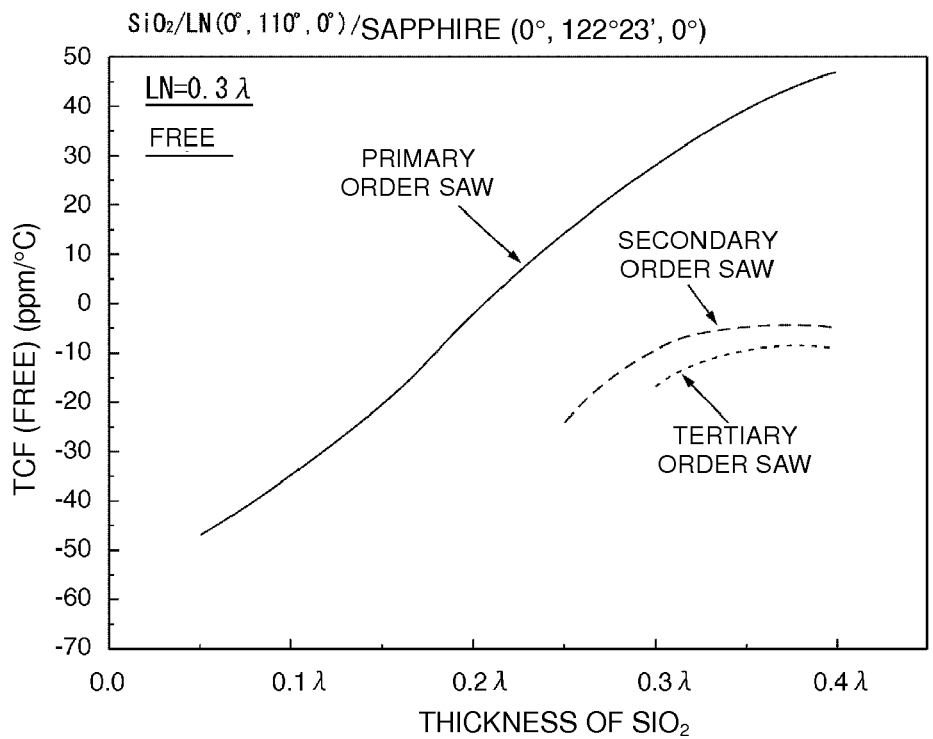
FIG. 30 is a graph depicting, in the structure of the surface acoustic wave device according to the second preferred embodiment of the present invention, illustrated in FIG. 1B, in which the LiNbO$_3$ single-crystal plate having the Euler angles (0°, 110°, 0°) and the thickness of about 0.3λ and the SiO$_2$ film are stacked on the substrate made of the R-plane sapphire having the Euler angles (0°, 122°23', 0°), the relationship between the thickness of the SiO$_2$ film and the temperature coefficient of resonance frequency TCF in a free state.
Figure 31:
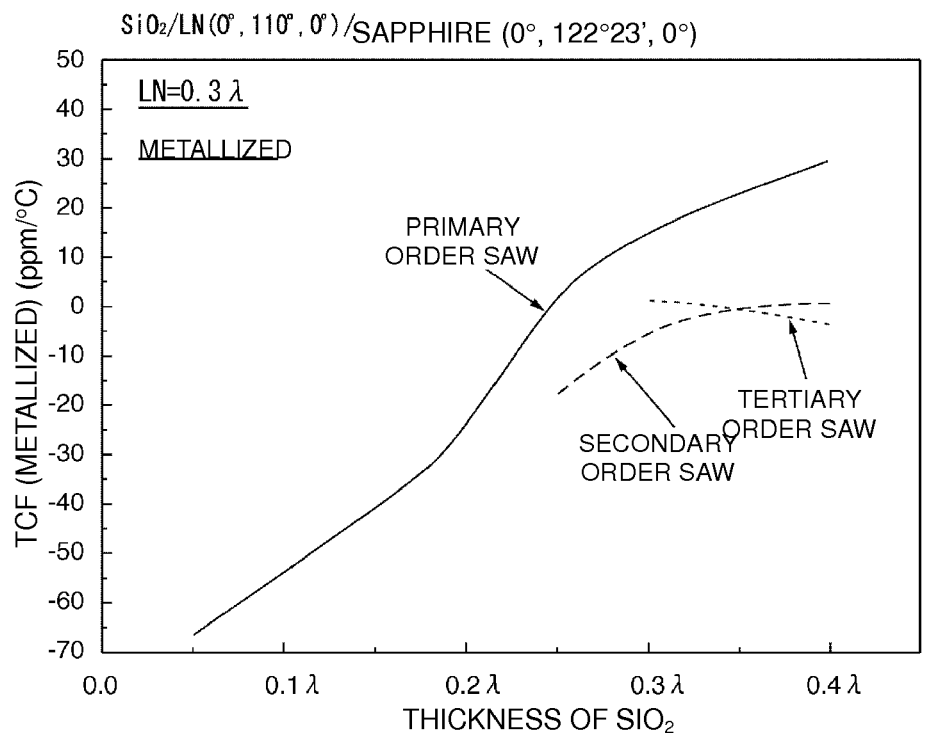
FIG. 31 is a graph depicting, in the structure of the surface acoustic wave device according to the second preferred embodiment of the present invention, illustrated in FIG. 1B, in which the LiNbO$_3$ single-crystal plate having the Euler angles (0°, 110°, 0°) and the thickness of about 0.3λ and the SiO$_2$ film are stacked on the substrate made of the R-plane sapphire having the Euler angles (0°, 122°23', 0°), the relationship between the thickness of the SiO$_2$ film and the temperature coefficient of resonance frequency TCF in a structure having a metallized surface.

FIGS. 30 and 31 are graphs depicting, in the structure of SiO$_2$/LN single-crystal plate (0°, 110°, 0°)/R-plane sapphire (0°, 122°23', 0°), the relationship between the thickness of the SiO$_2$ film and the temperature coefficient of resonance frequency TCF in a free state in which the electrode is not provided and the TCF (metallized) in a state in which the electrode is provided and the structure has a metallized surface, respectively.

As shown in FIG. 30, when the surface acoustic waves in the primary order mode, the secondary order mode, and the tertiary order mode are used, the TCF (free) increases as the thickness of the SiO$_2$ film increases. Also, as shown in FIG. 31, when the primary order mode and the secondary order mode are used, a value of the TCF (metallized) in the case including the electrode also increases as the thickness of the SiO$_2$ film increases. When the surface acoustic wave in the tertiary order mode is used, there is a tendency for the TCF (metallized) to decrease when the thickness of the SiO$_2$ film is in the range of about 0.3λ to about 0.4λ as the thickness of the SiO$_2$ film increases.

As shown in FIGS. 30 and 31, when the surface acoustic wave in the primary order mode is used, the TCF (free) and the TCF (metallized) are both obtained in the range of about −30 ppm/° C. to about +30 ppm/° C. by setting the thickness of SiO$_2$ in the range of about 0.12λ to about 0.3λ in the free state and about 0.18λ to about 0.38λ in the metallized state, respectively. Also, by setting the thickness of the SiO$_2$ film in the range of about 0.15λ to about 0.28, in the free state and about 0.21λ to about 0.33λ in the metallized state, respectively, the TCF (free) and the TCF (metallized) can both be obtained in the range of about −20 ppm/° C. to about +20 ppm/° C. Thus, an absolute value of the temperature coefficient of resonance frequency TCF can be reduced. Further, when the surface acoustic wave in the secondary order mode is used, the temperature coefficient of resonance frequency TCF (free) and the TCF (metallized) can both be obtained in the range of about −20 ppm/° C. to about +10 ppm/° C. by setting the thickness of the SiO$_2$ film in the range of about 0.25λ to about 0.4λ, for example.

Similarly, when the surface acoustic wave in the tertiary order mode is used, the temperature coefficient of resonance frequency TCF (free) and the TCF (metallized) can be obtained respectively in the range of about −18 ppm/° C. to about −8 ppm/° C. and about −5 ppm/° C. to about +5 ppm/° C. by setting the thickness of the SiO$_2$ film in the range of about 0.3λ to about 0.4λ, for example.

Thus, it is understood that an absolute value of the temperature coefficient of resonance frequency TCF can be reduced by setting the thickness of the SiO$_2$ film to any of the above-mentioned ranges.

Additionally, the acoustic velocity in the free state corresponds to an anti-resonant frequency of a surface acoustic wave resonator, and the acoustic velocity in the metallized state corresponds to a resonant frequency.

LN (0°, 110°, 0°)/SiO$_2$/Sapphire (0°, 122°23', 0°)

Figure 32:
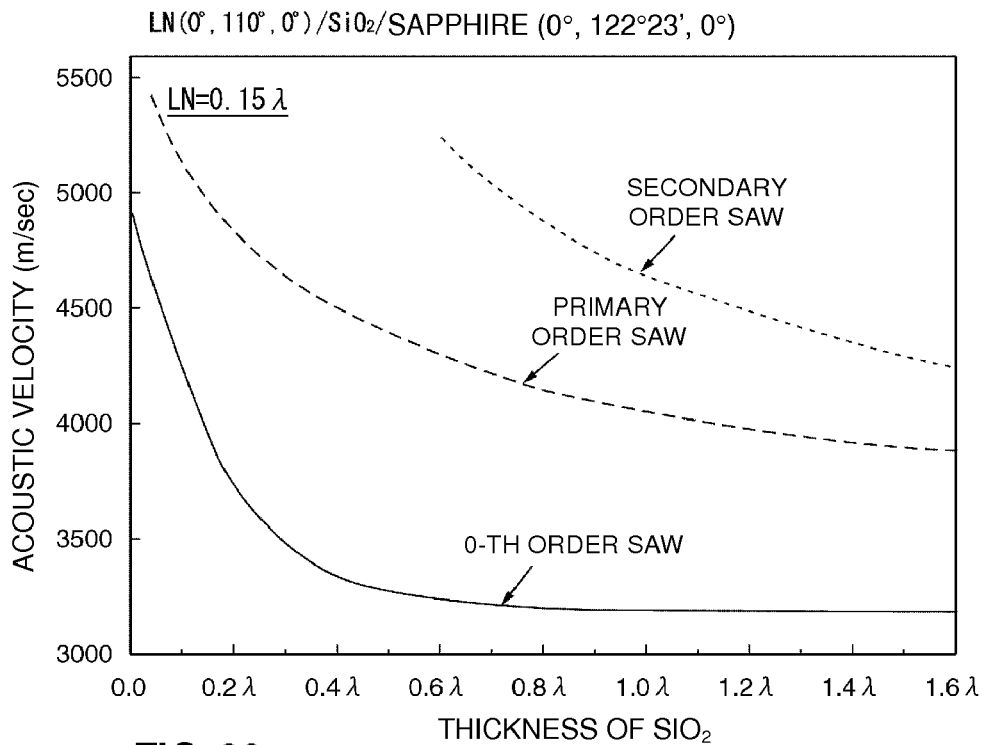
FIG. 32 is a graph depicting, in a structure of the surface acoustic wave device according to the third preferred embodiment of the present invention, illustrated in FIG. 1C, in which a SiO$_2$ film and a LiNbO$_3$ single-crystal plate having the Euler angles (0°, 110°, 0°) and a thickness of about 0.15λ are stacked on the substrate made of the R-plane sapphire having the Euler angles (0°, 122°23', 0°), the relationship between the thickness of the SiO$_2$ film and the acoustic velocity of a surface acoustic wave.

FIG. 32 is a graph depicting, in the surface acoustic wave device 21 illustrated in FIG. 1C, the relationship between the thickness of the SiO$_2$ film 5A and the acoustic velocity of a surface acoustic wave. It is assumed that the thickness of the LN single-crystal plate 3 is about 0.15λ and the high acoustic-velocity substrate 2 is made of the R-plane sapphire (0°, 122°23', 0°).

As shown in FIG. 32, the acoustic velocity of the surface acoustic wave in the primary order mode is equal to or higher than about 3900 m/sec when the thickness of the $SiO_2$ film is in the range of about 1.6λ or less, for example. Also, the acoustic velocity of the surface acoustic wave in the secondary order mode is equal to or higher than about 4250 m/sec over the entire range of about 1.6λ or less.

Thus, it is understood that, in the relevant structure, the acoustic velocity of the surface acoustic wave can be effectively increased even when the $SiO_2$ film is stacked.

Figure 33:
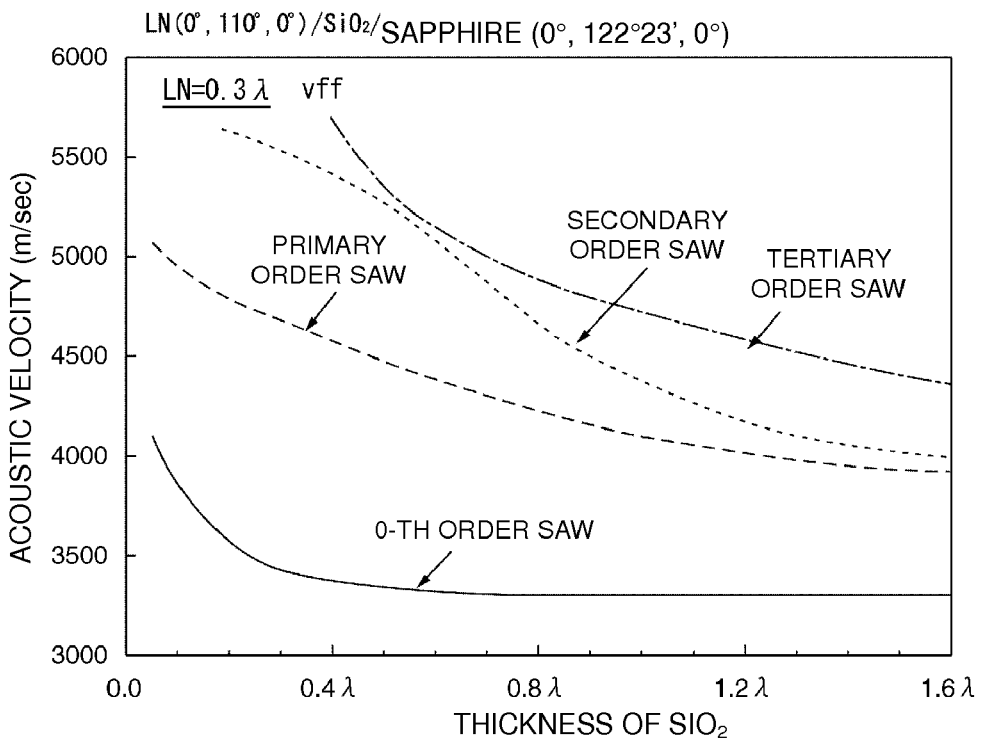
FIG. 33 is a graph depicting, in a structure of the surface acoustic wave device according to the third preferred embodiment of the present invention, illustrated in FIG. 1C, in which a SiO$_2$ film and a LiNbO$_3$ single-crystal plate having the Euler angles (0°, 110°, 0°) and a thickness of about 0.3λ are stacked on the R-plane sapphire having the Euler angles (0°, 122°23', 0°), the relationship between the thickness of the SiO$_2$ film and the acoustic velocity of a surface acoustic wave.

FIG. 33 is a graph depicting the relationship between the thickness of the $SiO_2$ film and the acoustic velocity of a surface acoustic wave in a structure similar to that illustrated in FIG. 32 except that the thickness of the LN single-crystal plate 3 is set to about 0.3λ. As shown in FIG. 33, even when the thickness of the LN single-crystal plate 3 is increased to about 0.3λ, the acoustic velocity of the surface acoustic wave in the primary order mode is equal to or higher than about 3950 m/sec when the thickness of the $SiO_2$ film is in the range of about 1.6λ or less, for example. Also, a higher acoustic velocity can be obtained with the surface acoustic waves in the secondary order mode and the tertiary order mode when the thickness of the $SiO_2$ film is in the range of about 1.6λ or less.

Figure 34:
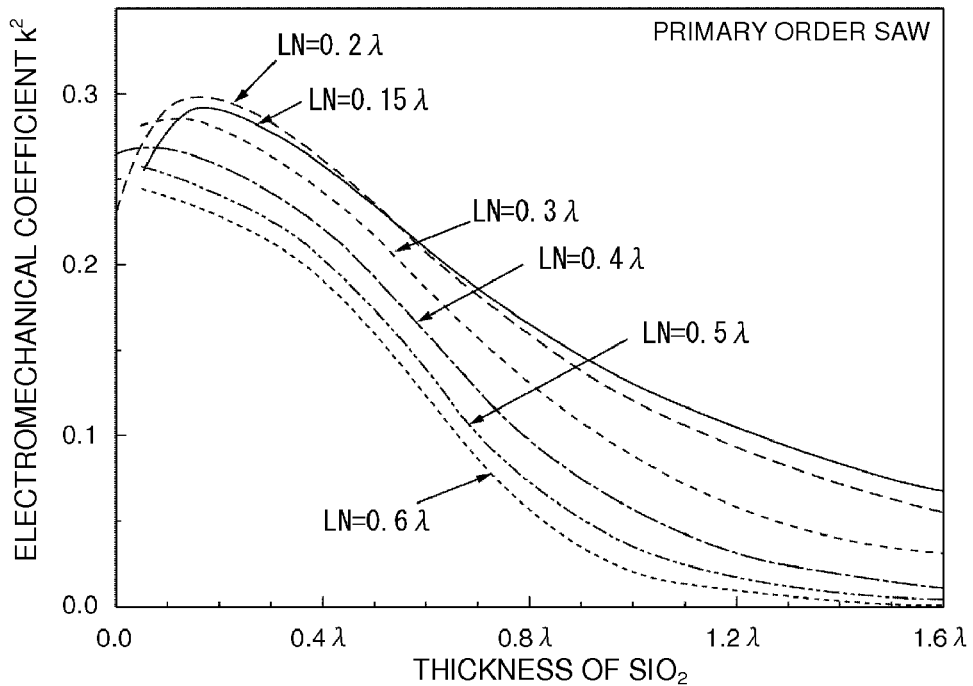
FIG. 34 is a graph depicting, in structures of the surface acoustic wave device according to the third preferred embodiment of the present invention, illustrated in FIG. 1C, in which a SiO$_2$ film and LiNbO$_3$ single-crystal plates having the Euler angles (0°, 110°, 0°) and various thicknesses are stacked on the substrate made of the R-plane sapphire having the Euler angles (0°, 122°23', 0°), the relationship among the thickness of each of the LiNbO$_3$ single-crystal plates, the thickness of the SiO$_2$ film, and the electromechanical coupling coefficient $k^2$ for a surface acoustic wave in the primary order mode.
Figure 35:
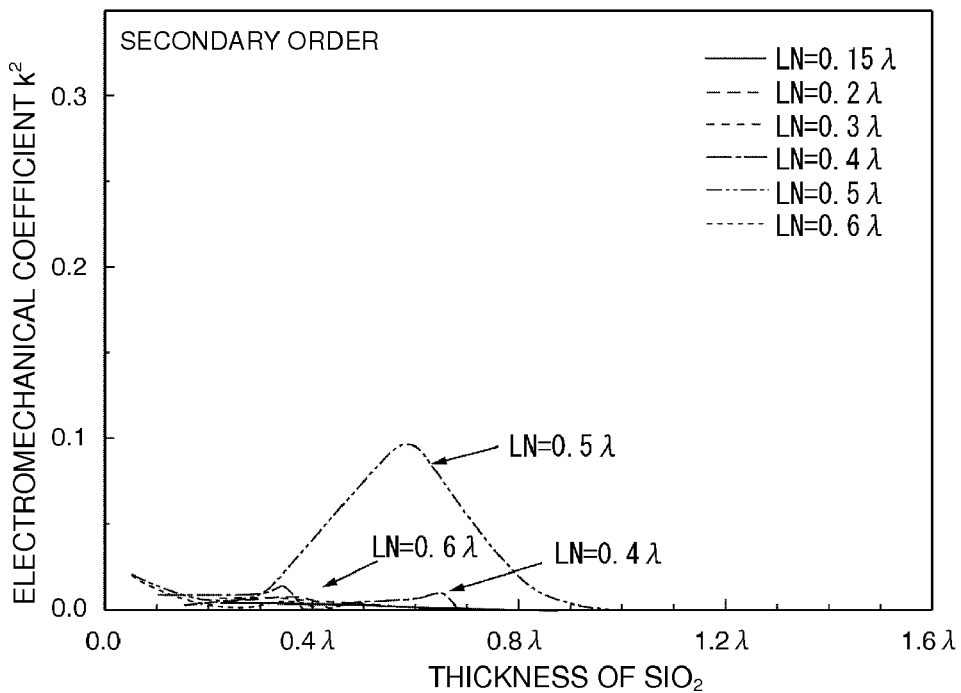
FIG. 35 is a graph depicting, in structures of the surface acoustic wave device according to the third preferred embodiment of the present invention, illustrated in FIG. 1C, in which a SiO$_2$ film and LiNbO$_3$ single-crystal plates having the Euler angles (0°, 110°, 0°) and thicknesses of about 0.15λ to about 0.6λ are stacked on the substrate made of the R-plane sapphire having the Euler angles (0°, 122°23', 0°), the relationship between the thickness of the SiO$_2$ film and the electromechanical coupling coefficient $k^2$ for a surface acoustic wave in the secondary order mode.
Figure 36:
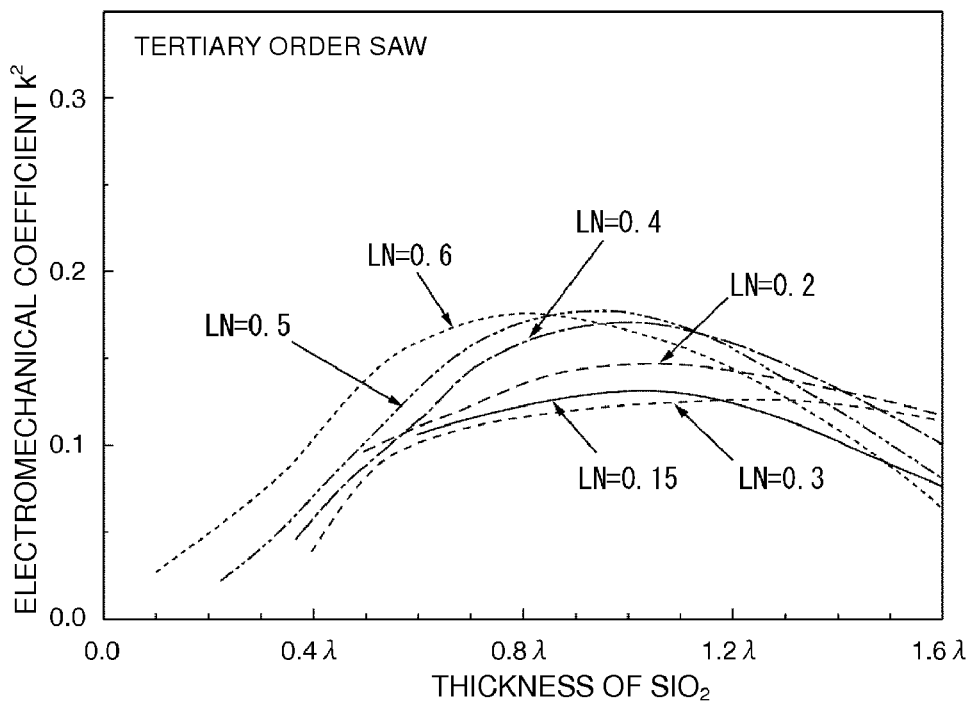
FIG. 36 is a graph depicting, in structures of the surface acoustic wave device according to the third preferred embodiment of the present invention, illustrated in FIG. 1C, in which a SiO$_2$ film and LiNbO$_3$ single-crystal plates having the Euler angles (0°, 110°, 0°) and various thicknesses are stacked on the substrate made of the R-plane sapphire having the Euler angles (0°, 122°23', 0°), the relationship among the thickness of each of the LiNbO$_3$ single-crystal plates, the thickness of the SiO$_2$ film, and the electromechanical coupling coefficient $k^2$ for a surface acoustic wave in the tertiary order mode.

On the other hand, FIGS. 34 to 36 are graphs depicting, in the relevant structure, the relationship among the thickness of the LN single-crystal plate 3, the thickness of the $SiO_2$ film, and the electromechanical coupling coefficient $k^2$. More specifically, FIG. 34 depicts the result obtained for the surface acoustic wave in the primary order mode, FIG. 35 depicts the result obtained for the surface acoustic wave in the secondary order mode, and FIG. 36 depicts the result obtained for the surface acoustic wave in the tertiary order mode.

As shown in FIG. 34, when the thickness of the $SiO_2$ film is greater than about 0.15λ, the electromechanical coupling coefficient $k^2$ decreases as the thickness of the $SiO_2$ film increases. Further, the electromechanical coupling coefficient $k^2$ can be obtained as large as about 0.1 or more by setting the thickness of the $SiO_2$ film to about 0.65λ or less.

Further, when the thickness of the LN single-crystal plate 3 is about 0.2λ or less, the electromechanical coupling coefficient $k^2$ of about 0.07 or more can be obtained by setting the thickness of the $SiO_2$ film to about 1.4λ or less, for example. More preferably, the electromechanical coupling coefficient $k^2$ can be increased to about 0.08 or more by setting the thickness of the $SiO_2$ film in the range of about 0.05λ to about 1.4λ, for example. Even more preferably, the electromechanical coupling coefficient $k^2$ can be increased to about 0.13 or more by setting the thickness of the $SiO_2$ film in the range of about 0.25λ to about 1.0λ, for example.

When using the surface acoustic wave in the secondary order mode, as shown in FIG. 35, when the thickness of the LN single-crystal plate 3 is set to about 0.5λ, the electromechanical coupling coefficient $k^2$ can be obtained as large as about 0.025 or more when the thickness of the $SiO_2$ film is in the range of about 0.35λ to about 0.8λ, for example.

When using the surface acoustic wave in the tertiary order mode, as shown in FIG. 36, when the thickness of the LN single-crystal plate 3 is any of about 0.15λ, about 0.2λ, about 0.3λ, about 0.4λ, about 0.5λ and about 0.6λ, the electromechanical coupling coefficient $k^2$ can be obtained as large as about 0.02 or more by setting the thickness of the $SiO_2$ film in the range of about 0.1λ to about 1.6λ, for example. Also, the electromechanical coupling coefficient $k^2$ of about 0.05 or more can be obtained by setting the thickness of the $SiO_2$ film in the range of about 0.2λ to about 1.6λ, for example.

Thus, it is understood that, when using the surface acoustic wave in the tertiary order mode in the relevant structure, when the thickness of the LN single-crystal plate 3 is in the range of about 0.15λ to about 0.6λ, the acoustic velocity of the surface acoustic wave and the electromechanical coupling coefficient $k^2$ can both be increased by setting the thickness of the $SiO_2$ film in the range of about 0.1λ to about 1.6λ, for example.

Figure 37:
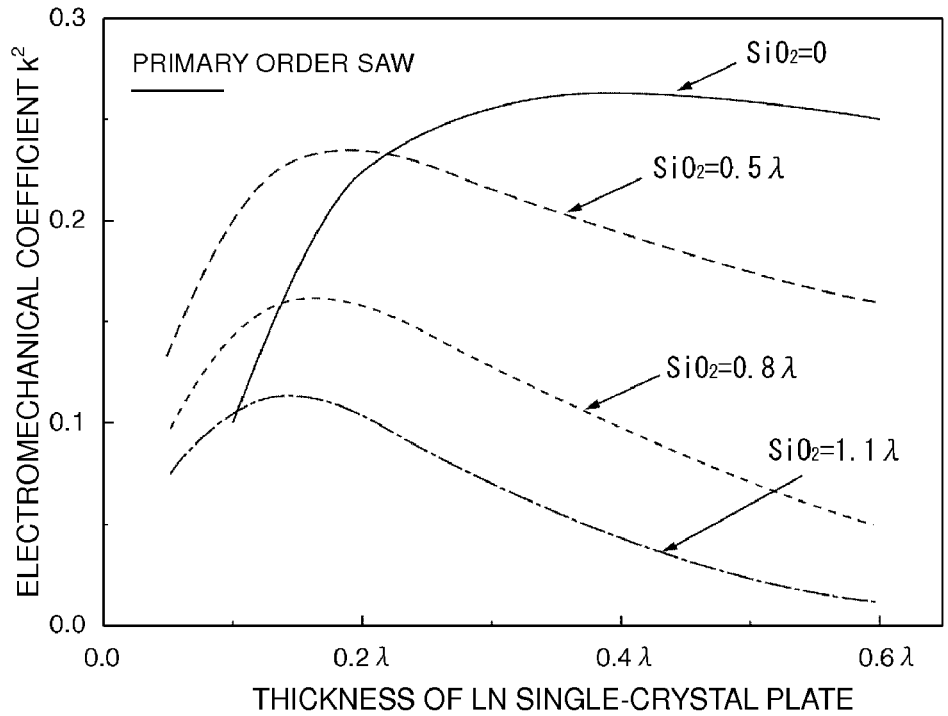
FIG. 37 is a graph depicting, in the structure of the surface acoustic wave device according to the third preferred embodiment of the present invention, illustrated in FIG. 1C, in which the SiO$_2$ film and the LiNbO$_3$ single-crystal plate having the Euler angles (0°, 110°, 0°) are stacked on the substrate made of the R-plane sapphire having the Euler angles (0°, 122°23', 0°), the relationship between the thickness of the LiNbO$_3$ single-crystal plate and the electromechanical coupling coefficient $k^2$ for a surface acoustic wave in the primary order mode, when the thickness of the SiO$_2$ film is set to about 0.5λ, about 0.8λ or about 1.1λ and when the SiO$_2$ film is not provided.
Figure 38:
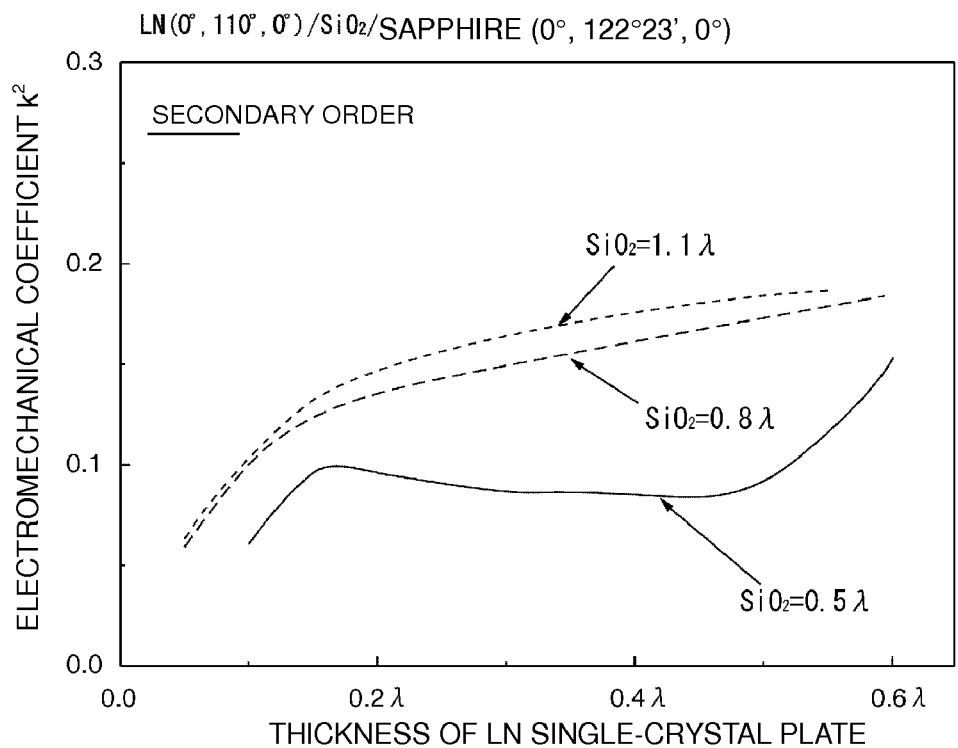
FIG. 38 is a graph depicting, in the structure of the surface acoustic wave device according to the third preferred embodiment of the present invention, illustrated in FIG. 1C, in which the SiO$_2$ film and the LiNbO$_3$ single-crystal plate having the Euler angles (0°, 110°, 0°) are stacked on the substrate made of the R-plane sapphire having the Euler angles (0°, 122°23', 0°), the relationship between the thickness of the LiNbO$_3$ single-crystal plate and the electromechanical coupling coefficient $k^2$ for a surface acoustic wave in the secondary order mode, when the thickness of the SiO$_2$ film is set to about 0.5λ, about 0.8λ or about 1.1λ.

FIGS. 37 and 38 are graphs depicting, when the thickness of the $SiO_2$ film is set to about 0.5λ, about 0.8λ or about 1.1λ in the relevant structure, the relationship between the thickness of the LN single-crystal plate and the electromechanical coupling coefficient $k^2$ for the surface acoustic wave in the primary order mode and the secondary order mode, respectively.

As shown in FIG. 37, when the thickness of the $SiO_2$ film is any of about 0.5λ, about 0.8λ and about 1.1λ, the electromechanical coupling coefficient $k^2$ of about 0.02 or more can be obtained when the thickness of the LN single-crystal plate 3 is in the range of about 0.04λ to about 0.6λ, for example. Also, the electromechanical coupling coefficient $k^2$ of about 0.06 or more can be obtained by setting the thickness of the $SiO_2$ film to about 0.8λ or less, for example.

FIG. 38 is a graph depicting, when the thickness of the $SiO_2$ film is set to about 0.5λ, about 0.8λ or about 1.1λ, the relationship between the thickness of the LN single-crystal plate and the electromechanical coupling coefficient $k^2$ for the surface acoustic wave in the secondary order mode. As shown in FIG. 38, when the thickness of the $SiO_2$ film is any of about 0.5λ, about 0.8λ and about 1.1λ, the electromechanical coupling coefficient can be obtained as a large value when the thickness of the LN single-crystal plate 3 is in the range of about 0.04λ to about 0.6λ, for example. In particular, when the thickness of the $SiO_2$ film is about 0.8λ and about 1.1λ, the electromechanical coupling coefficient $k^2$ can be increased to about 0.1 or more by setting the thickness of the LN single-crystal plate in the range of about 0.1λ to about 0.6λ, for example.

Figure 39:
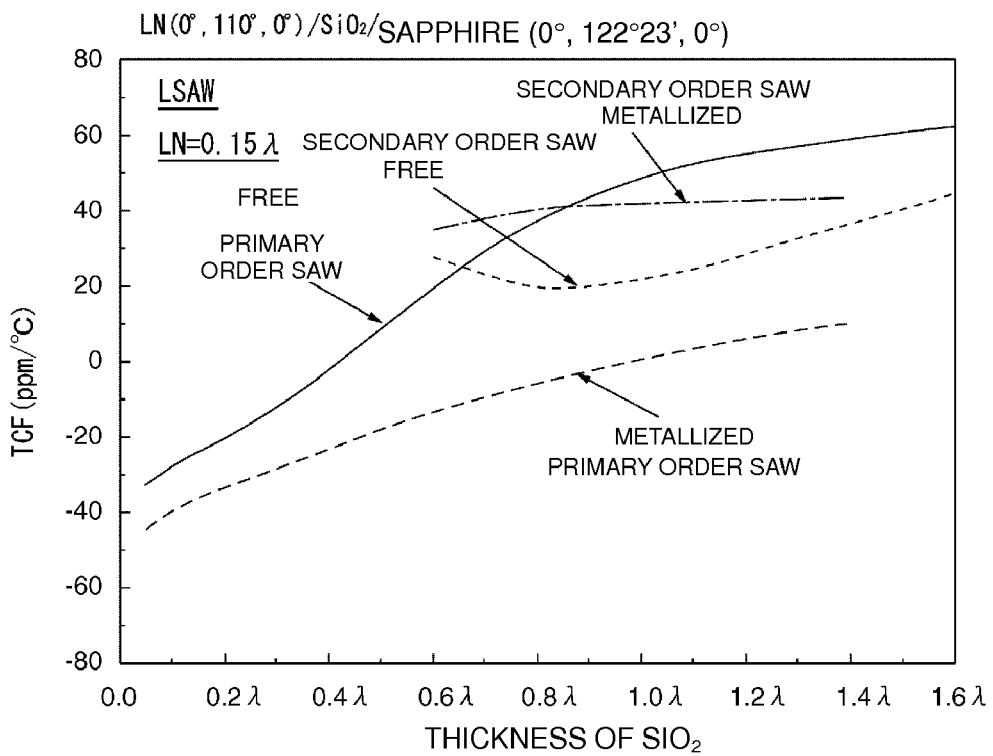
FIG. 39 is a graph depicting, in the structure in which the SiO$_2$ film and the LiNbO$_3$ single-crystal plate having the Euler angles (0°, 110°, 0°) are stacked on the substrate made of the R-plane sapphire having the Euler angles (0°, 122°23', 0°), the relationship between the thickness of the SiO$_2$ film and the temperature coefficient of resonance frequency TCF, when the thickness of the LiNbO$_3$ single-crystal plate is set to about 0.15λ and when a surface acoustic wave in the primary order mode or the secondary order mode is utilized.

FIG. 39 is a graph depicting, when the thickness of the LN single-crystal plate is set to about 0.15λ and the surface acoustic waves in the primary order mode and the secondary order mode are used in the structure of LN (0°, 110°, 0°)/$SiO_2$/R-plane Sapphire (0°, 122°23', 0°), the relationship between the thickness of the $SiO_2$ film and the temperature coefficient of resonance frequency TCF.

As shown in FIG. 39, when the surface acoustic wave in the primary order mode is used, the TCF (free) can be obtained in the range of about −30 ppm/° C. to about +30 ppm/° C. by setting the thickness of the $SiO_2$ film in the range of about 0.07λ to about 0.72λ, and the TCF (metallized) can be obtained in the range of about −30 ppm/° C. to about +30 ppm/° C. by setting the thickness of the $SiO_2$ film in the range of about 0.25λ to about 1.4λ, for example.

Similarly, when the surface acoustic wave in the secondary order mode is used, the TCF (free) and the TCF (metallized) can be obtained respectively in the range of about +20 ppm/° C. to about +33 ppm/° C. and about +33 ppm/° C. to about +43 ppm/° C. by setting the thickness of the $SiO_2$ film in the range of about 0.6λ to about 1.4λ, for example.

Figure 40:
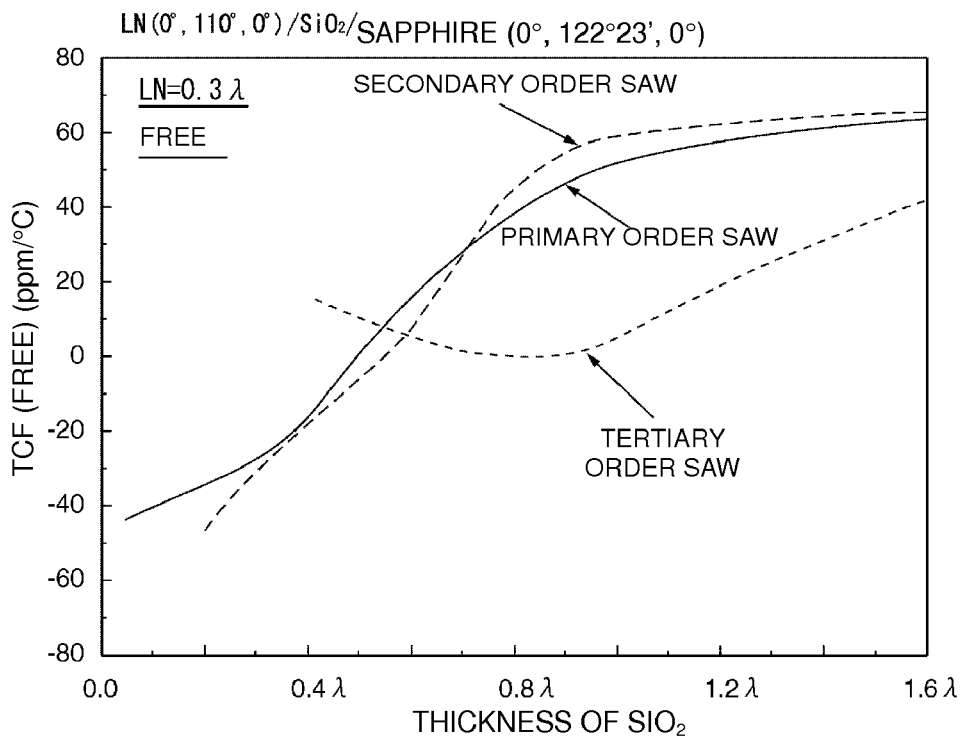
FIG. 40 is a graph depicting, in the structure in which the SiO$_2$ film and the LiNbO$_3$ single-crystal plate having the Euler angles (0°, 110°, 0°) are stacked on the substrate made of the R-plane sapphire having the Euler angles (0°, 122°23', 0°), the relationship between the thickness of the $SiO_2$ film and the temperature coefficient of resonance frequency TCF (free) of a surface acoustic wave in the primary order mode, the secondary order mode or the tertiary order mode, when the thickness of the $LiNbO_3$ single-crystal plate is set to about 0.3λ.
Figure 41:
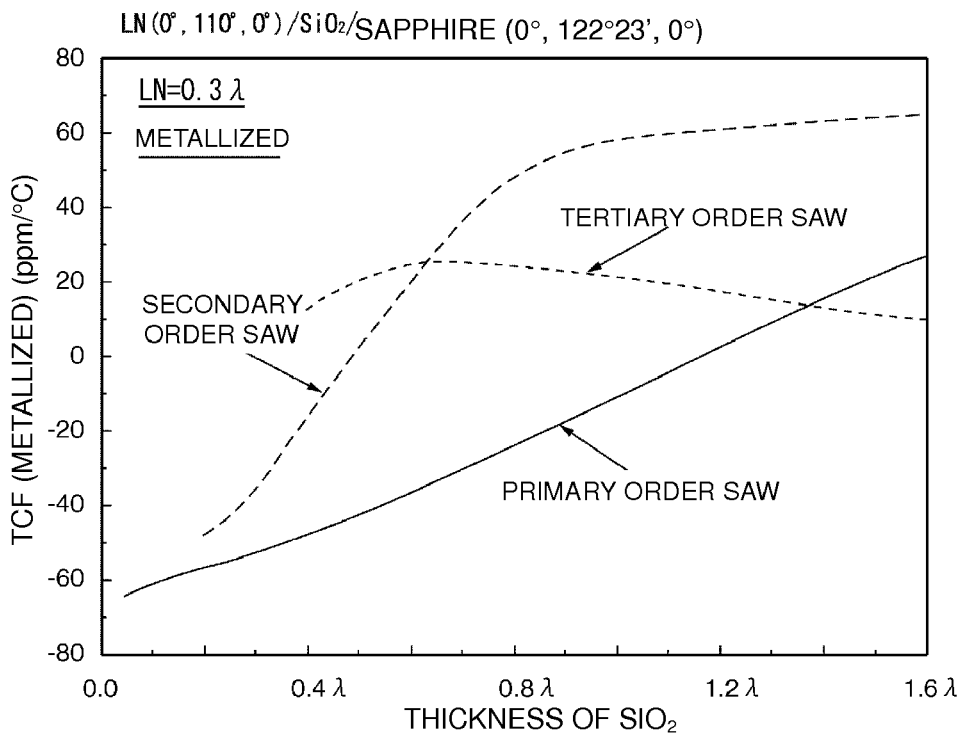
FIG. 41 is a graph depicting, in the structure in which the $SiO_2$ film and the $LiNbO_3$ single-crystal plate having the Euler angles (0°, 110°, 0°) are stacked on the substrate made of the R-plane sapphire having the Euler angles (0°, 122°23', 0°), the relationship between the thickness of the $SiO_2$ film and the temperature coefficient of resonance frequency TCF (metallized) of a surface acoustic wave in the primary order mode, the secondary order mode or the tertiary order mode, when the thickness of the $LiNbO_3$ single-crystal plate is set to about 0.3λ.

On the other hand, FIG. 40 is graph depicting, when the thickness of the LN single-crystal plate 3 is set to about 0.3λ in the structure of LN (0°, 110°, 0°)/$SiO_2$/R-plane Sapphire (0°, 122°23', 0°), the relationship between the thickness of the $SiO_2$ film and the TCF (free) for the surface acoustic waves in the primary order mode, the secondary order mode and the tertiary order mode. FIG. 41 depicts the relationship between the thickness of the $SiO_2$ film and the TCF (metallized).

As shown in FIGS. 40 and 41, when the surface acoustic wave in the primary order mode is used, the TCF (free) can be preferably maintained in the range of about −30 ppm/° C. to about +30 ppm/° C. by setting the thickness of the $SiO_2$ film in the range of about 0.27λ to about 0.7λ, for example. More preferably, the TCF (metallized) can be obtained in the range of about +30 ppm/° C. to about −30 ppm/° C. by setting the thickness of the SiO₂ film in the range of about 0.67λ to about 1.6λ, for example. Further, by setting the thickness of the SiO₂ film in the range of about 0.37λ to about 0.65λ and about 0.85λ to about 1.47λ, respectively, the TCF (free) and the TCF (metallized) can both be obtained in the range of about −20 ppm/° C. to about +20 ppm/° C.

Similarly, when the surface acoustic wave in the secondary order mode is used, the TCF (free) can be obtained in the range of about −30 ppm/° C. to about +30 ppm/° C. and the TCF (metallized) can be obtained in the range of about −33 ppm/° C. to about +33 ppm/° C. preferably by setting the thickness of the SiO₂ film in the range of about 0.3λ to about 0.7λ, for example. More preferably, the TCF (free) can be obtained in the range of about −20 ppm/° C. to about +7 ppm/° C. and the TCF (metallized) can be obtained in the range of −20 ppm/° C. to +20 ppm/° C. by setting the thickness of the SiO₂ film in the range of about 0.38λ to about 0.6λ, for example.

Similarly, when the surface acoustic wave in the tertiary order mode is used, the TCF (free) can be obtained in the range of about +30 ppm/° C. to about 0 ppm/° C. and the TCF (metallized) can be obtained in the range of about +12 ppm/° C. to about +25 ppm/° C. preferably by setting the thickness of the SiO₂ film in the range of about 0.4λ to about 1.35λ, for example. More preferably, the TCF (free) can be obtained in the range of about +20 ppm/° C. to about 0 ppm/° C. by setting the thickness of SiO₂ in the range of about 0.4λ to about 1.17λ, for example.

Structure where High Acoustic-Velocity Substrate is Si Substrate Having Euler Angles (90°, 90°, 45°)

Figure 42:
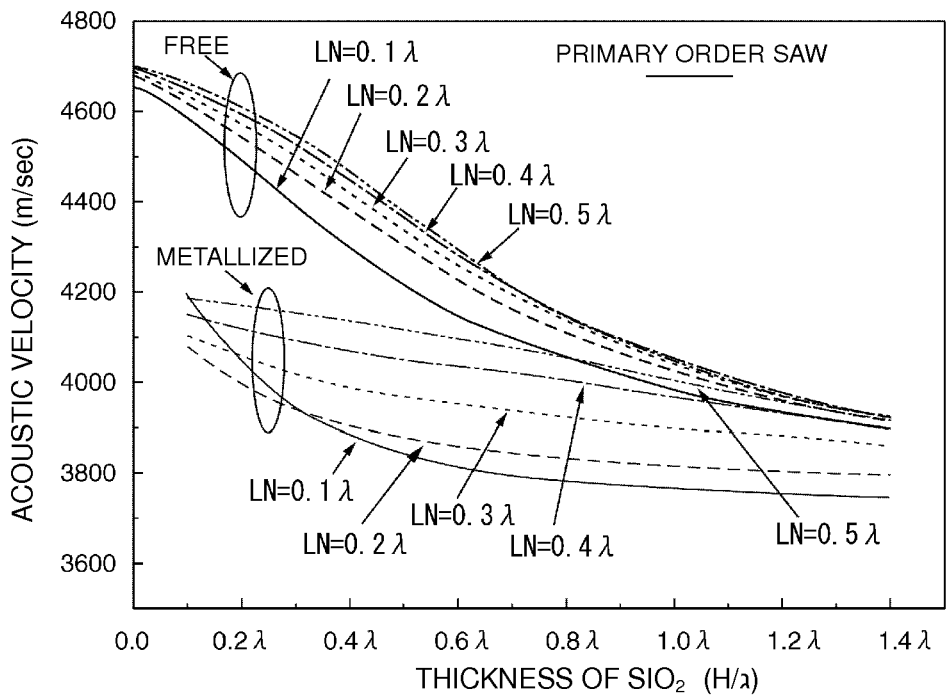
FIG. 42 is a graph depicting, in a structure of the surface acoustic wave device according to the third preferred embodiment of the present invention, illustrated in FIG. 1C, in which the $SiO_2$ film and the $LiNbO_3$ single-crystal plate having the Euler angles (0°, 110°, 0°) are stacked on a Si substrate made of Si (90°, 90°, 45°), the relationship among the thickness of the $LiNbO_3$ single-crystal plate, the thickness of the $SiO_2$ film, and the acoustic velocity of a surface acoustic wave in the primary order mode.

FIG. 42 is a graph depicting, in a structure of the surface acoustic wave device 21 according to the third preferred embodiment, illustrated in FIG. 1C, where the high acoustic-velocity substrate 2 is made of Si (90°, 90°, 45°) and the Euler angles of the LN single-crystal plate are (0°, 110°, 0°), the relationship between the thickness of the SiO₂ film and the acoustic velocity of a surface acoustic wave in the primary order mode in the free structure and the metallized structure when the thickness of the LN single-crystal plate is set to about 0.1λ, about 0.2λ, about 0.3λ, about 0.4λ or about 0.5λ.

When the thickness of the LN single-crystal plate is any of about 0.1λ, about 0.2λ, about 0.3λ, about 0.4λ and about 0.5λ, as shown in FIG. 42, the acoustic velocity of the surface acoustic wave (free) can be equal to or higher than about 3900 m/sec by setting the thickness of the SiO₂ film in the range of about 0.05λ to about 1.4λ, for example.

Figure 43:
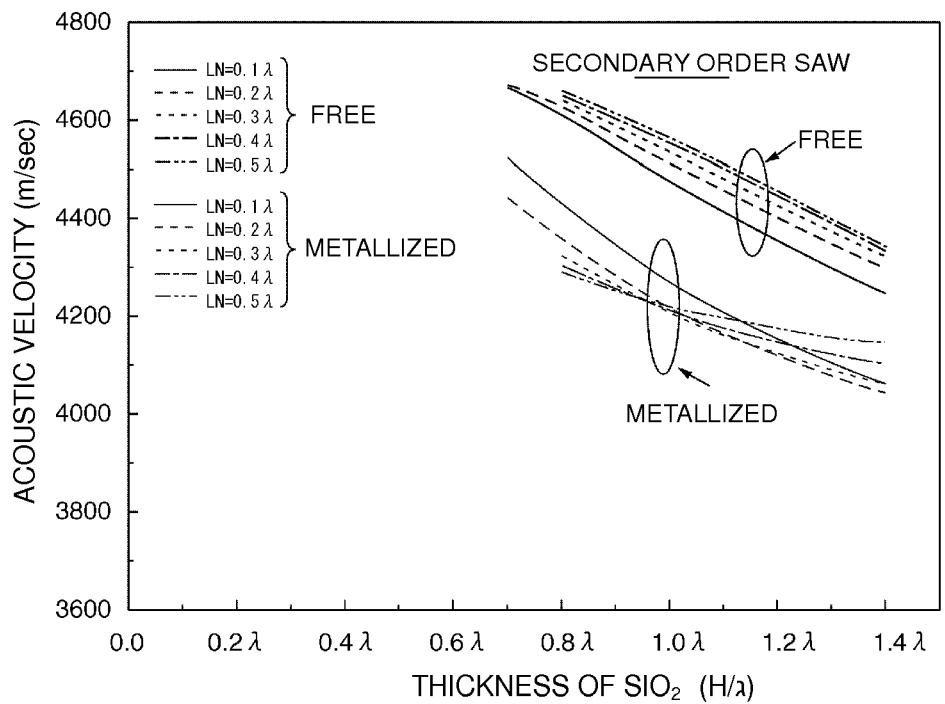
FIG. 43 is a graph depicting, in the structure of the surface acoustic wave device according to the third preferred embodiment of the present invention, illustrated in FIG. 1C, in which the $SiO_2$ film and the $LiNbO_3$ single-crystal plate having the Euler angles (0°, 110°, 0°) are stacked on the Si substrate made of Si (90°, 90°, 45°), the relationship among the thickness of the $LiNbO_3$ single-crystal plate, the thickness of the $SiO_2$ film, and the acoustic velocity of a surface acoustic wave in the secondary order mode.

FIG. 43 is a graph depicting, in the structure of the surface acoustic wave device 21 according to the third preferred embodiment, illustrated in FIG. 1C, where the high acoustic-velocity substrate 2 is made of Si (90°, 90°, 45°) and the Euler angles of the LN single-crystal plate are (0°, 110°, 0°), the relationship between the thickness of the SiO₂ film and the acoustic velocity of a surface acoustic wave in the secondary order mode in the free structure and the metallized structure when the thickness of the LN single-crystal plate is set to about 0.1λ, about 0.2λ, about 0.3λ, about 0.4λ or about 0.5λ, for example.

When the thickness of the LN single-crystal plate is any of about 0.1λ, about 0.2λ, about 0.3λ, about 0.4λ and about 0.5λ, as shown in FIG. 43, the acoustic velocity of the surface acoustic wave (free) can be equal to or higher than about 4230 m/sec by setting the thickness of the SiO₂ film in the range of about 0.7λ to about 1.4λ, for example.

Figure 44:
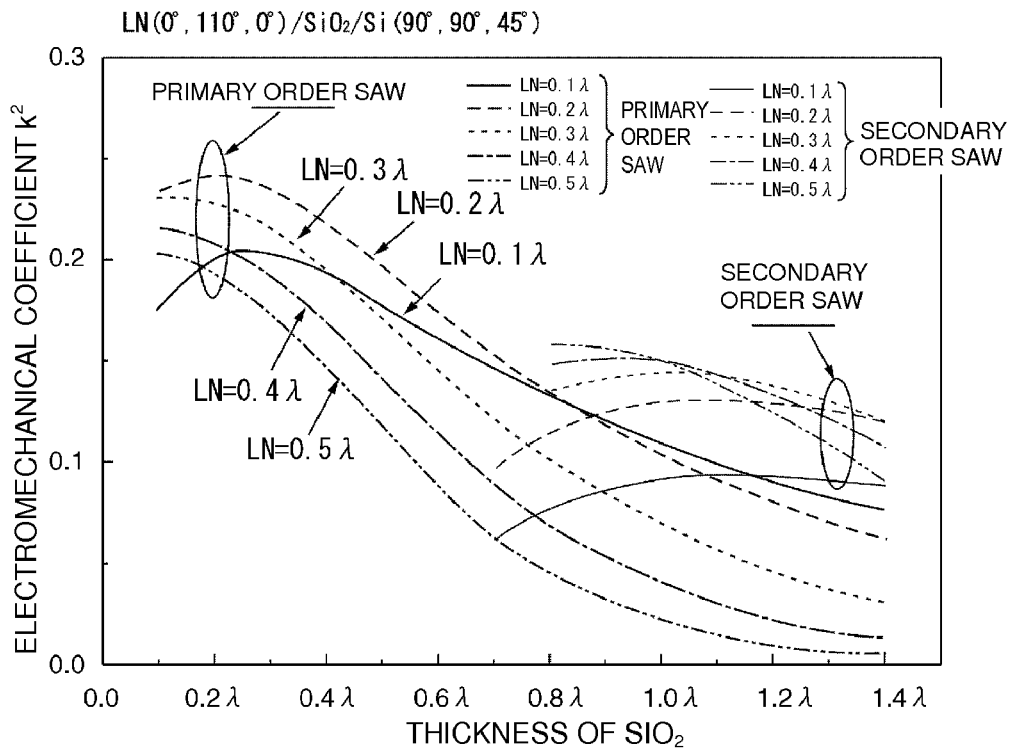
FIG. 44 is a graph depicting, in the structure of the surface acoustic wave device according to the third preferred embodiment of the present invention, illustrated in FIG. 1C, in which the $SiO_2$ film and the $LiNbO_3$ single-crystal plate having the Euler angles (0°, 110°, 0°) are stacked on the Si substrate made of Si (90°, 90°, 45°), the relationship among the thickness of the $LiNbO_3$ single-crystal plate, the thickness of the $SiO_2$ film, and the electromechanical coupling coefficients $k^2$ in the primary order mode and the secondary order mode.

FIG. 44 is a graph depicting, when the surface acoustic wave in the primary order mode and the surface acoustic wave in the secondary order mode are used in the relevant structure, the relationship between the thickness of the SiO₂ film and the electromechanical coupling coefficient $k^2$.

As shown in FIG. 44, when the surface acoustic wave in the primary order mode is used, the electromechanical coupling coefficient of about 0.02 or more can be obtained by setting the thickness of the SiO₂ film in the range of about 0.05λ to about 1.1λ when the thickness of the LN single-crystal plate is about 0.1λ, about 0.2λ, about 0.3λ, about 0.4λ, or about 0.5λ, for example. When the surface acoustic wave in the secondary order mode is used, the electromechanical coupling coefficient of about 0.06 or more can be obtained by setting the thickness of the SiO₂ film in the range of about 0.7λ to about 1.4λ when the thickness of the LN single-crystal plate is about 0.1λ, about 0.2λ, about 0.3λ, about 0.4λ, or about 0.5λ, for example.

Figure 45:
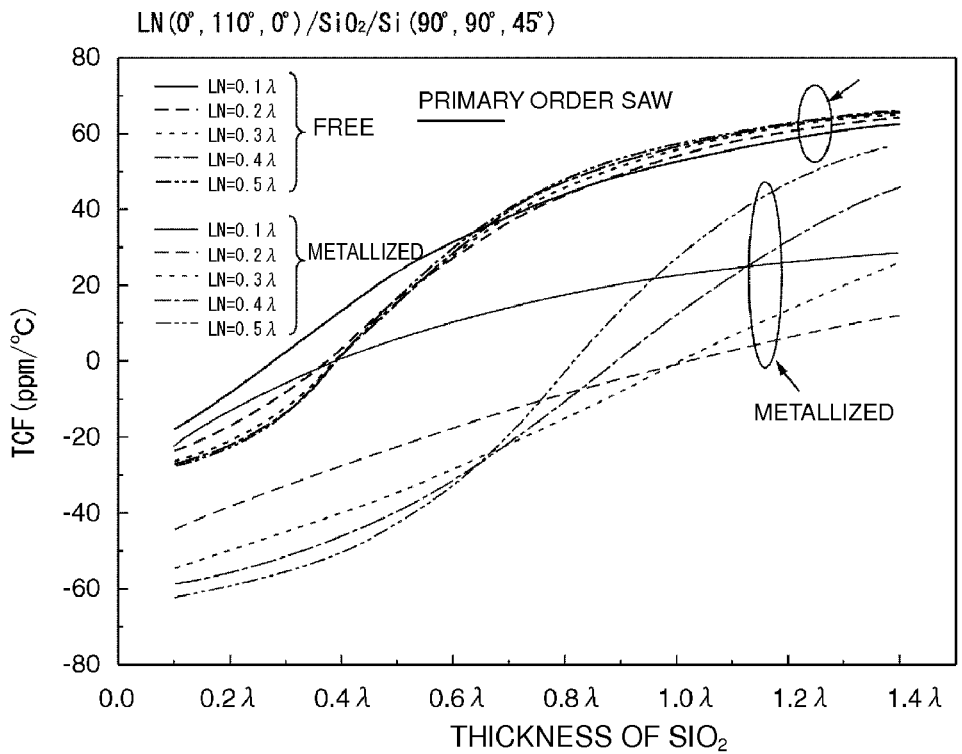
FIG. 45 is a graph depicting, in the structure of the surface acoustic wave device according to the third preferred embodiment of the present invention, illustrated in FIG. 1C, in which the $SiO_2$ film and the $LiNbO_3$ single-crystal plate having the Euler angles (0°, 110°, 0°) are stacked on the Si substrate made of Si (90°, 90°, 45°), the relationship among the thickness of the $LiNbO_3$ single-crystal plate, the thickness of the $SiO_2$ film, and the temperature coefficient of resonance frequency TCF of a surface acoustic wave in the primary order mode.

FIG. 45 is a graph depicting, when the thickness of the LN single-crystal plate is set to about 0.1λ, about 0.2λ, about 0.3λ, about 0.4λ, or about 0.5λ in the relevant structure, the relationship between the temperature coefficient of resonance frequency TCF and the thickness of the SiO₂ film for the surface acoustic wave in the primary order mode.

When the thickness of the LN single-crystal plate is any of about 0.1λ, about 0.2λ, about 0.3λ, about 0.4λ and about 0.5λ, as shown in FIG. 45, the TCF (free) can be obtained in the range of about −27 ppm/° C. to about +30 ppm/° C. by setting the thickness of the SiO₂ film in the range of about 0.05λ to about 0.65λ, and the TCF (metallized) can be obtained in the range of about −30 ppm/° C. to about +30 ppm/° C. by setting the thickness of SiO₂ in the range of about 0.33λ to about 1.4λ, for example. The TCF in the range of about −20 ppm/° C. to about +20 ppm/° C. can be obtained by setting the thickness of SiO₂ in the range of about 0.1λ to about 0.4λ in the free structure and the range of about 0.1λ to about 1.4λ in the metallized structure, for example.

Figure 46:
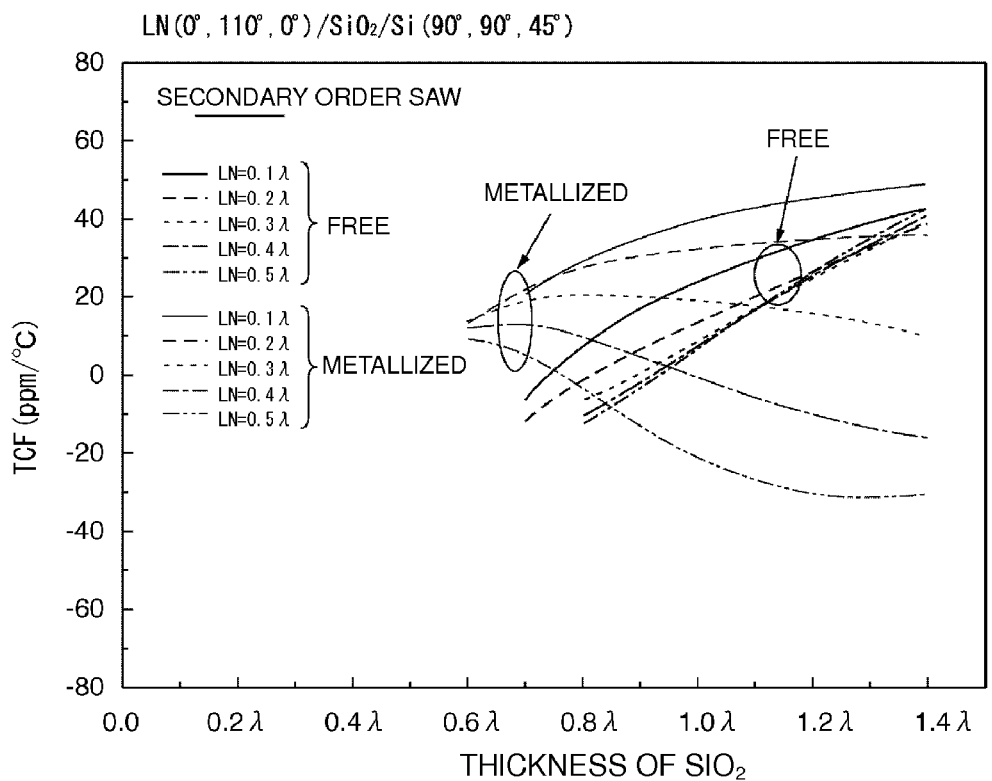
FIG. 46 is a graph depicting, in the structure of the surface acoustic wave device according to the third preferred embodiment of the present invention, illustrated in FIG. 1C, in which the $SiO_2$ film and the $LiNbO_3$ single-crystal plate having the Euler angles (0°, 110°, 0°) are stacked on the Si substrate having the Euler angles (90°, 90°, 45°), the relationship among the thickness of the $LiNbO_3$ single-crystal plate, the thickness of the $SiO_2$ film, and the temperature coefficient of resonance frequency TCF of a surface acoustic wave in the secondary order mode.

FIG. 46 is a graph depicting, when the thickness of the LN single-crystal plate is set to about 0.1λ, about 0.2λ, about 0.3λ, about 0.4λ or about 0.5λ in the relevant structure, the relationship between the temperature coefficient of resonance frequency TCF and the thickness of the SiO₂ film for the surface acoustic wave in the secondary order mode.

When the thickness of the LN single-crystal plate is any of about 0.1λ, about 0.2λ, about 0.3λ, about 0.4λ and about 0.5λ, as shown in FIG. 46, the TCF (free) can be obtained in the range of about −30 ppm/° C. to about +30 ppm/° C. and the TCF (metallized) can be obtained in the range of about −33 ppm/° C. to about +48 ppm/° C. by setting the thickness of the SiO₂ film in the range of about 0.6λ to about 1.3λ, for example.

LN (0°, 110°, 0°)/SiO₂/Si (135°, 90°, 90°)

Figure 47:
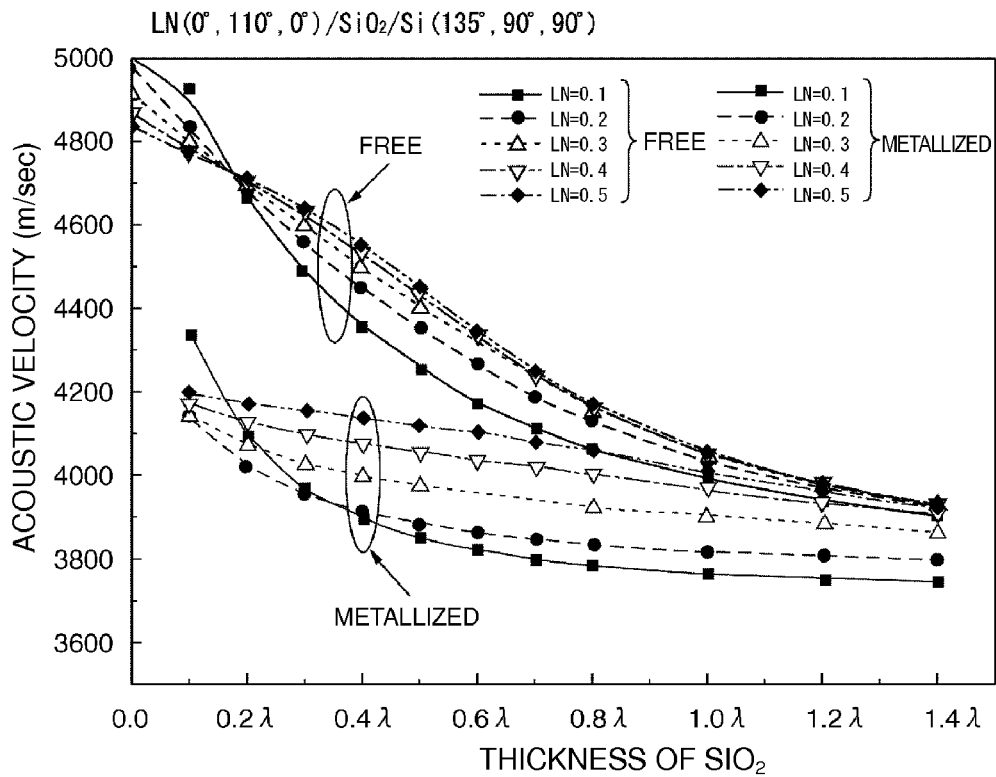
FIG. 47 is a graph depicting, in a structure of the surface acoustic wave device according to the third preferred embodiment of the present invention, illustrated in FIG. 1C, in which the $SiO_2$ film and the $LiNbO_3$ single-crystal plate having the Euler angles (0°, 110°, 0°) are stacked on a Si substrate having the Euler angles (135°, 90°, 90°), the relationship among the thickness of the $LiNbO_3$ single-crystal plate, the thickness of the $SiO_2$ film, and the acoustic velocity of a surface acoustic wave in the primary order mode.

FIG. 47 is a graph depicting, in a structure of the third preferred embodiment, illustrated in FIG. 1C, where the high acoustic-velocity substrate 2 is made of Si (135°, 90°, 90°) and the Euler angles of the LN single-crystal plate are (0°, 110°, 0°, the relationship between the thickness of the SiO₂ film and the acoustic velocity of a surface acoustic wave in the primary order mode in the free structure and the metallized structure when the thickness of the LN single-crystal plate is set to about 0.1λ, about 0.2λ, about 0.3λ, about 0.4λ or about 0.5λ, for example.

When the thickness of the LN single-crystal plate is any of about 0.1λ, about 0.2λ, about 0.3λ, about 0.4λ and about 0.5λ, as shown in FIG. 47, the acoustic velocity of the surface acoustic wave (free) is about 3930 m/sec or higher with a small reduction even when the thickness of the $SiO_2$ film is in the range of about $0.05\lambda$ to about $1.4\lambda$, for example.

Figure 48:
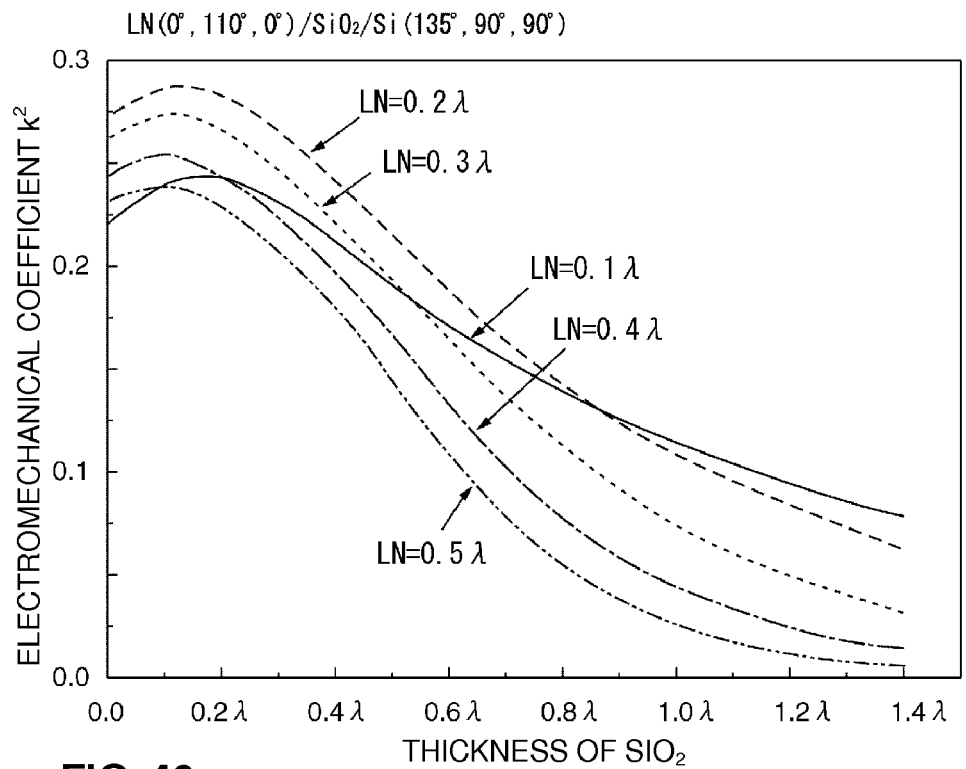
FIG. 48 is a graph depicting, in the structure of the surface acoustic wave device according to the third preferred embodiment of the present invention, illustrated in FIG. 1C, in which the $SiO_2$ film and the $LiNbO_3$ single-crystal plate having the Euler angles (0°, 110°, 0°) are stacked on the Si substrate having the Euler angles (135°, 90°, 90°), the relationship among the thickness of the $LiNbO_3$ single-crystal plate, the thickness of the $SiO_2$ film, and the electromechanical coupling coefficients $k^2$ for a surface acoustic wave in the primary order mode.

FIG. 48 is a graph depicting, when the surface acoustic wave in the primary order mode is used in the relevant structure, the relationship between the thickness of the $SiO_2$ film and the electromechanical coupling coefficient $k^2$.

As shown in FIG. 48, when the surface acoustic wave in the primary order mode is used, the electromechanical coupling coefficient of about 0.05 or more can be obtained by setting the thickness of the $SiO_2$ film in the range of about $0.05\lambda$ to about $0.83\lambda$ when the thickness of the LN single-crystal plate is any of about $0.1\lambda$, about $0.2\lambda$, about $0.3\lambda$, about $0.4\lambda$ and about $0.5\lambda$.

Figure 49:
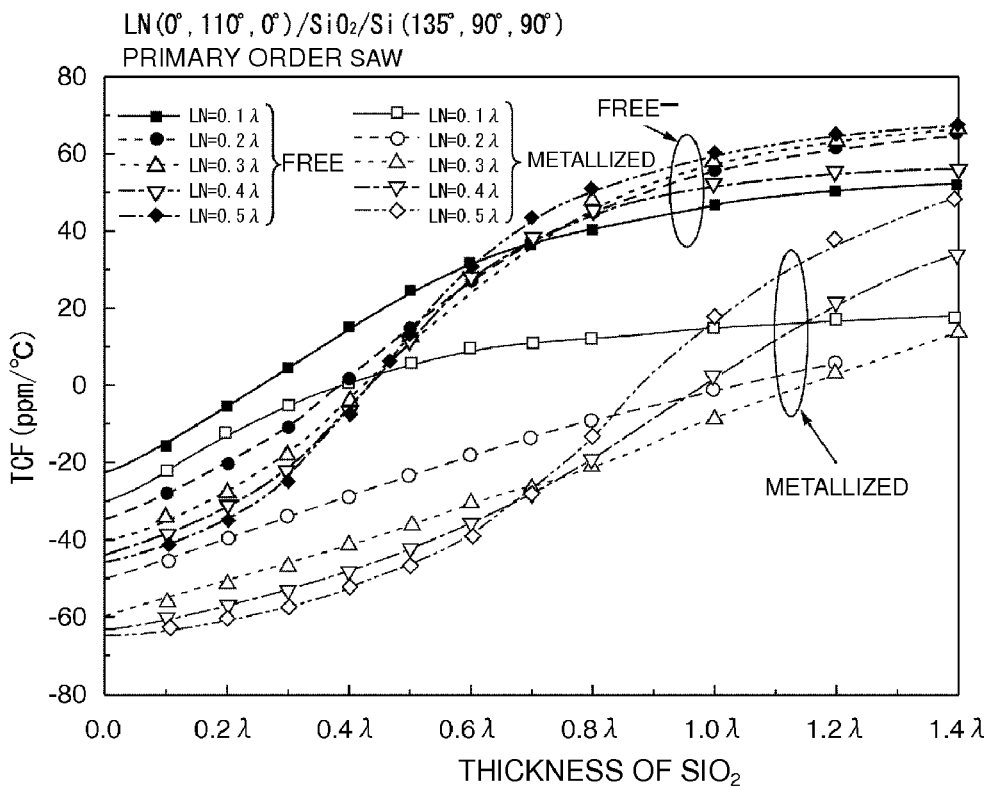
FIG. 49 is a graph depicting, in the structure of the surface acoustic wave device according to the third preferred embodiment of the present invention, illustrated in FIG. 1C, in which the $SiO_2$ film and the $LiNbO_3$ single-crystal plate having the Euler angles (0°, 110°, 0°) are stacked on the Si substrate having the Euler angles (135°, 90°, 90°), the relationship among the thickness of the $LiNbO_3$ single-crystal plate, the thickness of the $SiO_2$ film, and the temperature coefficient of resonance frequency TCF of a surface acoustic wave in the primary order mode.

FIG. 49 is a graph depicting, when the thickness of the LN single-crystal plate is set to about $0.1\lambda$, about $0.2\lambda$, about $0.3\lambda$, about $0.4\lambda$ or about $0.5\lambda$ in the relevant structure, the relationship between the temperature coefficient of resonance frequency TCF and the thickness of the $SiO_2$ film for the surface acoustic wave in the primary order mode.

When the thickness of the LN single-crystal plate is any of about $0.1\lambda$, about $0.2\lambda$, about $0.3\lambda$, about $0.4\lambda$ and about $0.5\lambda$, as shown in FIG. 49, the TCF (free) can be preferably obtained in the range of about $-30$ ppm/° C. to about $+30$ ppm/° C. by setting the thickness of the $SiO_2$ film in the range of about $0.05\lambda$ to about $0.65\lambda$, and the TCF (metallized) can be preferably obtained in the range of about $-30$ ppm/° C. to about $+30$ ppm/° C. by setting the thickness of $SiO_2$ in the range of about $0.33\lambda$ to about $1.4\lambda$, for example. Further, the TCF in the range of about $-20$ to about $+20$ ppm/° C. can be obtained by setting the thickness of $SiO_2$ in the range of about $0.07\lambda$ to about $0.6\lambda$ in the free structure and the range of about $0.22\lambda$ to about $1.4\lambda$ in the metallized structure, for example.

LN (0°, 110°, 0°)/$SiO_2$/Polycrystalline Si

Figure 58:
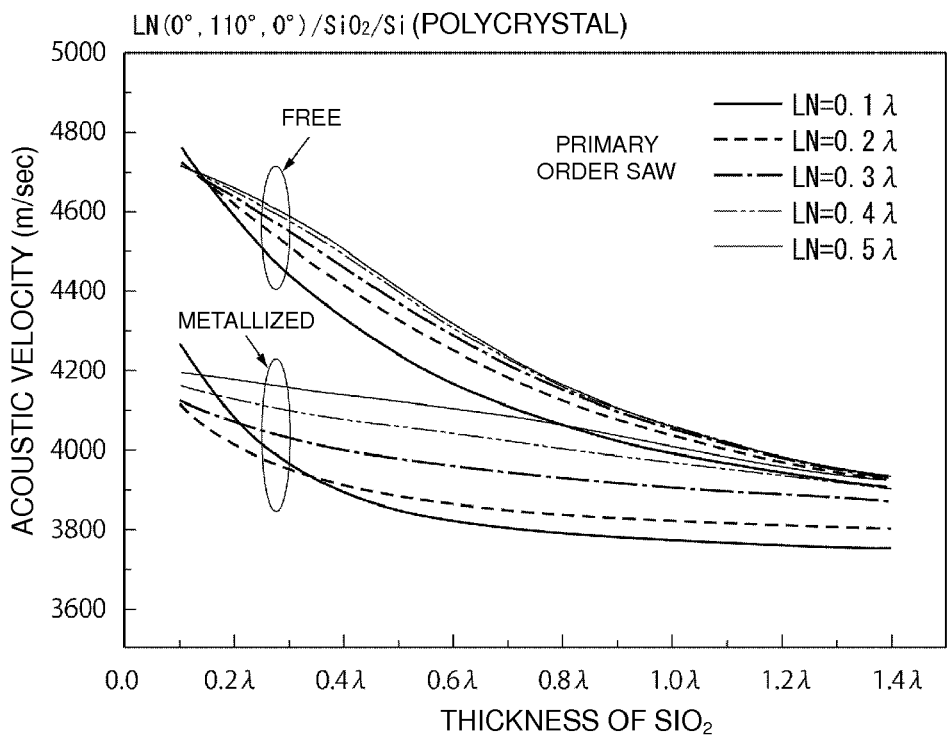
FIG. 58 is a graph depicting, in a structure of the surface acoustic wave device according to the third preferred embodiment of the present invention, illustrated in FIG. 1C, in which the SiO$_2$ film and the LiNbO$_3$ single-crystal plate having the Euler angles (0°, 110°, 0°) are stacked on a polycrystalline Si substrate, the relationship among the thickness of the LiNbO$_3$ single-crystal plate, the thickness of the SiO$_2$ film, and the acoustic velocity of a surface acoustic wave in the primary order mode.

FIG. 58 is a graph depicting, in a structure of the third preferred embodiment, illustrated in FIG. 1C, where the high acoustic-velocity substrate 2 is made of polycrystalline Si and the Euler angles of the LN single-crystal plate are (0°, 110°, 0°, the relationship between the thickness of the $SiO_2$ film and the acoustic velocity of a surface acoustic wave in the primary order mode in the free structure and the metallized structure when the thickness of the LN single-crystal plate is set to about $0.1\lambda$, about $0.2\lambda$, about $0.3\lambda$, about $0.4\lambda$ or about $0.5\lambda$, for example.

When the thickness of the LN single-crystal plate is any of about $0.1\lambda$, about $0.2\lambda$, about $0.3\lambda$, about $0.4\lambda$ and about $0.5\lambda$, as shown in FIG. 58, the acoustic velocity of the surface acoustic wave (free) is about 3940 m/sec or higher with a small reduction even when the thickness of the $SiO_2$ film is in the range of about $0.05\lambda$ to about $1.4\lambda$, for example.

Figure 59:
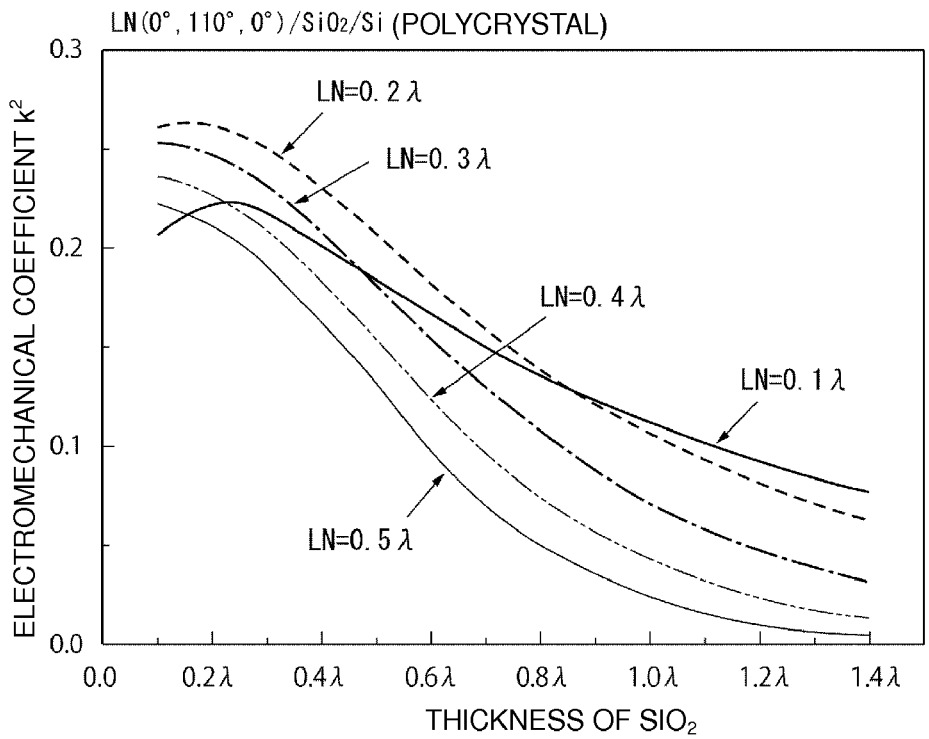
FIG. 59 is a graph depicting, in the structure of the surface acoustic wave device according to the third preferred embodiment of the present invention, illustrated in FIG. 1C, in which the SiO$_2$ film and the LiNbO$_3$ single-crystal plate having the Euler angles (0°, 110°, 0°) are stacked on the polycrystalline Si substrate, the relationship among the thickness of the LiNbO$_3$ single-crystal plate, the thickness of the SiO$_2$ film, and the electromechanical coupling coefficient k$^2$ in the primary order mode.

FIG. 59 is a graph depicting, when the surface acoustic wave in the primary order mode is used in the relevant structure, the relationship between the thickness of the $SiO_2$ film and the electromechanical coupling coefficient $k^2$.

As shown in FIG. 59, when the surface acoustic wave in the primary order mode is used, the electromechanical coupling coefficient of about 0.02 or more can be obtained by setting the thickness of the $SiO_2$ film in the range of about $0.05\lambda$ to about $1.1\lambda$ when the thickness of the LN single-crystal plate is any of about $0.1\lambda$, about $0.2\lambda$, about $0.3\lambda$, about $0.4\lambda$ and about $0.5\lambda$.

LN (90°, θ, 0°)/R-Plane Sapphire (0°, 122°23', 0°)

Figure 52:
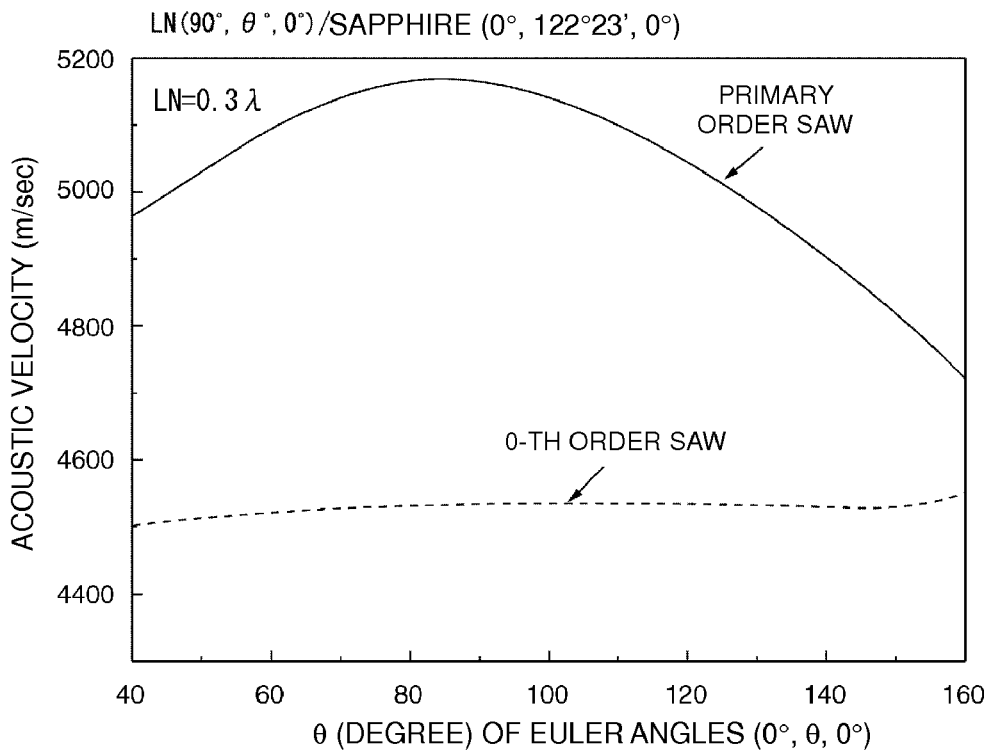
FIG. 52 is a graph depicting, in the surface acoustic wave device according to the first preferred embodiment of the present invention in which $LiNbO_3$ having the Euler angles (90°, θ, 0°) and a thickness of 0.3λ is stacked on the substrate made of the R-plane sapphire having the Euler angles (0°, 122°23', 0°), the relationship between the Euler angle θ and the acoustic velocity of a surface acoustic wave.
Figure 53:
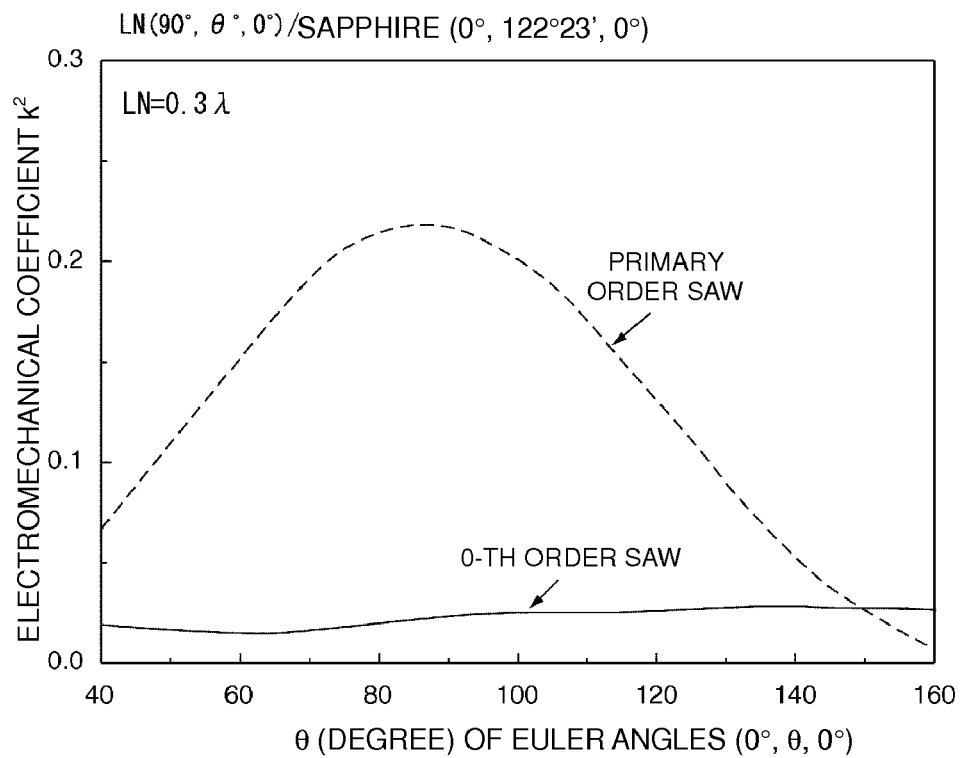
FIG. 53 is a graph depicting, in the surface acoustic wave device according to the first preferred embodiment of the present invention in which the $LiNbO_3$ having the Euler angles (90°, θ, 0° and the thickness of 0.3λ is stacked on the substrate made of the R-plane sapphire having the Euler angles (0°, 122°23', 0°), the relationship between the Euler angle θ and the electromechanical coupling coefficient $k^2$.

FIG. 52 is a graph depicting, when the high acoustic-velocity substrate 2 is a substrate made of R-plane sapphire having the Euler angles (0°, 122°23', 0°), the Euler angles of the LN single-crystal plate 3 are (90°, θ, 0°), and the thickness of the LN single-crystal plate 3 is set to about $0.3\lambda$ in the surface acoustic wave device according to the first preferred embodiment, the relationship between the Euler angle θ and the acoustic velocity of a surface acoustic wave. FIG. 53 depicts the relationship between the Euler angle θ and the electromechanical coupling coefficient $k^2$ in the same case.

As shown in FIG. 52, the acoustic velocity of the surface acoustic wave in the primary order mode is about 4700 m/sec and is much higher than that of the Rayleigh wave at θ over the entire range of about 40° to about 160°, for example. Particularly, the acoustic velocity is further increased to about 5000 m/sec or higher when the Euler angle θ is in the range of about 47° to about 127°, for example.

On the other hand, as shown in FIG. 53, the electromechanical coupling coefficient $k^2$ is equal to or larger than about 0.1 at the Euler angle θ in the range of about 53° to about 123°, for example. More preferably, the electromechanical coupling coefficient $k^2$ is increased to about 0.15 or more in the range of about 60° to about 115°, for example. Even more preferably, the electromechanical coupling coefficient of about 0.22 or more can be obtained in the range of about 84° to about 88°, for example.

Figure 60:
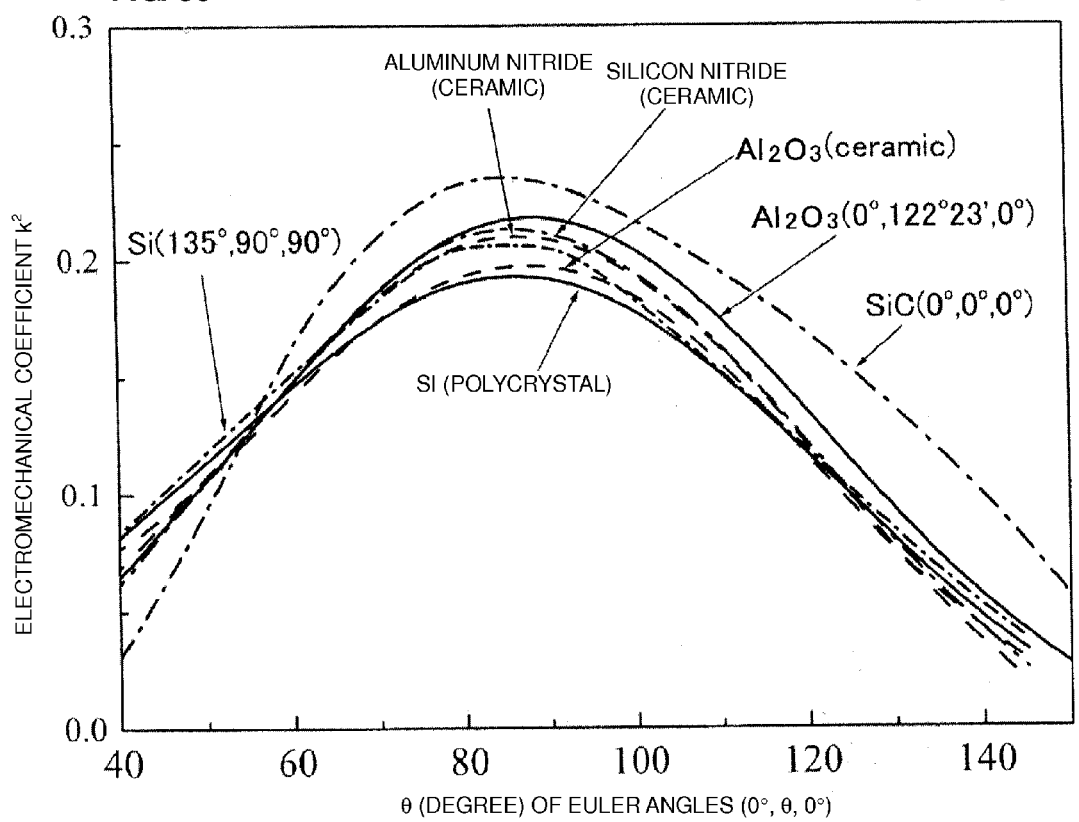
FIG. 60 is a graph depicting, when a substrate made of SiC (0°, 0°, 0°), alumina, aluminum nitride, silicon nitride, Si ((135°, 90°, 90°), or a Si polycrystal is used as a high acoustic-velocity substrate and an LN single-crystal plate having the Euler angles (90°, θ, 0° and a thickness of about 0.3λ is used in the surface acoustic wave device according to the first preferred embodiment of the present invention, the relationship between the Euler angle θ and the electromechanical coupling coefficient k$^2$.

FIG. 60 is a graph depicting, when the high acoustic-velocity substrate 2 is a substrate made of SiC (0°, 0°, 0°), alumina, aluminum nitride, silicon nitride, Si (135°, 90°, 90°) or a Si polycrystal, the Euler angles of the LN single-crystal plate 3 are (90°, θ, 0°), and the thickness of the LN single-crystal plate 3 is set to about $0.3\lambda$ in the surface acoustic wave device according to the first preferred embodiment, the relationship between the Euler angle θ and the electromechanical coupling coefficient $k^2$.

As shown in FIG. 60, when the high acoustic-velocity substrate 2 is made of SiC (0°, 0°, 0°), the electromechanical coupling coefficient $k^2$ is preferably as equal to or larger than about 0.12 at the Euler angle θ in the range of about 54° to about 133°, for example. More preferably, the electromechanical coupling coefficient of about 0.23 or more is obtained in the range of about 81° to about 88°, for example.

When the high acoustic-velocity substrate 2 is made of alumina, the electromechanical coupling coefficient $k^2$ is preferably equal to or larger than about 0.12 at the Euler angle θ in the range of about 54° to about 117°, for example. More preferably, the electromechanical coupling coefficient of about 0.119 or more is obtained in the range of about 83° to about 88°, for example. Also, when the high acoustic-velocity substrate 2 is made of aluminum nitride, the electromechanical coupling coefficient $k^2$ is equal to or larger than about 0.12 at the Euler angle θ in the range of about 52° to about 122°, for example. More preferably, the electromechanical coupling coefficient of about 0.21 or more is obtained in the range of about 81° to about 88°, for example.

When the high acoustic-velocity substrate 2 is made of silicon nitride, the electromechanical coupling coefficient $k^2$ is preferably equal to or larger than about 0.12 at the Euler angle θ in the range of about 54° to about 120°, for example. More preferably, the electromechanical coupling coefficient of about 0.215 or more is obtained in the range of about 81° to about 87°, for example.

When the high acoustic-velocity substrate 2 is made of Si (135°, 90°, 90°), the electromechanical coupling coefficient $k^2$ is preferably equal to or larger than about 0.12 at the Euler angle θ in the range of about 51° to about 118°, for example. More preferably, the electromechanical coupling coefficient of about 0.21 or more is obtained in the range of about 80° to about 88°, for example.

When the high acoustic-velocity substrate 2 is made of a Si polycrystal, the electromechanical coupling coefficient $k^2$ is preferably equal to or larger than about 0.12 at the Euler angle θ in the range of about 52° to about 118°, for example. More preferably, the electromechanical coupling coefficient of about 0.185 or more is obtained in the range of about 82° to about 88°, for example.

Thus, large electromechanical coupling coefficients can be obtained.

It is to be noted that, while the foregoing description is made in connection with a case in which ψ of the Euler angles of LiNbO$_3$ and the high acoustic-velocity substrate, i.e., the propagation orientation, preferably is 0°, substantially the same characteristics as those in the case of 0° are obtained insofar as the propagation orientation ψ is in the range of about −5° to about +5°.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
    a piezoelectric substrate including a high acoustic-velocity substrate in which an acoustic velocity of a transverse wave is in a range of about 5400 m/sec to about 8660 m/sec;
    a LiNbO$_3$ single-crystal plate provided on the high acoustic-velocity substrate and having Euler angles in a range of about (0°, 67° to 160°, −5° to +5°) or about (90°, 51° to 133°, −5° to +5°); and
    an electrode provided on the piezoelectric substrate and made of metal; wherein
    a thickness of the LiNbO$_3$ single-crystal plate is in a range of about 0.05λ to about 1.6λ when a wavelength of a surface acoustic wave is defined as λ.

2. The surface acoustic wave device according to claim 1, wherein the high acoustic-velocity substrate is a substrate made of a material selected from a group consisting of silicon carbide, alumina, aluminum nitride, sapphire, silicon nitride, silicon, and magnesium oxide.

3. The surface acoustic wave device according to claim 1, wherein the Euler angles are in a range of about (0°, 92° to 132°, −5° to +5°).

4. The surface acoustic wave device according to claim 1, wherein a primary order mode of a surface acoustic wave is used as the surface acoustic wave.

5. The surface acoustic wave device according to claim 1, wherein the high acoustic-velocity substrate is made of SiC, and the Euler angles of the LiNbO$_3$ single-crystal plate are in a range of about (0°, 70° to 160°, −5° to +5°) or about (90°, 54° to 133°, −5° to +5°).

6. The surface acoustic wave device according to claim 1, wherein the high acoustic-velocity substrate is made of alumina, and the Euler angles of the LiNbO$_3$ single-crystal plate are in a range of about (0°, 70° to 160°, −5° to +5°) or about (90°, 54° to 117°, −5° to +5°).

7. The surface acoustic wave device according to claim 1, wherein the high acoustic-velocity substrate is made of aluminum nitride, and the Euler angles of the LiNbO$_3$ single-crystal plate are in a range of about (0°, 70° to 153°, −5° to +5°) or about (90°, 52° to 122°, −5° to +5°).

8. The surface acoustic wave device according to claim 1, wherein the high acoustic-velocity substrate is made of sapphire, and the Euler angles of the LiNbO$_3$ single-crystal plate are in a range of about (0°, 67° to 147°, −5° to +5°) or about (90°, 53° to 123°, −5° to +5°).

9. The surface acoustic wave device according to claim 1, wherein the high acoustic-velocity substrate is made of silicon nitride, and the Euler angles of the LiNbO$_3$ single-crystal plate are in a range of about (0°, 70° to 153°, −5° to +5°) or about (90°, 54° to 120°, −5° to +5°).

10. The surface acoustic wave device according to claim 1, wherein the high acoustic-velocity substrate is made of silicon.

11. The surface acoustic wave device according to claim 10, wherein the silicon is made of a silicon single-crystal, and the Euler angles of the LiNbO$_3$ single-crystal plate are in a range of about (0°, 75° to 152°, −5° to +5°) or about (90°, 51° to 118°, −5° to +5°).

12. The surface acoustic wave device according to claim 10, wherein the silicon is made of a silicon polycrystal, and the Euler angles of the LiNbO$_3$ single-crystal plate are in a range of about (0°, 75° to 148°, −5° to +5°) or about (90°, 52° to 118°, −5° to +5°).

13. The surface acoustic wave device according to claim 1, further comprising a silicon oxide film provided on the LiNbO$_3$ single-crystal plate, the silicon oxide film having a thickness in a range of about 0.1λ to about 0.4λ.

14. The surface acoustic wave device according to claim 1, further comprising a silicon oxide film provided between the high acoustic-velocity substrate and the LiNbO$_3$ single-crystal plate, the silicon oxide film having a thickness in a range of about 0.05λ to about 1.4λ.

15. A surface acoustic wave device comprising:
    a high acoustic-velocity substrate in which an acoustic velocity of a transverse wave is in a range of about 5400 m/sec about 8660 m/sec; and
    a LiNbO$_3$ single-crystal plate provided on the high acoustic-velocity substrate, having Euler angles in a range of about (0°, 50° to 120°, −5° to +5°), and having a thickness in a range of about 0.4λ to about 1.6λ when a wavelength of a surface acoustic wave is defined as λ; wherein
    the surface acoustic wave is a secondary order mode of the surface acoustic wave.

16. A surface acoustic wave device comprising:
    a high acoustic-velocity substrate in which an acoustic velocity of a transverse wave is in a range of about 5400 m/sec to about 8660 m/sec; and
    a LiNbO$_3$ single-crystal plate provided on the high acoustic-velocity substrate, having Euler angles in a range of about (0°, 50° to 53°, −5° to +5°) or about (0°, 83° to 140°, −5° to +5°), and having a thickness in a range of about 0.4λ to about 1.6λ when a wavelength of a surface acoustic wave is defined as λ; wherein
    the surface acoustic wave is a tertiary order mode of the surface acoustic wave.

* * * * *